United States Patent
Agarwal et al.

(10) Patent No.: US 12,235,720 B2
(45) Date of Patent: Feb. 25, 2025

(54) ADAPTIVE ERROR CORRECTION TO IMPROVE SYSTEM MEMORY RELIABILITY, AVAILABILITY, AND SERVICEABILITY (RAS)

(71) Applicant: Intel Corporation, Santa Clara, CA (US)

(72) Inventors: Rajat Agarwal, Portland, OR (US); Hsing-Min Chen, Santa Clara, CA (US); Wei P. Chen, Portland, OR (US); Wei Wu, Portland, OR (US); Jing Ling, Milpitas, CA (US); Kuljit S. Bains, Olympia, WA (US); Kjersten E. Criss, Portland, OR (US); Deep K. Buch, Folsom, CA (US); Theodros Yigzaw, Sherwood, OR (US); John G. Holm, Beaverton, OR (US); Andrew M. Rudoff, Boulder, CO (US); Vaibhav Singh, Hillsboro, OR (US); Sreenivas Mandava, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/268,956

(22) PCT Filed: Dec. 26, 2020

(86) PCT No.: PCT/US2020/067075
§ 371 (c)(1),
(2) Date: Jun. 21, 2023

(87) PCT Pub. No.: WO2022/139849
PCT Pub. Date: Jun. 30, 2022

(65) Prior Publication Data
US 2024/0061741 A1    Feb. 22, 2024

(51) Int. Cl.
*G06F 11/10* (2006.01)

(52) U.S. Cl.
CPC ................................ *G06F 11/10* (2013.01)

(58) Field of Classification Search
None
See application file for complete search history.

(56) References Cited

U.S. PATENT DOCUMENTS

| | | | |
|---|---|---|---|
| 6,043,945 A | * | 3/2000 | Tsuboi ............... G11B 20/1883 360/47 |
| 6,216,245 B1 | | 4/2001 | Noda |
| | | | (Continued) |

FOREIGN PATENT DOCUMENTS

| | | | | |
|---|---|---|---|---|
| WO | WO-2009124320 A1 | * | 10/2009 | ............ G06F 11/006 |
| WO | WO-2011151406 A1 | * | 12/2011 | ......... G06F 12/0246 |
| | (Continued) | | | |

OTHER PUBLICATIONS

Chen, et al, "RATT-ECC: Rate Adaptive Two-Tiered Error Correction Codes for Reliable 3D Die-Stacked Memory", ACM Transactions on Architecture and Code Optimization, vol. 13, No. 3, Article 24, published Sep. 2016, 24 pages.

(Continued)

*Primary Examiner* — Guerrier Merant
(74) *Attorney, Agent, or Firm* — Compass IP Law PC

(57) ABSTRACT

A memory subsystem includes memory devices with space dynamically allocated for improvement of reliability, availability, and serviceability (RAS) in the system. Error checking and correction (ECC) logic detects an error in all or a portion of a memory device. In response to error detection, the system can dynamically perform one or more of: allocate active memory device space for sparing to spare a failed memory segment; write a poison pattern into a failed cacheline to mark it as failed; perform permanent fault detection (Continued)

(PFD) and adjust application of ECC based on PFD detection; or, spare only a portion of a device and leave another portion active, including adjusting ECC based on the spared portion. The error detection can be based on bits of an ECC device, and error correction based on those bits and additional bits stored on the data devices.

20 Claims, 26 Drawing Sheets

(56) References Cited

U.S. PATENT DOCUMENTS

| | | | |
|---|---|---|---|
| 7,325,157 B2 | 1/2008 | Sesek et al. | |
| 7,694,071 B1* | 4/2010 | Sidhu | G11B 27/322 |
| | | | 711/112 |
| 8,140,942 B2 | 3/2012 | Dell et al. | |
| 8,230,255 B2 | 7/2012 | Dickens et al. | |
| 8,438,452 B2 | 5/2013 | Agarwal et al. | |
| 8,612,828 B2 | 12/2013 | Brzezinski | |
| 8,726,139 B2 | 5/2014 | O'Connor et al. | |
| 8,756,363 B2 | 6/2014 | Radovic et al. | |
| 9,003,223 B2 | 4/2015 | Ackaret et al. | |
| 9,195,593 B1* | 11/2015 | Radovic | G06F 11/1048 |
| 9,229,803 B2 | 1/2016 | Loh et al. | |
| 9,292,392 B2 | 3/2016 | Warnes | |
| 9,312,028 B2 | 4/2016 | Corbani et al. | |
| 9,417,960 B2 | 8/2016 | Cai et al. | |
| 9,535,774 B2 | 1/2017 | Cher et al. | |
| 9,535,782 B2 | 1/2017 | Agrawal et al. | |
| 9,552,244 B2 | 1/2017 | Kim et al. | |
| 9,613,722 B2 | 4/2017 | Huang et al. | |
| 9,691,505 B2 | 6/2017 | Das et al. | |
| 9,786,388 B1 | 10/2017 | Nassie | |
| 9,817,714 B2 | 11/2017 | Halbert et al. | |
| 9,904,595 B1 | 2/2018 | Jalan et al. | |
| 9,959,164 B2 | 5/2018 | Park | |
| 10,061,534 B2 | 8/2018 | Gupta et al. | |
| 10,180,866 B2 | 1/2019 | Ackaret et al. | |
| 10,268,541 B2 | 4/2019 | Niu et al. | |
| 2006/0077883 A1 | 4/2006 | Ando et al. | |
| 2007/0180186 A1* | 8/2007 | Cornwell | G06F 12/023 |
| | | | 711/170 |
| 2009/0168587 A1 | 7/2009 | Kim et al. | |
| 2010/0140750 A1 | 6/2010 | Toms | |
| 2010/0169739 A1 | 7/2010 | Agarwal et al. | |
| 2011/0289349 A1* | 11/2011 | Loeser | G11C 29/08 |
| | | | 714/6.24 |
| 2014/0006904 A1 | 1/2014 | Gendler | |
| 2014/0223128 A1 | 8/2014 | Staudenmaier et al. | |
| 2014/0359198 A1* | 12/2014 | Zaltsman | G06F 3/0605 |
| | | | 711/103 |
| 2015/0278016 A1 | 10/2015 | La Fetra et al. | |
| 2016/0232063 A1 | 8/2016 | Das et al. | |
| 2017/0091026 A1 | 3/2017 | Gulati et al. | |
| 2017/0097781 A1 | 4/2017 | Reimers | |
| 2017/0186500 A1 | 6/2017 | Motwani et al. | |
| 2019/0102254 A1 | 4/2019 | Saxena | |
| 2019/0108891 A1* | 4/2019 | Lee | G11C 29/44 |
| 2019/0180830 A1* | 6/2019 | Natarajan | G11C 16/3404 |
| 2019/0258538 A1 | 8/2019 | Byun et al. | |
| 2020/0192749 A1 | 6/2020 | Richter et al. | |
| 2020/0218599 A1 | 7/2020 | Elliott et al. | |
| 2020/0278906 A1 | 9/2020 | Bains et al. | |
| 2021/0141531 A1* | 5/2021 | Kim | G06F 3/0619 |

FOREIGN PATENT DOCUMENTS

| | | | | |
|---|---|---|---|---|
| WO | WO-2012126611 A1 * | 9/2012 | | G06F 21/556 |
| WO | WO-2014111979 A1 * | 7/2014 | | G06F 11/2094 |
| WO | 2019000206 A1 | 1/2019 | | |

OTHER PUBLICATIONS

Dutch Examination Report for Patent Application No. 2029789, Mailed Apr. 21, 2023, 16 pages.
International Search Report and Written Opinion for PCT Patent Application No. PCT/US20/67075, Mailed Sep. 24, 2021, 15 pages.
Polianskikh, et al., "Design and Implementation of Error Detection and Correction Circuitry for Multilevel Memory Protection", 32nd IEEE International Symposium on Multiple-Valued Logic (ISMVL '02), May 2002, 7 pages.
Dutch Examination Report for Patent Application No. 2035035, Mailed Aug. 22, 2024, 16 pages.

* cited by examiner

TABLE 730

| 732: FAILURE TYPE | 734: COVERAGE |
|---|---|
| 742 SINGLE DEVICE FAILURE | 9 SDC PATTERNS PER SINGLE DEVICE (SDC RATE = 9/(2^64) FOR DDR5) |
| 744 ANY 2 DQ | 100% DUE, 0 SDC |
| 746 ANY 1b-4b ERRORS | 100% DUE, 0 SDC |
| 748 ANY 4 BURST ERRORS | 100% DUE, 0 SDC |
| 750 2b IN 2 DIFFERENT DEVICES | 100% DUE, 0 SDC |

ADAPTIVE ERROR CORRECTION TO IMPROVE SYSTEM MEMORY RELIABILITY, AVAILABILITY, AND SERVICEABILITY (RAS)

CLAIM OF PRIORITY

This application is a U.S. National Phase application under 35 U.S.C. § 371 of, and claims the benefit of priority of, International Application No. PCT/US2020/067075 filed Dec. 26, 2020, entitled "ADAPTIVE ERROR CORRECTION TO IMPROVE SYSTEM MEMORY RELIABILITY, AVAILABILITY, AND SERVICEABILITY (RAS)".

FIELD

Descriptions are generally related to memory systems, and more particular descriptions are related to system memory error management.

BACKGROUND

Memory device density and operating speed continue to increase as manufacturing processes for memory devices continue to shrink, all of which tend to cause increases in runtime errors for memory devices. Even with error checking and correction (ECC) in place, the frequency of errors can exceed the measures in place to correct errors.

One technique to address failure in memory devices is sparing, which involves including memory resources in the devices that are only used in case of detecting a failure. The inclusion of resources that are only used in the event of failure requires device manufacturers to overprovision the resources on the memory devices, which increases cost. However, not including the resources can result in reduced reliability, accessibility, and serviceability of DRAM (dynamic random access memory) devices.

In addition to overprovisioning resources on individual devices, system-level implementations also include overprovisioning to mitigate system errors. It is well understood that the strength of ECC has a dependency on the number of check bits provided in the system. To guarantee the availability of the memory in many system implementations, the memory subsystem includes multiple additional memory devices to store ECC information. Additional memory devices can significantly impact the system cost.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a memory subsystem includes memory devices with space dynamically allocated for improvement of reliability, availability, and serviceability (RAS) in the system. Error checking and correction (ECC) logic detects an error in all or a portion of a memory device. In response to error detection, the system can dynamically perform one or more of: allocate active memory device space for sparing to spare a failed memory segment; write a poison pattern into a failed cacheline to mark it as failed; perform permanent fault detection (PFD) and adjust application of ECC based on PFD detection; or, spare only a portion of a device and leave another portion active, including adjusting ECC based on the spared portion. The error detection can be based on bits of an ECC device, and error correction based on those bits and additional bits stored on the data devices.

Figure 1:
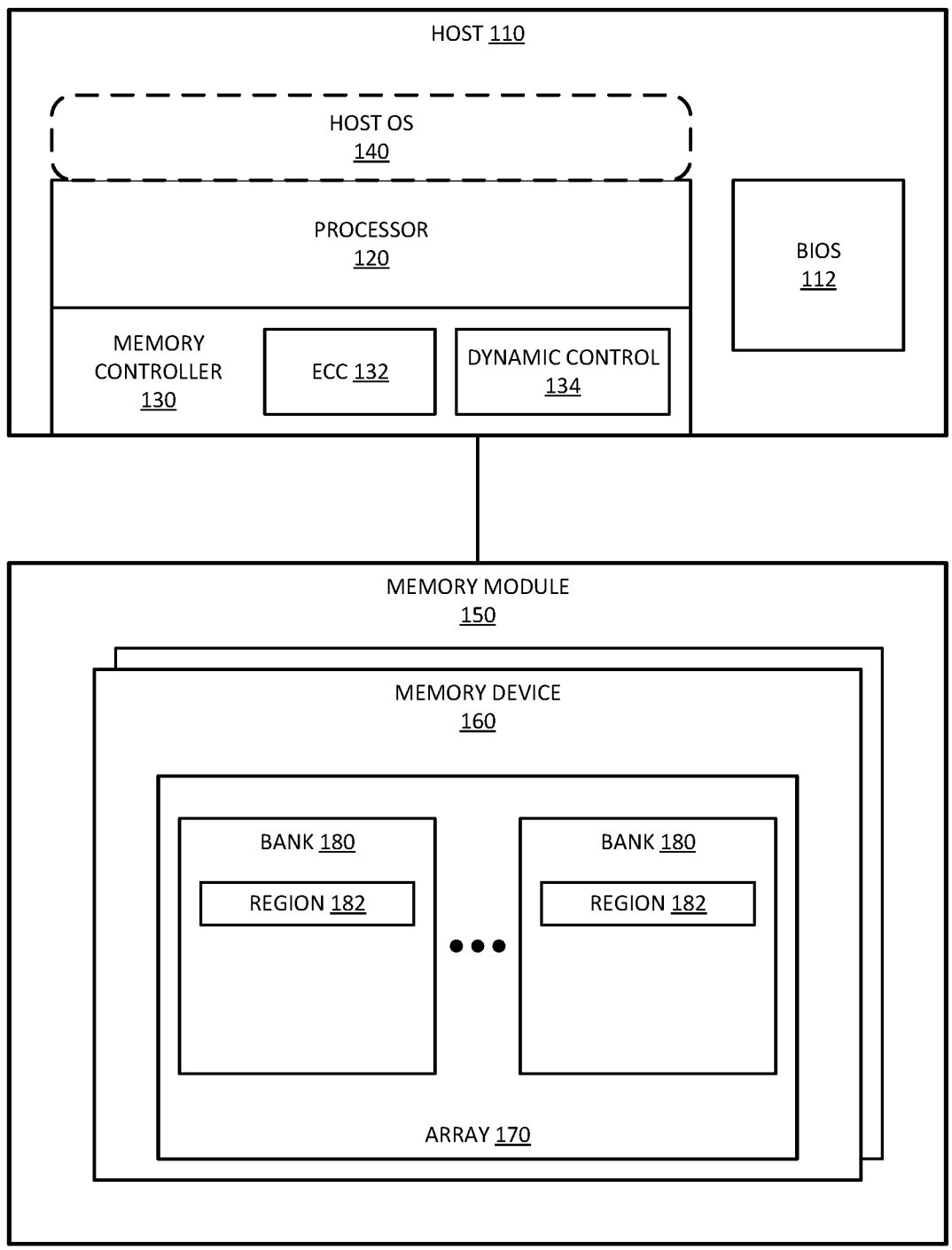
FIG. 1 is a block diagram of an example of a system with dynamic bank sparing.

FIG. 1 is a block diagram of an example of a system with dynamic bank sparing. System 100 illustrates memory coupled to a host. Host 110 represents a host computing system. Host 110 includes host hardware such as processor 120 and memory controller 130. The host hardware also includes hardware interconnects and driver/receiver hardware to provide the interconnection between host 110 and memory 150. Memory module 150 includes memory devices 160 coupled to host 110. Memory controller 130 controls access to memory devices 160.

The host hardware supports the execution of host software on host 110. The host software can include host OS (operating system) 140. Host OS 140 represents a software platform under which other software will execute. Host OS 140 provides control to enable interfacing with hardware interconnections to couple to memory devices 160.

Memory module 150 represents a hardware platform that connects multiple memory devices 160 to host 110. For example, memory module 150 can be a DIMM (dual inline memory module). Memory module 150 can provide routing and control logic to control the signaling between host 110 and the memory devices on the module hardware.

During execution, host OS 140 provides requests to access memory. The requests can be directly from host OS software can be requests through APIs (application programming interfaces) or other mechanisms for a program executing under host OS 140 to request a memory access. In response to a host memory access request, memory controller 130 maps host-based addressing for memory resources to physical address locations of memory devices 160.

Memory devices 160 include array 170, which represents an array of memory cells. In one example, array 170 is organized as multiple banks 180. Banks 180 represent addressable groups of cells. For example, the memory cells of array 170 can be addressable by row address, column address, and bank address. Due to the ability to separately address banks 180, the banks can be accessed separately. In one example, banks 180 include region 182. Region 182 represents a portion of array 170, and more specifically, a portion of each bank 180 that can be dynamically allocated at runtime to address a bank failure. For example, region 182 can represent one or more rows reserved to store data from a failed bank.

Region 182 can be reserved in that the region can store usable runtime data, but can be reallocated as a reserved memory space in case a failure arises. Usable runtime data refers to memory controller 130 being able to use the addresses of region 182 to store data at any time. In one example, memory controller 130 does not store critical data in region 182, such as system critical data. Critical data can be operating system data, driver data, configuration data, or other data used for system operation and stability. Critical data can be contrasted to user data, which refers to data generated and used for user applications.

In one example, memory controller 130 includes ECC 132, which represents error logic in host 110 to detect and correct errors in data read from memory device 160. ECC 132 can generate check bits for write data to send to memory devices 160. ECC 132 can then decode the incoming data and ECC bits from the memory devices to determine if the data includes errors. For correctable errors (CE), ECC 132 can correct the error in the data before returning it to the requesting agent, whether host OS 140 or an application executing under host OS 140.

Dynamic control 134 represents logic in memory controller 130 to dynamically spare out an error prone bank. In response to detection of an error, the error from a problematic bank should be corrected. If the bank hits an uncorrectable error, in one example, the OS should offline the page instead of triggering dynamic bank sparing. When a bank is determined to have a persistent failure, the bank can be considered a failed bank. In response to a determination that a bank is failed, memory controller, through dynamic control 134, can remap data from the failed bank to region 182 of one or more other banks. The one or more other banks are non-failed banks or banks that are still good. In response to a request to the failed bank, the memory controller can map the request to the reserved region.

In response to detection of a failure of one of banks 180, in one example, memory controller 130 can determine that the bank and the addresses associated with the bank should be removed from use. Memory controller 130 can direct the memory device with the failed bank to copy the contents of the failed bank to the other banks. In one example, memory controller 130 can dynamically indicate a reduction of available system memory address space to host OS 140. In one example, host OS 140 offlines the failed bank in response to an indication from memory controller 130. The reduction of system memory means there is not as much memory space available to host 110. The reduction is contrasted to a system that has a certain amount of memory available to start, and spares out a memory resource with additional resources that had not been counted as being available, resulting in the same amount of memory available to the host. Instead, host 110 has access to the equivalent memory space of B banks in N memory devices (B*N), and in response to a failure and subsequent remapping, would have access to ((B*N)−1) banks.

In one example, the remapping of the data from the failed bank to region 182, dynamically allocated as spare space, can be in accordance with a post package repair (PPR) routine. The remapping refers to moving the data to region 182 as a spare location, thus changing the physical addressing associated with certain data within memory device 160.

BIOS (basic input/output system) 112 represents boot control for system 100. BIOS 112 controls system 100 when system 100 is initially powered up. Processor 120 can be configured to start execution of BIOS 112, which can then direct the processor to load instructions that will launch host OS 140. BIOS 112 can include configuration for host 110, such as hardware initialization, configuration settings, information about how much memory is available, and other information. In one example, in response to detection of a bank failure, BIOS 112 can be updated to indicate less memory capacity available in a memory device 160 that experienced a bank failure. BIOS 112 can indicate the capacity to host OS 140.

In one example, host OS 140 should not store critical system data in region 182, to reserve the region for dynamic sparing. In one example, BIOS 112 can receive configuration information for memory devices 160 regarding region 182. Thus, BIOS 112 can indicate region 182 to host OS 140 on initialization, to indicate what type of data can be stored in the region or what type of data should not be stored in the region.

Figure 2:
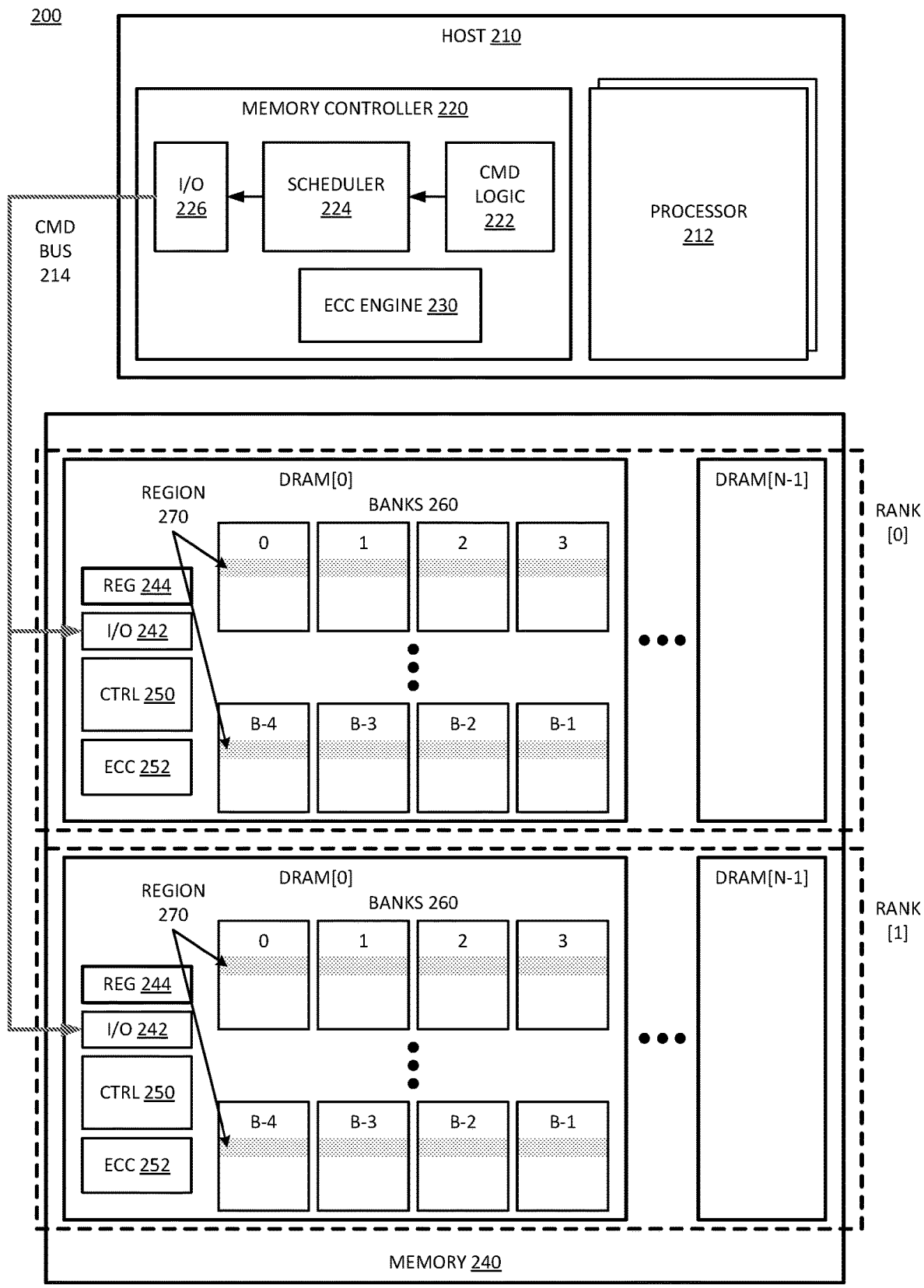
FIG. 2 is a block diagram of an example of a memory subsystem in which the host can perform various correction operations in response to detecting an error in memory.

FIG. 2 is a block diagram of an example of a memory subsystem in which the host can perform various correction operations in response to detecting an error in memory. System 200 represents elements of a computing system. System 200 represents a system in accordance with an example of system 100.

Host 210 includes one or more processors 212 (e.g., a central processing unit (CPU) or a graphics processing unit (GPU)) that generate requests for data stored in memory 240. In one example, memory controller 220 is integrated onto processor 212 or onto a processor system on a chip (SOC).

Memory controller 220 includes I/O (input/output) 226 to connect to memory 240. I/O includes connectors, signal lines, drivers, and other hardware to interconnect the memory devices to host 210. I/O 226 can include command I/O as represented by command (CMD) bus 214, and data I/O by a DQ (data) bus (not specifically illustrated). CMD bus 214 includes command signal lines that enable memory controller 220 to send commands to memory 240, including read and write commands to control the movement of data for dynamic bank sparing.

Memory controller 220 includes command (CMD) logic 222 to generate commands for memory in response to operations by processor 212. The commands can be commands for data access (such as Read, Write, Refresh, or other commands) to directly carry out the operations, or commands for configuration (such as mode register commands) to maintain the data in the memory. Memory controller 220 includes scheduler 224 to schedule when to send commands in a sequence of operations. Scheduler 224 can control the timing for I/O to improve the chance that I/O will be error free. The order of commands can maintain high utility of the memory to improve data throughput. In one example, scheduler 224 can manage the order of commands and addressing of commands in accordance with the adaptive application of ECC.

System 200 illustrates two ranks of memory devices in memory 240, Rank[0] and Rank[1]. A rank refers to a collection or group of memory devices that share a select line (e.g., a CS signal line). Thus, memory devices in a rank will execute operations in parallel. Rank[0] and Rank[1] are illustrated to include N DRAM devices (DRAM[0:N−1]) or DRAMs. Typically, a system with multiple ranks will have the same number of DRAMs in each of the ranks.

DRAM[0] of Rank[0] and DRAM[0] of Rank[1] are shown to include I/O 242, registers (REG) 244, and control (CTRL) 250 or control logic 250. Such components will be understood to be included in the other DRAMs as well. I/O 242 represents connection hardware comparable to I/O 226 of memory controller 220. I/O 242 enables connection of DRAMs to memory controller 220. Register 244 represents one or more registers within the DRAM, which include one or more configuration registers such as mode registers.

Control logic 250 represents control components within the DRAM to decode and execute the commands and access operations. Control logic 250 causes the DRAM to perform the internal operations needed to execute the access initiated by memory controller 220. In one example, the DRAM devices include ECC 252, which represents on-die ECC or on-memory ECC. On-die ECC refers to hardware on the memory device itself that enables the memory device to perform SBE (single bit error) correction of errors prior to sending data to the host. ECC 252 is implemented at the memory device and is separate from the ECC that memory controller 220 will implement. Memory 240 can implement on-die ECC and send the data to memory controller 220, which can then perform error checking on the data received from all DRAMs on a channel in parallel.

The DRAM devices are illustrated as having multiple banks (Bank[0:(B−1)]). B can be any integer greater than 1. The variable 'B' can be replaced by any variable designator, such a 'N'. Thus, the DRAM devices can be said to have B banks or N banks. B can typically be a binary number based on the number of bits available to address banks. A binary number of banks is simpler from the perspective of addressing but is not necessary for purposes of operation, and any number of banks could be used. Banks 260 can be utilized as separate banks, separately addressable by bank number. In one example, banks 260 are organized in a bank group, such as Bank[0:3] as BG0 (bank group 0), the next four banks as BG1, and so forth. The bank groups could alternatively be BG0 having Bank[0,2,4,6], for example, or some other grouping. Bank groups can typically be accessed separately and can enable shorter access times than back to back accesses to banks of the same bank group, for example.

In one example, banks 260 include region 270, where a region of each bank can be treated different for purposes of storing data in the memory cells. For example, region 270 can be a range of addresses within the banks. In one example, region 270 is one or more highest row addresses in each bank. In response to detection of a failed bank among the B banks, contents of the failed bank can be dynamically moved during runtime to region 270.

ECC engine 230 represents error control in memory controller 220. With ECC engine 230, memory controller 220 can perform error correction based on information across memory devices and not just within a single device as done with ECC 252. The ability to perform ECC across the parallel memory devices enables memory controller 220 to provide single device data correction (SDDC) in case an entire device or a portion of a device fails. In one example, ECC engine 230 is configured to enable memory controller 220 to perform double device data correction (DDDC) or adaptive double device data correction (ADDDC). SDDC refers to error correction in which data plus ECC bits received from the memory devices allows memory controller 220 to reconstruct data even if one of the N DRAM devices fails.

DDDC refers to error correction in which data and ECC bits across lockstep partners allows memory controller 220 to reconstruct data even if two DRAM devices fail. Memory controller 220 can implement DDDC when ECC engine 230 is configured to perform correction in lockstep between multiple memory resources, such as what is described in U.S. Pat. No. 9,697,094.

Briefly, DDDC can be described as follows. Lockstep refers to distributing error correction over multiple memory resources to compensate for a hard failure in one memory resource that prevents deterministic data access to the failed memory resource. A lockstep partnership refers to two portions of memory over which error checking and correction is distributed or shared. A memory subsystem detects a hard error in a first memory portion, where the first memory portion is set in a lockstep partnership with a second memory portion to spread error correction over the pair of memory resources. In one example, such as in an implementation of DDDC (dual device data correction), the lockstep relationships can be preconfigured. Thus, a detected error results in error correction sharing between identified lockstep partners.

ADDDC refers to an implementation of DDDC with the ability to dynamically change the lockstep partnership. In response to detecting the hard error, the memory subsystem can reverse the lockstep partnership between the first memory portion and the second memory portion and set a new lockstep partnership. In one example, the lockstep partnership is formed in response to detecting a failure or hard error in the second memory portion. The memory subsystem can create new lockstep partnerships between the first memory portion and a third memory portion as lockstep partners and between the second memory portion and a fourth memory portion as lockstep partners. The memory subsystem can also be configured to change the granularity of the lockstep partnership when changing partnerships.

The dynamic changing of lockstep partnerships can be applied to any application of lockstep. In one example, the memory controller includes a lockstep table that represents lockstep relationships between portions of memory. The portion size can be configured for an implementation of lockstep. With ADDDC, the lockstep partnerships can be dynamically reversed and reassigned. In one example, ADDDC lockstep relationships are not defined until a first error is detected. For such an implementation, the first assignment of lockstep partners can be reversed and reassigned.

In one example, memory controller 220 can respond to a fault in a bank of one of the DRAM devices to provide commands over command bus 214 to cause the moving of data from the failed bank to region 270. In one example, ECC engine 230 can detect a failure of one of the banks within a DRAM based on the location of errors in data received from the DRAM devices. In one example, memory controller 220 includes a permanent fault detection (PFD) engine (described in more detail below with respect to FIG. 9). The PFD engine represents logic or circuitry within memory controller 220 to determine whether a detected fault in memory 240 is a permanent fault (i.e., a hard fault) or a transient error (a soft fault). In one example, in response to determining that a bank has a hard failure, memory controller 220 can trigger the dynamic sparing of one of the banks to the memory space in region 270.

It will be understood that memory 240 stores data that is used for active operation in system 200 by processor 212. If memory 240 is unable to store as much data, some data may have to be retrieved from long-term storage (not shown in system 200). Thus, if there is data stored in region 270 when a bank failure is detected, the data in region 270 could be written back to storage and overwritten in memory, in the case of data that has been changed in memory 240, or simply overwritten in the case of data that has not been changed in memory 240. In one example, memory controller 220 is aware of region 270 and does not store critical system data in region 270. Thus, memory controller 220 has access to region 270 and can store data in it at any time during runtime, selecting to store only data that can be overwritten in response to detection of a bank failure.

Figure 3:
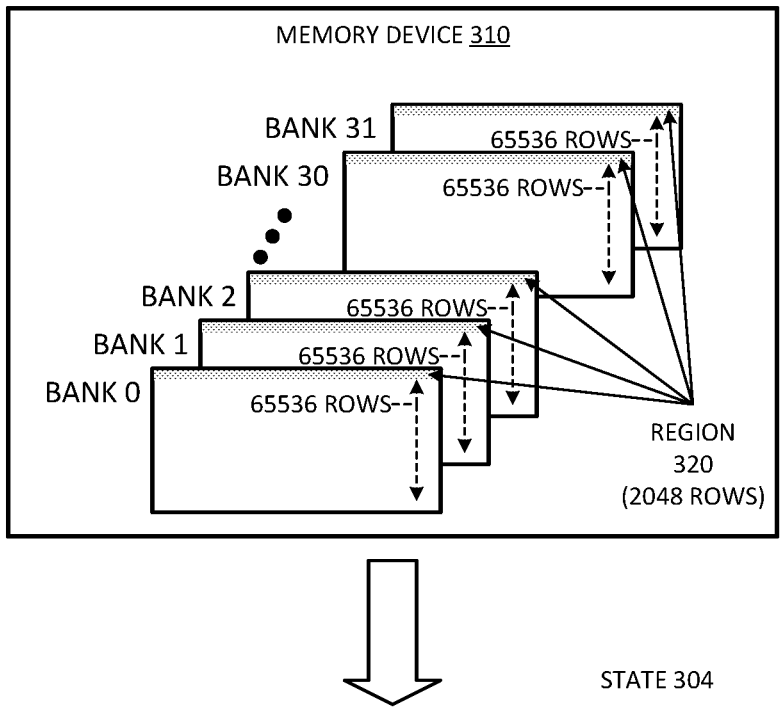
FIG. 3 is a block diagram of an example of dynamic bank sparing.
Figure 3:
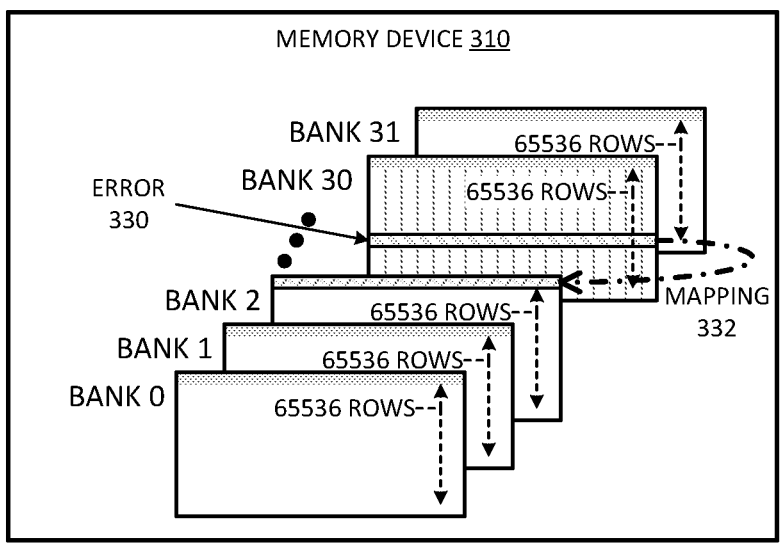

FIG. 3 is a block diagram of an example of dynamic bank sparing. State 302 represents a state of a memory device before detection of a bank failure. State 304 represents a state of the memory device in response to detection of a bank failure. State 302 and state 304 provide examples of system states in accordance with an example of the memory of system 100 or an example of the memory of system 200.

Memory device 310 can perform dynamic bank sparing, which enables moving data dynamically during runtime in response to detection of a bank failure. The dynamic allocation of the memory resources is contrasted with traditional sparing where memory capacity is held in reserve at boot time. By reserving memory capacity for sparing, the capacity is lost to system usage, and is only used in response to detection of a failure. Memory device 310 can use all its memory capacity while reserving a region for sparing. For memory device 310, the capacity reservation and bank sparing can occur in response to a failure. Additionally, because capacity can be dynamically remapped and reallocated during runtime, the dynamic bank sparing would not require a system reboot to perform sparing. Traditional systems require rebooting to trigger sparing.

State 302 represents an operating state of memory device 310 when there are no failures detected. The host system will boot with the entire memory region available for the OS (such as host OS 140) to use. In one example, a system BIOS (such as BIOS 112) will describe one or multiple special regions in a static resource affinity table (SRAT or SRAT table) to the OS. State 302 illustrates the regions as region 320. In one example, region 320 is the top row or the top Y rows, where Y is an integer greater than 1.

In one example, region 320 represents address ranges that can be offlined when a bank failure is detected. In one example, BIOS provides an indication to the OS that no data critical to kernel operation should be allocated in region 320. The data stored in region 320 can potentially be migrated or killed during runtime to reallocate space for a bank failure.

Memory 310 is illustrated as having 32 banks (Bank 0 . . . Bank 31), which is typical for a DRAM device compatible with a double data rate version 5 (DDR5) standard. In one example, each bank has 2048 rows reserved of the total 65536 rows in the bank. In one example, region 320 represents the top rows of each bank. For example, with 32 bank, the top 5 row address bits or the upper 5 row address bits can be included in region 320 to enable the reallocation of resources to address a bank failure. The upper 5 bits of row addresses ($2^5=32$) can provide enough resources for an error with 32 bits. Other system configurations with different numbers of banks can reserve different amounts of resource space. It will be understood that the upper bits of row addresses can provide a convenient region to reserve, but any identifiable region can be allocated for dynamic bank sparing.

State 304 represents error 330. Error 330 indicates an error in Bank 30. In one example, when a bank failure is detected by the system firmware or by error checking logic of the memory controller, it will inform the OS that a region should be offlined. The OS can perform the memory offlining of region 320 to open space for the failed or failing bank. In one example, the memory controller will start to copy the failing bank content or copy contents of the failing bank to the "offlined" or reserved memory region or designated region, region 320. The reserved memory region can be referred to as a designated region in that it is designated for the storage of data to allow for dynamic bank sparing.

As illustrated, mapping 332 remaps data from Bank 30 to Bank 2 as part of the copying of content. The copying of the content executes the bank sparing. In one example, when the bank sparing is complete, any future access to the failed bank region is redirected by the memory controller to the reserved memory region.

In one example, row addresses are always mapped as high address bits in a rank address map. Thus, the top address region of a channel or rank address corresponds to the top address region of a bank. When the top region is reserved, the top rows in each bank are also reserved. In one example, for bank sparing, hardware will copy the contents of the failing bank to the top rows of each bank. After the bank sparing, all accesses to the failed bank will be directed by hardware to the top rows of each bank. The hardware can include the memory controller. The hardware can also include the control within memory device 310 that executes the memory access instructions. Hardware can dynamically spare by substituting bank addresses with R upper bits of row address, where R is an integer. The number of upper row address bits can be determined by the number of banks supported.

In one example, an access to the failing bank (Bank 30) with the upper row address equal to the failing bank number is directed to the last bank (bank 31) upper rows. As a specific example, consider that memory device 310 is a 16 Gb (gigabit) device with 32 banks. Thus, each bank will have 512 Mb (megabit). If each row is 8 Kb (kilobit), there will be 2^16 rows. With 32 banks (2^5) and 2^16 rows, region 320 can be reserved as (2^16)/32=(2^11) rows of each bank for dynamic bank sparing. In one example, region 320 is the upper most rows (row[15:11]=5'b11111) reserved for bank sparing. Putting memory device 310 into a rank, over 1 rank (e.g., 10 devices) and sub-channel, a total of 16 Mb×8/8=16 MB can be spare copied.

State 304 represents error 330 for the error in Bank 30. In response to the failure of Bank 30, in one example, access to Bank 30, row [15:11]=5'b00010 is mapped to Bank 2, row[15:11]=5'b11111. In one example, access to Bank 30, row[15:11]=5'b01110, bank 31, row[15:11]=5'b11111.

Figure 4:
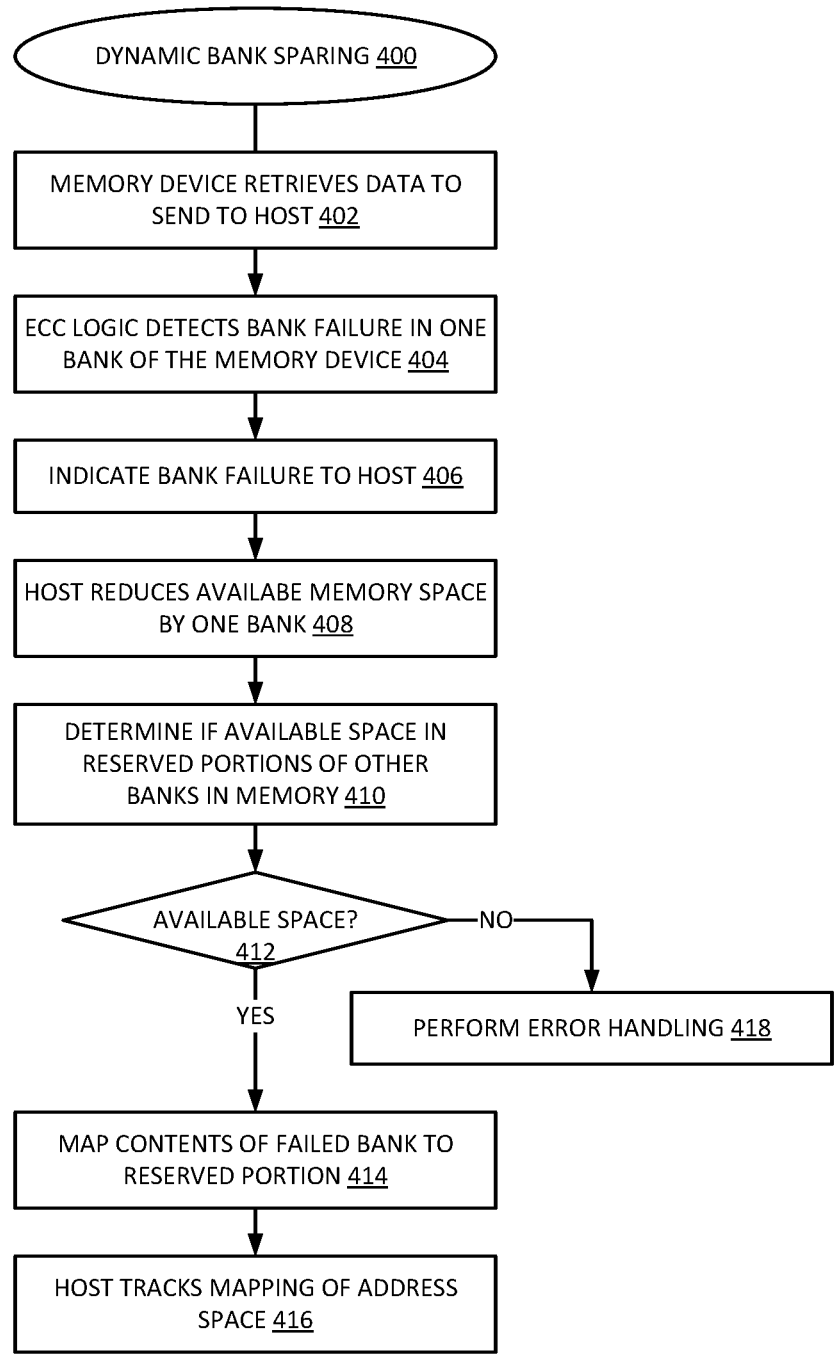
FIG. 4 is a flow diagram of an example of a process for dynamic bank sparing.

FIG. 4 is a flow diagram of an example of a process for dynamic bank sparing. Process 400 represents a process for dynamic bank sparing. Process 400 can be executed by an implementation of system 100 or an implementation of system 200.

In one example, the memory device retrieves data to send to the host, at 402. ECC logic detects the bank failure in one bank of the memory device, at 404. In one example, the ECC logic represents logic in the memory controller or in the host. In one example, the ECC logic that detects the error is on-die logic, which will indicate the failure to the host. Whether the memory controller detects the error, or the error is detected by the memory device and reported to the memory controller, the memory controller can determine there is a bank failure.

In one example, the memory controller indicates the bank failure to the host, at 406. In one example, the memory controller indicates the bank failure to the host OS. In one example, the memory controller indicates the bank failure to BIOS. The host OS can offline a spare region and reduce the available memory space by one bank in response to detection of the bank failure, at 408.

In one example, the system determines if there is available space in reserved portions of other banks in memory, at 410. In one example, the determination is made prior to offlining the memory resources. In one example, if there is no reserved space available, at 412 NO branch, the system performs error handling, at 418. The error handling can include system failure. There may not be reserved space available, for example, if another bank failure has already occurred and the system has already performed dynamic bank sparing to remap to the reserved region of memory.

If there is available space, at 412 YES branch, in one example, the memory controller maps the contents of the failed bank to the reserved portion in the other banks, at 414. In one example, the memory controller or other portions of the host can track the mapping of the address space, at 416. The mapping of the logic addresses to physical addresses enables the system to track where data is stored in the memory resources for subsequent access to the data.

Figure 5:
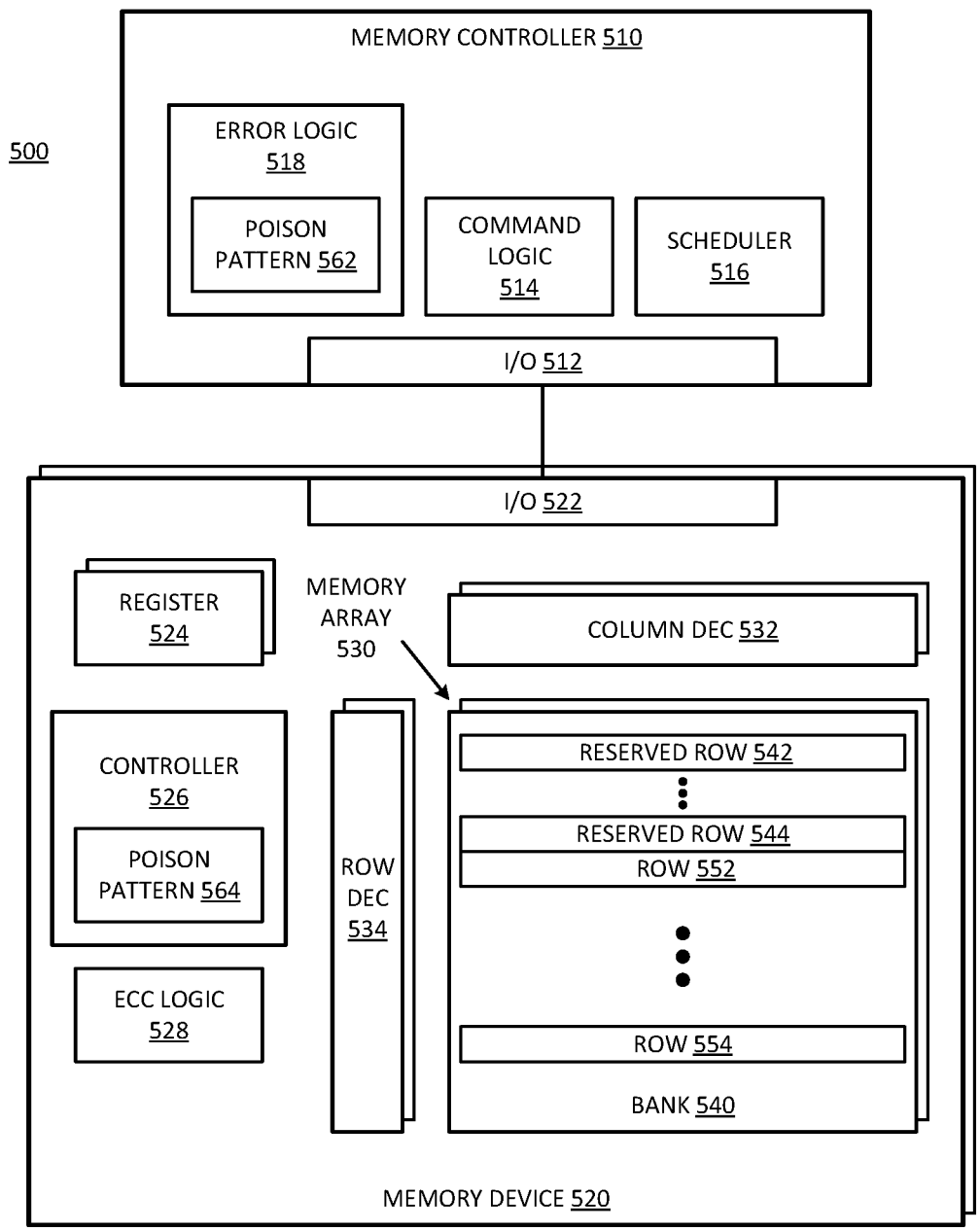
FIG. 5 is a block diagram of an example of a system that indicates a memory failure with a poison row.

FIG. 5 is a block diagram of an example of a system that indicates a memory failure with a poison row. System 500 provides an example of a system in accordance with an example of system 100. Memory controller 510 can be referred to as a host controller, or simply, a controller. Memory device 520 can include any type of memory technology that has adjacent rows of memory cells, where data is accessible via a wordline or the equivalent. In one example, memory device 520 includes DRAM technology. The rows of memory device 520 are typically refreshed to maintain a deterministic state.

Memory device 520 includes memory array 530, which represents an array of memory cells or storage cells. Array 530 is organized as multiple banks 540 of memory. A memory cell stores a bit of data, or multiple bits for a multilevel cell. In general, a bank or a sub-bank of memory includes memory cells that are addressable separately from memory cells of another bank or sub-bank, and are thus accessible in parallel to another portion of memory array 530.

Memory device 520 includes column decoder (dec) 532 which represents logic or circuitry to apply charge to a column based on an access command. In one example, column decoder 532 selects a column in response to a column address strobe (CAS) command. Memory device 520 includes row decoder (dec) 534 which represents logic or circuitry to apply selection voltages to rows based on a memory access command. In one example, the row decoder 534 selects a row in response to a row address strobe (RAS) command. Row decoder 534 represents decoding hardware for the multiple banks 540. Column decoder 532 represents decoding hardware for the multiple banks 540.

Memory controller 510 includes command logic 514 to generate commands for memory device 520. Commands can include commands such as Write commands or Read commands. Commands can also include Activate commands, Precharge commands, Refresh commands, or other commands.

Memory controller 510 includes scheduler 516 to manage the scheduling and sending of sequences of commands to memory device 520. Scheduler 516 includes logic to determine the order of commands, as well as timing requirements for the commands. Memory controller 510 makes determinations of what commands to send, including commands related to sending write commands related to poison pattern ECC, commands related to mapping or dynamically allocating resources for ECC purposes, or other commands related to ECC. In one example, scheduler 516 includes a buffer queue up commands for sending to memory device 520.

Memory controller 510 includes I/O (input/output) hardware 512. I/O 512 represents transceivers and signal line interface hardware to enable memory controller 510 to connect to memory device 520 over one or more buses. I/O 512 enables memory controller 510 to send commands to memory device 520.

Memory device 520 includes I/O 522 to interface with I/O 512 of memory controller 510. I/O 522 has corresponding signal lines to I/O 512 to receive commands and address information to receive activate and refresh commands, among other commands. In one example, I/O 522 includes an interface to a data bus to exchange data with memory controller 510. Memory device 520 includes register 524, which represents one or more registers or storage locations to store configuration information or values related to the operation of memory device 520. In one example, register 524 includes one or more mode registers.

Memory device 520 includes controller 526, which represents a controller local to the memory device. Controller 526 includes hardware logic to execute operations in response to commands. Controller 526 includes software or firmware logic to control the hardware logic and control operations and sequences of operations in the memory device. Controller 526 manages I/O 522. In one example, controller 526 includes poison pattern 564, which represents logic within controller 526 to write wordlines as failed with a poison pattern.

Memory controller 510 includes error logic 518, which represents ECC logic and other control logic related to the detection and correction of errors and the management of memory resources in response to detection of errors. Error logic 518 can perform system level error detection and correction based on bits from multiple memory devices 520 in parallel, such as multiple devices in a memory module.

In one example, memory device 520 includes ECC logic 528, which represents on-die ECC for memory device 520. It will be understood that ECC logic 528 is separate from error logic 518 of memory controller 510 and the ECC logic that memory controller 510 includes. The operation of on-die ECC can be in addition to the operation of ECC at the system level, in memory controller 510. The operation of on-die ECC enables memory device 520 to correct SBE (single bit errors) prior to sending data to memory controller 510. The data sent to the controller can still have errors after the operation of ECC logic 528. The system level ECC provided by error logic 518 can operate on data from N memory devices in parallel on the same memory channel. Thus, error logic 518 is capable of correcting errors that ECC logic 528 will not be able to correct.

In one example, the operation of poison patterns can be performed at a system level, which does not affect the operation of ECC logic 528. In one example, permanent fault detection (described in more detail below) is performed at the system level and is independent of ECC logic 528. Thus, the PFD operation would not affect the operation of on-die ECC.

In one example, system 500 represents a DDR5 system in which writes and reads from memory controller 510 to memory devices 520 involves the sending of 512 data bits and 128 ECC bits. In one example, error logic 518 implements an application of ECC that has the capability to fully correct a single device error by using all 128 ECC bits. By using all 128 ECC bits to implement SDDC, there are no reserve ECC bits to use as system bits. In prior applications of ECC, there have been system bits available to use as a poison bit to support error containment. The poison bit indicates a failed cacheline, which flags the cacheline to memory controller 510 as failed. Without a poison bit, the system cannot use the traditional indication of a failed cacheline.

In one example, error logic 518 includes poison pattern 562, which represents logic in error logic 518 to implement a poison pattern for a dedicated cacheline. Instead of providing a bit to indicate the failure of the cacheline, system 500 can write a poison pattern into a failed cacheline to indicate the cacheline as failed. In one example, in response to detection of a poison pattern in a cacheline, the host can offline a page address to avoid use of the failed cacheline.

There are different implementations of a poison pattern that can be used. In one example, the system can have a preconfigured bit pattern to write into a cacheline. With a such an implementation, there is a statistical possibility that the real data in the cacheline could match the poison pattern. A poison pattern can be chosen that has a low likelihood of being real data. In one example, the system can XOR a poison pattern mask onto the contents of the failed cachelines. For example, a data pattern can result in a DUE (detected, uncorrectable error) indication, which can be identified by the H-matrix of the ECC implementation. Thus, error logic 518 can perform a XOR of the received data to determine if the resulting data is a DUE. Such an implementation with a carefully selected poison pattern can provide a robust poison pattern implementation for system 500 to support error containment. An implementation of the poison pattern can reduce the silent data rate of memory errors for the error containment cacheline.

In one example, controller 526 includes poison pattern 564 to implement the poison line implementation. In one example, poison pattern 564 represents logic to perform a poison pattern write of a cacheline indicated by error logic 518. The poison pattern can be referred to as a poison bit pattern. Bank 540 illustrates multiple rows. Bank 540 illustrates the bank having reserved rows and reserved row 542 through reserved row 544, to indicate that in one example, system 500 can implement poison pattern logic as well as dynamic bank sparing or dynamic allocation of ECC space within memory devices 520. The dynamic bank sparing can be in accordance with any example described. The implementation of other dynamic allocation of resources due to ECC error detection can be in accordance with other examples described.

Row 552 through row 554 represent rows that are not reserved for dynamic allocation. Whether the reserved rows or the non-reserved rows, in one example, bank 540 can mark a row for offlining by marking the row with the poison pattern.

In one example, error logic 518 implements poison pattern 562 to indicate a "poison line" by intentionally writing bad data, a poison pattern, into a cacheline detected as failed. The writing of the poison data can be referred to as injecting a failure pattern into the cacheline. The poison line provides an alternative to reserving 1 ECC bit as a status bit to notify the memory controller that the line is bad.

In one example, poison pattern 562 creates the poison data to write into the row. In one example, memory controller 510 sends a command to memory device 520 indicating a row to mark as failed, and poison pattern 564 can create the data to write into the failed row.

In one example, error logic 518 manages the application of a poison pattern to a failed cacheline. In one example, when a cacheline is detected as failed by a DUE indication from error detection, poison pattern 562 or poison pattern 564 can XOR the failed data with a poison pattern mask or error mask. The result of the XOR operation is an XOR result that can be used by the system to determine whether a point pattern has been identified. Depending on the design of the mask, the result of the XOR operation can remain a DUE for the great majority of bit patterns. There is a small probability that the application of the poison mask will result in a silent data error (SDE) pattern, which would suggest the cacheline is mis-corrected or mis-detected instead of being poison. However, the probability is very low if the poison pattern is carefully selected, as described below with reference to FIG. 7.

Figure 6:
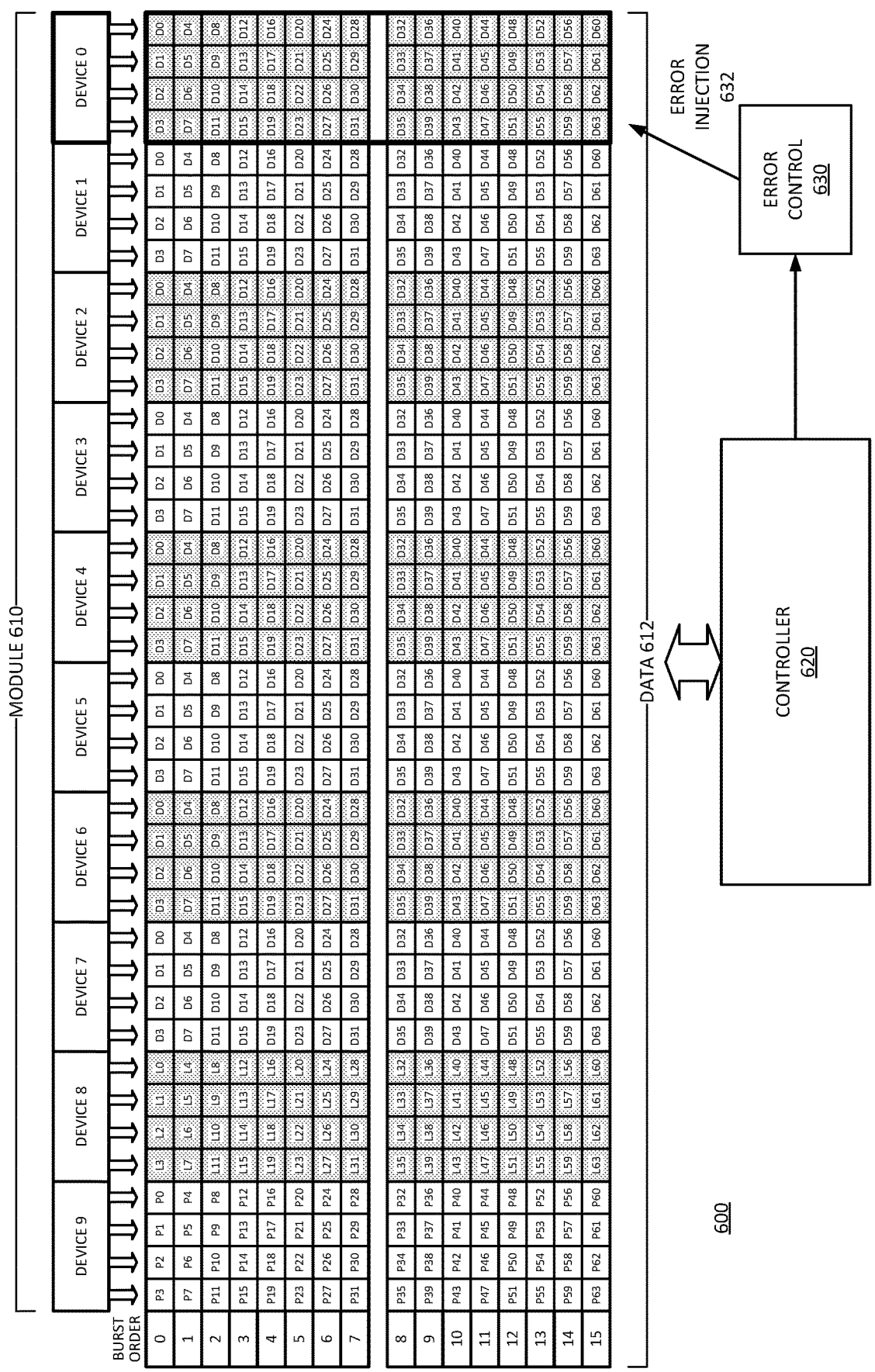
FIG. 6 is a block diagram of an example of a system with multiple parallel memory devices that can implement operations with a poison pattern.

FIG. 6 is a block diagram of an example of a system with multiple parallel memory devices that can implement operations with a poison pattern. System 600 represents a system in accordance with an example of system 500. System 600 illustrates an example of a data output pattern from a memory module in accordance with any example herein.

In one example, system 600 illustrates the implementation of a poison pattern into the data. Module 610 represents a memory module having 10 devices, labeled as Device[0:9]. The devices are illustrated as ×4 devices, which refers to the number of signal lines of the interface with a data (DQ) bus. A ×4 device has four signal lines, which will typically output data for a certain burst length. A burst length refers to how many consecutive unit intervals (UIs) or cycles will be used to output or input data.

As illustrated, system 600 operates with BL16 or a burst length of 16 unit intervals. Each device can transit (for a read operation) or receive (for a write operation) 4 bits per unit interval, totaling 64 bits per device per operation or transaction (either read or write). The order of bits to and from module 610 can be reversed based on whether the data is sent from controller 620 to the memory devices, or from the memory device to controller 620. Regardless of the orientation of the bits and the burst order, in general, in one example, during the first cycle (Burst Order 0), data bits D[0:3] are transmitted on the data bus, represented by data 612. For the second cycle (Burst Order 1), data bits D[4:7] are transmitted, and so forth until data bits D[60:63] for Burst Order 15.

It will be understood that any order of data can be used. For different amounts of data in different systems, different burst lengths, different burst order, different data bus interfaces (e.g., ×8 or ×16) can be used. The principle of the transaction will remain the same that the data devices of module 610 and controller 620 exchange data 612 on a data bus.

System 600 represents an example of a 10×4 module configuration, referring to 10 memory devices with ×4 DQ interfaces. In such a configuration, typically Device[0:7] will be "data" devices and Device[8:9] are "ECC" devices. A data device refers to the actual user data for the read or write transaction. An ECC device refers to a device that stores check bits or parity bits for decoding ECC for the data bits. In one example, the 64 bits of data from each device represents a cacheline or a portion of a cacheline (e.g., 64 bits of a 128-bit cacheline). Thus, the entire set of bits for each device represents the bits of a single cacheline or portion of a line.

In system 600, Device 0 is highlighted. Consider that Device 0 experiences failure. In one example, controller 620 includes or uses error control 630 to perform error injection 632 of a poison pattern into Device 0. Error injection 632 represents an example of an implementation of a poison pattern. In one example, the poison pattern relies on a poison pattern mask to support error containment. A poison line based on use of a poison mask can be a bit pattern that shows as a DUE (detectable but uncorrectable error) line, which when XORed with the poison mask is also a DUE error.

In one example, D[0:63] of Device 0 represents a poison pattern that controller 620 will recognize as a poison line, indicating a failure of the line. In response to the failure, in one example, controller 620 triggers the host to offline the line. In one example, controller 620 implements a version of ECC to correct the error.

In one example, a double device failure pattern of errors can represent a DUE pattern for purposes of poison pattern implementation. If the poison line is read from memory without additional memory errors, controller 620 can detect the pattern and report a DUE. By being able to detect a poison line error with poison data, in one example, system 600 will not trigger machine check architecture (MCA) logic to perform error handling.

It is possible that the poison line might experience a memory error that flips one of the bits of the poison pattern during the storing or the reading of the poison data. In one example, error control 630 implements a poison pattern mask that avoids shifting the poison data pattern into an SDC (silent data corruption) case when hit with the most dominate error types. For example, error injection 632 can represent a poison pattern mask having any 4 bursts or any 2 DQ failure be DUE.

In one example, the poison mask is used on top of existing encoded data. Thus, data encoding and data transmission, including the application of on-die ECC and other routines can be preserved and still implement the poison mask. In one example, error injection 632 can store a pre-defined poison pattern, regardless of the original data. In theory the use of a known poison pattern should be equivalent to the use of a poison mask.

The poison mask implementation is expected to provide benefits over the use of a pre-defined data pattern. First, the use of a poison mask reduces the possibility of the garbage data (the injected poison pattern data) being interpreted as an SDC case of stuck bits in the data device. When a predetermined pattern is injected, it could be inadvertently "changed" by stuck bits, whereas the use of a poison mask will already account for the stuck bits by simply applying the mask to the data stored in the device. Second, the use of a poison mask can reduce the logic as only non-zero mask bits need to be modified in the case of an XOR. In one example, the pattern can be limited to where only a fraction or a portion of the bits need to be modified, such as approximately ⅛ of the total bits. Third, a poison mask can allow the original data pattern to be maintained in the data device.

Figures 7A, 7B:
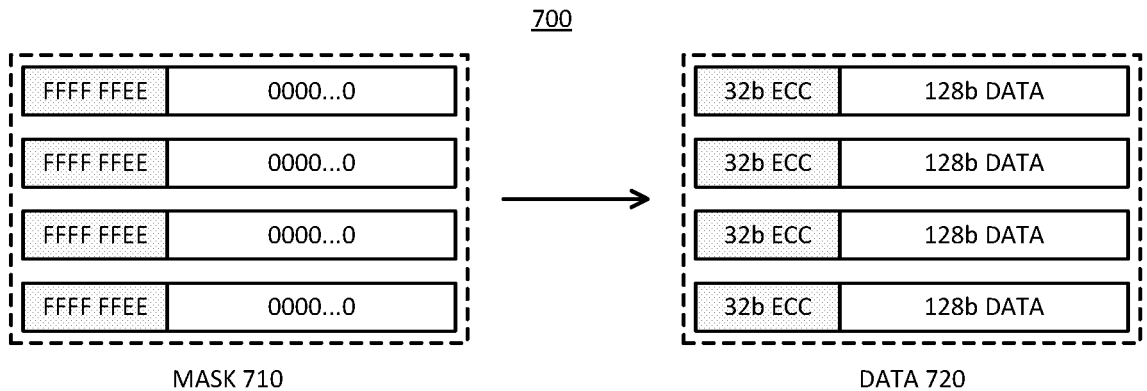
FIG. 7A is a block diagram of an example of a sub-divided poison pattern implementation.
FIG. 7B is a representation of properties for a poison pattern mask of FIG. 7A.

FIG. 7A is a block diagram of an example of a sub-divided poison pattern implementation. System 700 represents a poison mask to apply to a data pattern. System 700 can be applied by an example of system 500 or an example of system 600.

Mask 710 represents a poison pattern mask. Data 720 represents the data mask 710 will be applied to. The application of mask 710 to data 720 can be through a memory device or memory controller. Error control logic on the memory controller can control the application of the poison pattern mask in response to detection of an error.

Instead of using poison bit, mask 710 can be applied to data 720 to mark a cacheline poison by a resulting poison data pattern computed by combining data 720 with mask 710. The computation and storing of the result in the cacheline can be referred to as injecting bad data into the cacheline to trigger a DUE error in the line. The DUE error can flag the line to the memory controller as a garbage line or a failed cacheline. In one example, the poison pattern and poison pattern mask are implemented with DRAM ECC.

Data 720 is illustrated as four-by-128 bits, where each group of bits is organized as independent, ECC-protected data, with 32 bits of ECC per 128 bits of data. In one example, mask 710 applies the same poison pattern mask on each group of 128 bits. An example of a mask can be FFFF FFEE, as illustrated in system 700. The 'F' refers to a hex digit, representing binary '1111', and the 'E' refers to the hex digit representing the binary '1110'. Other patterns are possible. The pattern 'FFFF FFEE' was found to have a low SDC possibility when a poison line is hit by an additional memory error, with an implement of an underlying ECC algorithm in a DDR5 system.

In one example, when the cacheline needs to be poisoned, the memory controller will generate the corresponding ECC with the data. The whole codeword will be XORed with the poison pattern mask and written back to memory. When there is a memory read request for the poison line, if there is no error, the memory controller will detect errors. Upon detection of the errors, in one example, the memory controller XORs the line with errors with the poison mask. In one example, if the result of the computation is a legal codeword, the memory controller will interpret the cacheline as a poisoned line and will not take further action. In one example, if the resulting computation is not a legal codeword, the memory controller will log the error event.

System 700 represents a 4× mask method, which can be more robust than an individual mask implementation. The additional robustness comes from the fact that it would take all four sub-cachelines to fail and become SDC. If the line appears to be SDC in an individual mask implementation, the memory controller may attempt to decode the error. However, when three of four lines indicate a DUE and the fourth indicates an SDC, the memory controller can know that the SDC indication is incorrect. In one example, the memory controller will interpret the entire cacheline as poisoned as long as one sub-cacheline is a DUE.

In one example, the cachelines represent cachelines subdivided into multiple sub-cachelines. The multiple sub-cachelines can be written with a poison bit pattern to each subdivision of the main cacheline. In one example, all subdivisions of the main cacheline or all sub-cachelines having poison data written would need to experience an error before the poison data pattern would be unrecognizable to the memory controller.

FIG. 7B is a representation of properties for a poison pattern mask of FIG. 7A. Table 730 provides an example of poison pattern mask properties for an implementation of the poison pattern mask of FIG. 7A. Column 732 indicates the failure type. Column 734 indicates the coverage provided for the failure type indicated in column 732.

Row 742 indicates that for a single device failure, the poison pattern mask results in 9 SDC patterns per single device. The 9 SDC patterns results in a potential SDC mis-identification rate of $9/(2^{64})$ for DDR5, or an error identification on the order of 1 in 5E-19. Row 744 indicates that for any 2 DQ failure (any two signal lines of the data bus), the poison pattern mask results in 100% DUE, with 0 SDC indications. Row 746 indicates that for any 1b-4b errors (any errors of 1 to 4 bits), the poison pattern mask results in 100% DUE, with 0 SDC indications. Row 748 indicates that for any 4 burst errors (any 4 burst cycles or unit intervals with an error), the poison pattern mask results in 100% DUE, with 0 SDC indications. Row 750 indicates that for any errors of 2b in 2 different devices (2 error bits in 2 different devices), the poison pattern mask results in 100% DUE, with 0 SDC indications.

Figure 8:
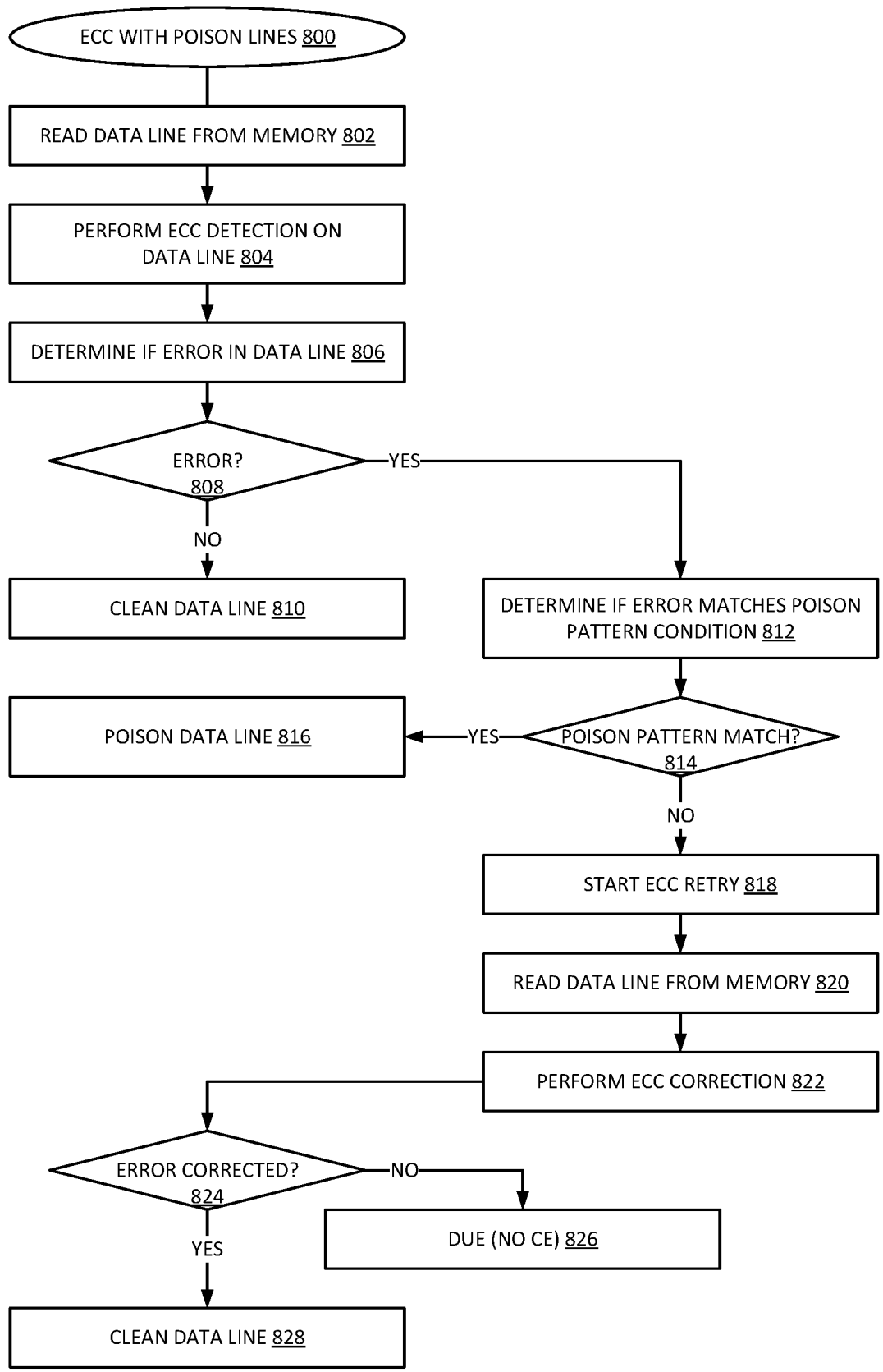
FIG. 8 is a flow diagram of an example of a process for implementing poison cache lines.

FIG. 8 is a flow diagram of an example of a process for implementing poison cache lines. Process 800 represents a process to implement poison lines with ECC. Process 800 can be executed by a system in accordance with an example of system 500 or an example of system 600.

The system can read a data line from memory, at 802, and perform ECC detection on the data line, at 804. The system determines if there are errors detected in the data line, at 806. If there are no errors detected, at 808 NO branch, the data line is a clean data line, at 810.

If there are errors detected, at 808 YES branch, in one example, the memory controller determines if the error matches a poison pattern condition, at 812. The poison pattern condition indicates that when the data line is computed with a poison pattern mask, the result is an expected pattern, if a poison pattern mask is used. Alternatively, where a poison pattern write of a predefined poison bit sequence instead of a poison pattern mask is used, the poison pattern condition indicates that the data line has an expected data pattern to indicate a poison line.

If the poison pattern condition matches, at 814 YES branch, in one example, the memory controller identifies the data line as a poison data line, at 816. If the data line is a poison line, the memory controller can ignore the data in the cacheline. Thus, the memory controller will continue operation without use of the data from the poison data line. If the poison pattern condition does not match, at 814 NO branch, in one example, the memory controller will attempt to correct the error.

In one example, the memory controller starts an ECC retry, at 818. The memory controller can read the data line from memory, at 820. Error logic in the memory controller can perform ECC correction on the data line, at 822. If the error is corrected with the error correction process, at 824 YES branch, the result is a clean memory line with corrected error, at 828. If the error is not corrected, the system determines that the data is DUE, at 826.

Figure 9:
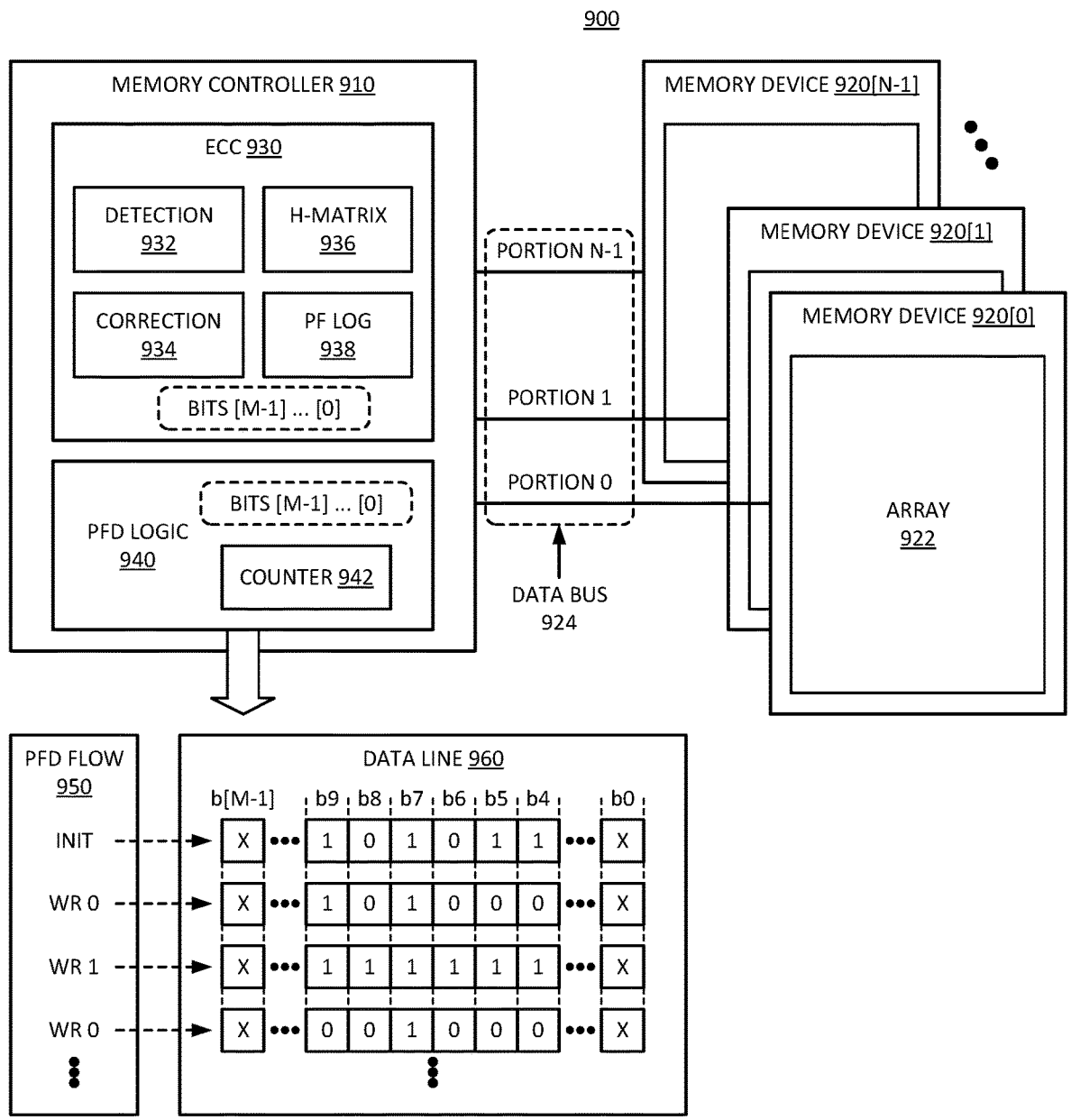
FIG. 9 is a block diagram of an example of a system to perform ECC based on permanent fault detection.

FIG. 9 is a block diagram of an example of a system to perform ECC based on permanent fault detection. System 900 can be a system in accordance with an example of system 100, where the system also includes permanent fault detection.

System 900 includes memory controller 910 coupled to N memory devices 920[0:(N−1)], collectively, memory devices 920. Memory devices 920 include memory arrays 922. In one example, arrays 922 can include rows designated for specific ECC purposes in accordance with any example herein. The rows are not specifically illustrated in system 900.

Data bus 922 couples memory devices 920 to memory controller 910. Memory devices 920 can provide a portion of the overall data to memory controller 910 for a read transaction. Thus, data bus 924 is illustrated as having portion 0 associated with memory device 920[0], portion 1 associated with memory device 920[1], and portion N−1 associated with memory device 920[N−1].

Memory controller 910 includes ECC 930, which represents hardware to perform ECC, firmware to implement ECC operations, or a combination of hardware and firmware. The firmware can control the operation of ECC hardware. ECC 930 performs ECC over portions[0:(N−1)] of data from memory devices 920. Thus, ECC 930 can perform system level ECC and perform error correction based on the information from multiple memory devices in parallel.

ECC 930 can be thought of as having detection 932, which represents ECC logic to perform detection of errors based on an incoming codeword. The incoming codeword can be the data bits received from memory devices 920. In a typical implementation, the N memory devices 920 will include one or more memory devices dedicated to storing ECC bits, while the other devices will store user data.

Detection 932 can function based on H-matrix 936. H-matrix provides a code representation of ECC operations on an incoming codeword. If the results of the calculations with the H-matrix results in zero entries in the H-matrix, then the data is clean and there are no errors. If there is a non-zero syndrome, the computations have generated a column within H-matrix 936 that corresponds to a bit in the codeword. Correction 934 represents logic within ECC 930 to perform correction of the data based on detection 932 and an address location from calculations based on H-matrix 936. Typically, correction 934 will flip the bit in the codeword corresponding to the non-zero syndrome location in the H-matrix.

In one example, memory controller 910 includes PFD logic 940. PFD logic 940 provides an example of a PFD engine or PFD hardware or PFD circuit to perform permanent fault detection. PFD logic 940 can be referred to as fault detection logic. In one example, PFD logic 940 is firmware logic in memory controller 910. PFD logic 940 enables memory controller 910 to determine the severity of errors within the memory device 920.

In one example, the PFD engine can operate by writing a known pattern (e.g., 1010 . . . b) to a failing address in response to detection of a stuck bit. The host can then read the data back to ensure the error is transient and not permanent. To ensure the address is properly checked, the host writes need to ensure that the data is written to the array (e.g., by issuing a precharge and then opening the page again for a read) and not just to the sense amps.

More specifically, PFD logic 940 can determine if an error detected by ECC 930 is transient or permanent. A transient error refers to an error that appears in one reading of the data line but not in a subsequent read of the same data line. A permanent fault refers to an error that persists in at least one bit or one cell of the data line regardless of what contents are written to the data line. Such an error can be referred to as a stuck bit.

Memory errors can be classified as non-permanent and permanent faults. For permanent memory failures, PFD logic 940 can identify the error location by a combination of reads and writes to the data line to determine if a specific location consistently has an error. In one example, PDF logic 940 provide information about the permanent fault locations to ECC 930 to inform or enhance the implementation of ECC.

One example of the operation of PFD logic 940 can be in accordance with PFD flow 950. PFD flow 950 indicates an initial state of data line 960. The specific values of the line do not have any significance and are only provided for purposes of illustration. The specific bits selected for the illustration of data line 960 have no particular significance, and errors can be detected in any of the M bits of the data line. Again, the bits provided are only for purposes of illustration.

In the initial state, bits[4:9] have a bit pattern '101011'. The other bit values of data line 960 are not specified for system 900. Assuming that at least one error was detected at bit b7, PFD logic 940 can perform a bit-flipping bit routine to detect a permanent fault. For example, PFD flow 950 can involve repeated write of all zeros (WR 0), followed by write of all ones (WR 1), write of all zeros (WR 0), and so forth. Alternatively, a bit pattern can be used, such as '1010 . . . ' or some other bit pattern.

In response to the first WR 0 of PFD flow 950, data line bits[4:9] have a bit pattern '101000', which includes errors at bits b9 and b7. The WR 1 of PFD flow 950 results in data line bits[4:9] having a bit pattern '111111', which indicates that none of bits[4:9] are stuck at zero. In response to the second WR 0 of PFD flow 950, data line bits[4:9] have a bit pattern '001000', which includes that the previous error at b9 was a transient error, and the error at b7 appears to be permanent. The bit flipping or writing with known patterns can continue for as many cycles as needed to determine the state of the bits and reduce the likelihood that a transient error will be determined to be a permanent error. Thus, PFD logic 940 can perform a check by writing all zeros and all ones multiple times in succession to detect stuck bits.

In one example, instead of writing a known bit pattern, the current read data can be used, or the current read data and its complement (i.e., every bit position is flipped on a subsequent write). PFD flow 950 does not explicitly indicate the reads, but PFD flow 950 will have a read after a write to allow PFD logic 940 to compare the read data with what was written. In one example, PFD logic 940 operates only when an error is detected by ECC 930. Thus, PFD logic 940 does not have scheduled or periodic operation, but is triggered by error detection.

PFD logic 940 can create a mapping illustrated in the dashed line of bits [(M−1):0] to indicate where permanent errors were detected in data line 960, if any. In one example, PFD logic 940 includes counter 942, which represents a counter to track the permanent faults detected in memory devices 920. In one example, counter 942 has an associated threshold, to trigger error control within memory controller 910 to perform corrective actions if the threshold error count is reached. In one example, counter 942 can keep the error count and the mapping of the errors.

PF (permanent fault) log 938 represents a log or mapping of permanent faults identified by PFD 940. PF log 938 can be the mapping illustrated in the dashed line of bits [(M−1):0]. With PF log 938, ECC 930 can have an indication of where permanent bit errors are within the data received on data bus 924. In one example, ECC 930 can achieve better correction based on knowing where permanent faults are located. PFD logic 940 will identify the device that requires correction, enabling ECC 930 to use error location information to improve ECC correction. Correction 934 can make a targeted correction, which can be referred to as error erasure. Error erasure has stronger coverage than using ECC purely as correction.

Alternatively, ECC 930 can use PF log 938 to determine whether correction 934 has generated a proper correction based on knowing where permanent faults are within data on data bus 924. For example, if correction 934 generates a corrected data value for data line 960 which has a "bit correction" to a known stuck state of a data bit, the correction can be determined to be faulty. In one example, ECC 930 determines if the result of correction 934 violates any known permanent faults before passing the data as corrected data.

For example, if PFD logic 940 indicates to ECC 930 that memory device 920[1] has a permanent fault, ECC 930 can adjust the application of H-matrix 936 based on knowing a certain data value will always be produced by memory device 920[1]. In one example, ECC 930 can focus the ECC operation on only the faulty devices instead of attempting to perform error correction on good devices. By identifying permanent faults earlier, system 900 can mitigate the effects of the permanent faults with redundant logic or other methods. Thus, system 900 can save the application of ECC for detection of transient faults, which are unpredictable, rather than trying to apply ECC to correct predictable known faults.

It will be understood that if an error is not reproduced during PFD flow 950 and the error was not correctable by ECC alone, the error will still stay uncorrectable. Additionally, PFD logic 940 should be able to detect hard errors or permanent error, which should be reproduced during PFD flow 950. There may be corner cases or uncommon occurrences when even a bad device has been identified and the errors are still uncorrectable by ECC 930. Even if the errors remain uncorrectable, memory controller 910 can then be aware of the errors.

Figure 10:
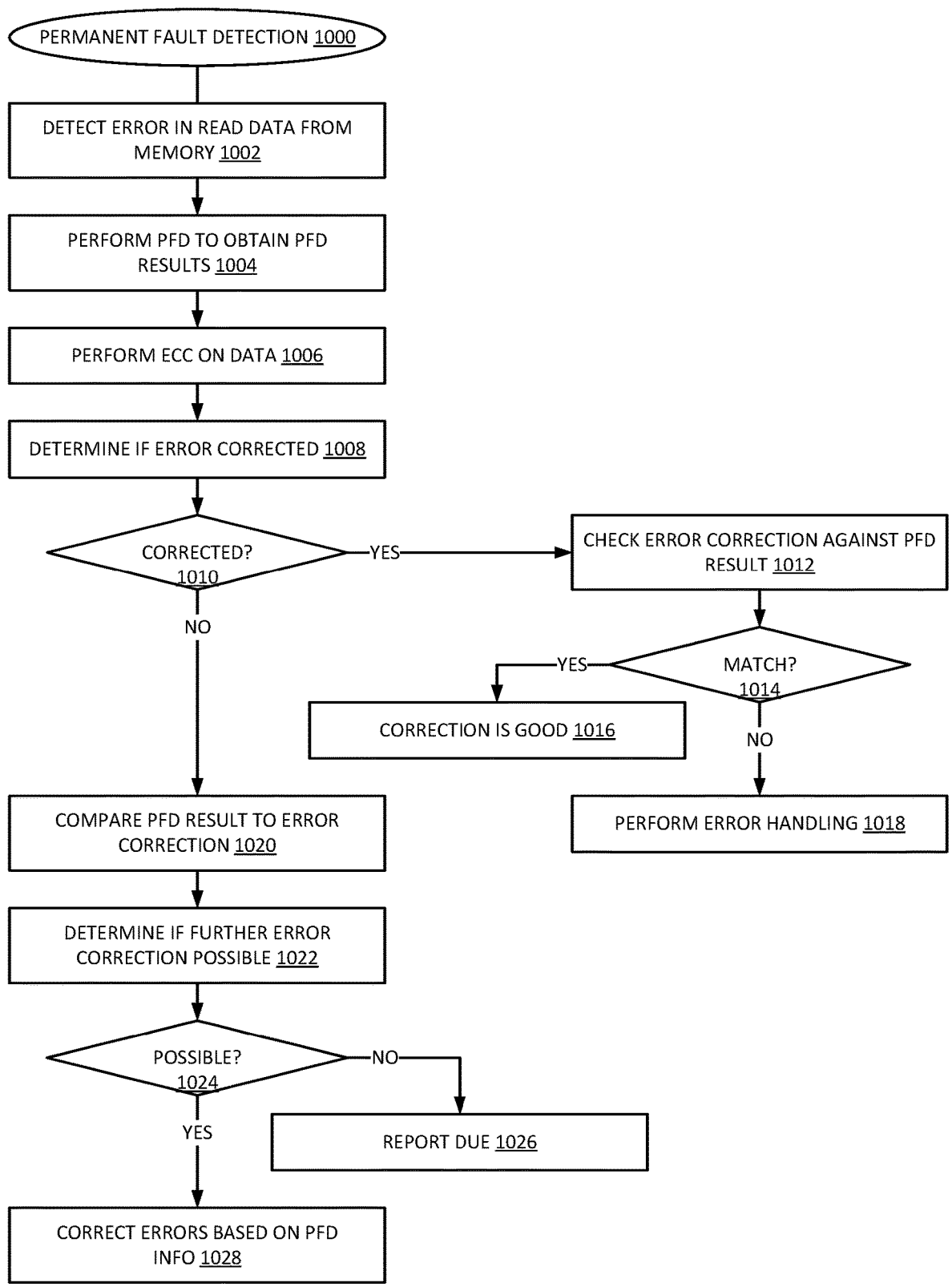
FIG. 10 is a flow diagram of an example of a process for permanent fault detection.

FIG. 10 is a flow diagram of an example of a process for permanent fault detection. Process 1000 represents a process for permanent fault detection that can be executed by a system in accordance with an example of system 900.

The system detects an error in read data from memory, at 1002. For example, the memory controller can perform error checking on the data and detect one or more errors. In one example, in response to detection of the error(s), error logic at the memory controller determines to perform permanent fault detection to obtain PFD results or PFD information to inform the application of ECC in the system, at 1004.

In one example, the system performs ECC on the data, and uses the PFD information with the ECC, at 1006. The performance of ECC can result in an ECC result that the system can use to determine if there are errors. In one example, the error logic determines if the error is corrected by the application of ECC, at 1008. If the error is corrected, at 1010 YES branch, in one example, the error logic or error control checks the error correction against the PFD result, at 1012. Thus, the system can use the PFD result as a reference for ECC correction. For example, the ECC corrects one or more errors in a certain device, and compares the error correction result with the PFD result. If the error correction matches the PFD information, at 1014 YES branch, the correction is good, at 1016. If there is not a match, at 1014 NO branch, the correction result is false and the system can perform an error handling routine, at 1018. As such, one implementation enables use of the results of the PFD for error correction comparison rather than for enhancing the strength of the error correction.

In one example, if the error(s) are not corrected by the application of ECC, at 1010 NO branch, the error logic compares the PFD result to the error correction, at 1020. The system can determine if further error correction would be possible on the data based on the comparison, at 1022. If additional error correction would not be possible, at 1024 NO branch, the system can report the error as a DUE, at 1026. If additional error correction would be possible, at 1024 YEs branch, in one example, the system corrects the error(s) based on the PFD information, at 1028.

Thus, in one example, the PFD information can be used in the case that the main ECC detects errors and fails in the attempt to perform correction. If the PFD information identifies a failed device, such information can be provided to the main ECC to enable ECC to apply the information to recover from a failed device.

Figure 11:
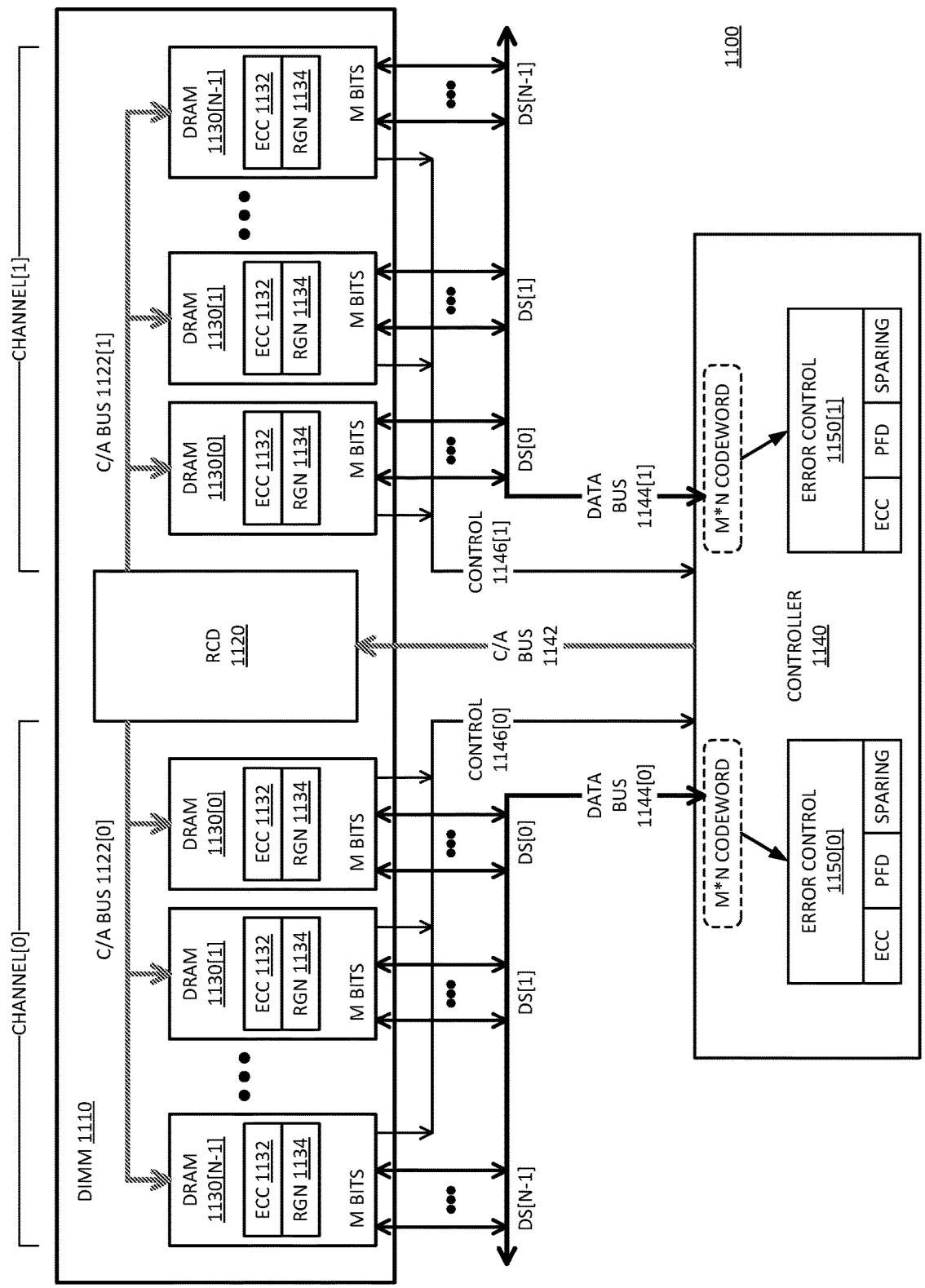
FIG. 11 is a block diagram of an example of a memory module with memory devices having reserved regions of memory, and a controller that can perform permanent fault detection and dynamic sparing.

FIG. 11 is a block diagram of an example of a memory module with memory devices having reserved regions of memory, and a controller that can perform permanent fault detection and dynamic sparing. System 1100 represents a system in accordance with an example of system 100.

System 1100 illustrates one example of a system with memory devices that share a control bus (C/A (command/address) bus 1142) and data buses (data bus 1144[0] for Channel[0] and data bus 1144[1] for Channel[1]). The memory devices are represented as DRAM (dynamic random access memory) devices 1130. Each channel has N DRAM devices, DRAM 1130[0:(N−1)], where N can be any integer. In one example, N includes one ECC DRAM devices and the other N−1 DRAM devices are data devices. In one example, N includes two ECC DRAM devices and the other N−2 DRAM devices are data devices. In one example, the two separate channels share C/A bus 1142 connection between controller 1140 to RCD 1120. In one example, the separate channels will have separate C/A buses. DRAM devices 1130 can be individually accessed with device specific commands, and can be accessed in parallel with parallel commands.

RCD (registered clock driver or registering clock driver) 1120 represents a controller for DIMM (dual inline memory module) 1110. In one example, RCD 1120 receives information from controller 1140 and buffers the signals to the various DRAM devices 1130. By buffering the input signals from controller 1140, the controller only sees the load of RCD 1120, which can then control the timing and signaling to DRAM devices 1130.

In one example, RCD 1120 controls the signals to the DRAM devices of Channel[0] through C/A bus 1122[0], and controls the signals to DRAM devices of Channel[1] through C/A bus 1122[1]. In one example, RCD 1120 has independent command ports for separate channels. In one example, DIMM 1110 includes data buffers (not illustrated) to buffer the data bus signals between DRAM devices 1130 and controller 1140. Data bus 1144[0] provides a data bus for the DRAM devices of Channel[0] and data bus 1144[1] provides a data bus for the DRAM devices of Channel[1].

C/A bus 1122[0] and C/A bus 1122[1] (collectively, C/A buses 1122) are typically unilateral buses or unidirectional buses to carry command and address information from controller 1140 to DRAM devices 1130. Thus, C/A buses 1122 can be multi-drop buses. Data bus 1144[0] and data bus 1144[1], collectively data buses 1144, are traditionally bidirectional, point-to-point buses.

In one example, control 1146[0] represents signal lines to enable DRAMs 1130 of Channel[0] and control 1146[1] represents signal lines to enable DRAMs 1130 of Channel[1] to provide control signals to controller 1140. The control signals can be, for example, error indications, or other signals that are not part of data buses 1144.

In one example, DRAMs 1130 include ECC 1132, which represents ECC logic for the DRAM devices. In one example, DRAMs 1130 include region (RGN) 1134, which represents a region or portion of the DRAM that is reserved for use for ECC purposes. In one example, region 1134 is a region reserved for dynamic bank sparing. In one example, region 1134 represents a region reserved as tier 2 ECC bits (described in more detail below).

In one example, controller 1140 includes error control 1150, which represents error control in accordance with any example herein. Error control 1150 can detect errors in data received from DRAMs 1130. As illustrated, each DRAM 1130 provides M bits of data as data segments (DS) for data buses 1144. For example, DRAM 1130[0] generates data segment DS[0], DRAM[1] generates DS[1], and so forth, with DRAM 1130[N−1] providing DS[N−1].

Controller 1140 receives all the data segments as input data. For purposes of error evaluation or ECC, the data bits can represent a codeword having length M*N or N*M (the number of DRAMs 1130 times the number of bits provided by each DRAM). In one example, controller 1140 includes separate error control 1150 for the different channels. As illustrated, error control 1150[0] provides error control operations for Channel[0] and error control 1150[1] provides error control operations for Channel[1].

In one example, error control 1150[0] and error control 1150[1] (collectively, error control 1150) include logic to perform one or more ECC functions. In one example, error control 1150 includes ECC logic to perform error checking and correction on the codeword. In one example, ECC logic operates based on data in an ECC DRAM 1130 as well as data in region 1134. In response to detection of an error, error control 1150 can implement PFD, dynamic sparing, or some other ECC operation. The dynamic sparing can be bank sparing, boundary sparing, or other operation. The error control operations can be in accordance with any example provided. In one example, the ECC functions or ECC operations can be utilized together.

Figure 12:
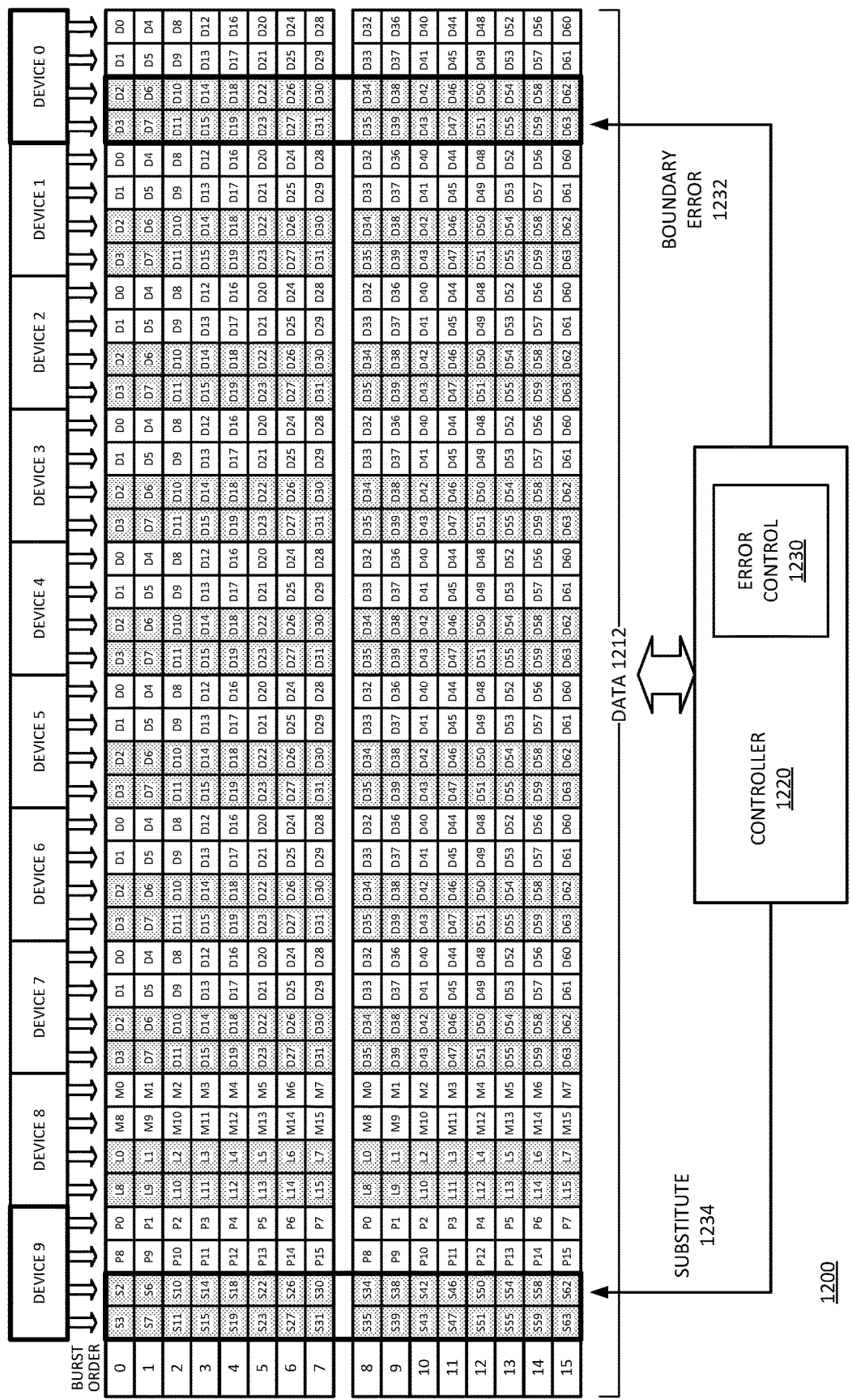
FIG. 12 is a block diagram of an example of a system with boundary fault sparing.

FIG. 12 is a block diagram of an example of a system with boundary fault sparing. System 1200 represents a system in accordance with an example of system 1100 or an example of system 100. System 1200 illustrates an example of a data output pattern from a memory module in accordance with any example herein.

In one example, system 1200 illustrates the implementation of boundary sparing. Module 1210 represents a memory module having 10 devices, labeled as Device[0:9]. The devices are illustrated as ×4 devices, which refers to the number of signal lines of the interface with a data (DQ) bus. A ×4 device has four signal lines that output data over a burst length of 16 in system 1200.

As illustrated, system 1200 operates with BL16 or a burst length of 16 unit intervals. Each device can transit (for a read operation) or receive (for a write operation) 4 bits per unit interval, totaling 64 bits per device per operation or transaction (either read or write). The order of bits to and from module 1210 can be reversed based on whether the data is sent from controller 1220 to the memory devices, or from the memory device to controller 1220. Regardless of the orientation of the bits and the burst order, in general, in one example, during the first cycle (Burst Order 0), data bits D[0:3] are transmitted on the data bus, represented by data 1212. For the second cycle (Burst Order 1), data bits D[4:7] are transmitted, and so forth until data bits D[60:63] for Burst Order 15.

It will be understood that any order of data can be used. For different amounts of data in different systems, different burst lengths, different burst order, different data bus interfaces (e.g., ×8 or ×16) can be used. The principle of the transaction will remain the same that the data devices of module 1210 and controller 1220 exchange data 1212 on a data bus.

System 1200 represents an example of a 10×4 module configuration, referring to 10 memory devices with ×4 DQ interfaces. In such a configuration, typically Device[0:7] will be "data" devices and Device[8:9] are "ECC" devices. A data device refers to the actual user data for the read or write transaction. An ECC device refers to a device that stores check bits or parity bits for decoding ECC for the data bits. In one example, the 64 bits of data from each device represents a cacheline or a portion of a cacheline (e.g., 64 bits of a 128-bit cacheline). Thus, the entire set of bits for each device represents the bits of a single cacheline or portion of a line.

In system 1200, Device 0 is highlighted. Consider that Device 0 experiences failure in half of the device. Devices [0:9] are illustrated with two halves, illustrated by different shading. One half of the device is shaded while the other half is not. The different shading indicates that a failure could occur in a boundary, or one portion of the device and not in the other portion of the device. In one example, system 1200 can address a failure in one portion by sparing out the failed portion and allowing the other portion of the device to continue being used.

Just as an entire device can fail, the device can fail at a boundary. The boundary refers to separations of the memory array based on the access or decoding hardware. For example, a ×4 device may fail in half of the device, affecting two signal lines of the device or two bits per unit interval, or in a quarter of the device, affecting one signal line of the device or a single bit per unit interval. Similarly, a ×8 device may fail in half of the device, affecting four signal lines, or fail in a quarter of the device, affecting 2 of the signal lines. Thus, Devices[0:9] can have failures in one half or one portion of the memory device.

In one example, controller 1220 detects boundary error 1232, indicating that half of Device[0] has failed. Considering D0 and D1 to be the right half and D2 and D3 to be the left half (although the left and right designations could be reversed depending on the perspective taken), boundary error 1232 can detect the failure of the left half of Device[0]. The error detection can detect the left half failure of Device [0]. System 1200, based on the ECC bits available, can perform error correction on the data to correct for the boundary failure. In one example, instead of correcting the errors on every read with ECC operations, error control 1230 of controller 1220 performs boundary fault sparing.

Boundary fault sparing includes copying the contents of the failed portion of Device[0] (or other portion, depending on where the boundary fault is detected) to one of the ECC devices. A portion of Device[9] is highlighted to indicate the space to which the data of boundary error 1232 is copied. The copy is identified as substitute 1234, to indicate that controller 1220 substitutes the addresses in the left half of Device[9] for the left half bits of Device[0]. While the left half of the bits are used to map the failed left half of the data device, it will be understood that there is not a requirement to have left side match left side or right side to right side. Rather, system 1200 simply illustrates that a failed portion can be spared to a different device within module 1210.

In one example, boundary fault sparing also includes the adjusting of the application of ECC according to the new architecture. If the data portion is spared to one of the ECC devices, there may be fewer ECC bits for the application of error checking and correction. The ECC values stored in the bits remaining may also need to be changed to reflect the lower number of bits in the system.

Based on the architecture of DDR5 DRAMs, faults in DDR5 memory are more likely to be limited in a single boundary fault region rather than over the entire device. In one example, in system 1200 when module 1210 has a device with a single boundary fault region, the host, through execution on the host processor or CPU, can launch boundary fault sparing to spare the faulty boundary. In one example, launching the boundary fault sparing causes operations in controller 1220 to occur to implement the boundary fault sparing. Error control 1230 can represent logic to implement the boundary fault sparing, which can be considered a type of dynamic sparing. In one example, the boundary fault sparing includes shifting the ECC algorithm from an original SDDC state to a boundary fault state, enabling the system to implement ECC to correct a second detected boundary fault, in case a second such fault is detected.

In system 1200, the left 32b block of Device[9] is reserved for sparing boundary error 1232. In one example, 32b of metadata are stored in the right half block of Device[8], while 32b ECC is stored in the left half of Device[8] and the other 32b ECC is stored in the right half of Device[9]. System 1200 illustrates the different types of data as D0, D1, D2, . . . , for user data; M0, M1, M2, . . . , for metadata; L0, L1, L2, . . . , as one portion of ECC bits, and P0, P1, P2, . . . , as the other portion of ECC bits or parity bits. System 1200 illustrates the spared region of Device[9] as S2, S3, S6, S7, S10, S11, . . . , as the "substitute" data corresponding to Device[0] as D2, D3, D6, D7, D10, D11, . . . .

In one example, the boundary fault sparing runs in normal mode and does not need virtual lock step operation. The ECC coverage can be summarized as follows. In one example, if the PFD identifies zero failed boundary faults, it can 100% correct a single boundary fault. However, if there is a single device failure, which means double boundary fault blocks, the ECC might have small percentage of SDC. In one example, if the PFD identifies one failed boundary fault, it can 100% correct a single boundary fault. It can 100% detect one permanent boundary fault and one transient boundary fault. In one example, if the PFD identifies two failed boundary faults, it can 100% correct the double boundary fault.

Boundary fault sparing can act as an intermediate state between SDDC and ADDDC (which may require lockstep operation) without a degradation of performance. In one example, the system applies boundary fault sparing to spare the first boundary fault and then correct the second boundary fault. Boundary faults can be identified as failures in a specific portion or a specific region of a memory device. A boundary fault can be identified as a failure for specific bits or specific portions of data to be send on the data line from the failing memory device. The failing memory device can be referred to as having a portion of its interface failing, referring to an internal error being unable to correctly provide data to the interface at selected signal lines of the interface.

When multiple portions of the memory device fail, the entire memory device can be said to have failed. For example, a memory device can first have a failure at a portion of the interface, and a subsequent failure in another portion of the interface can result in the entire device being failed.

Figure 13:
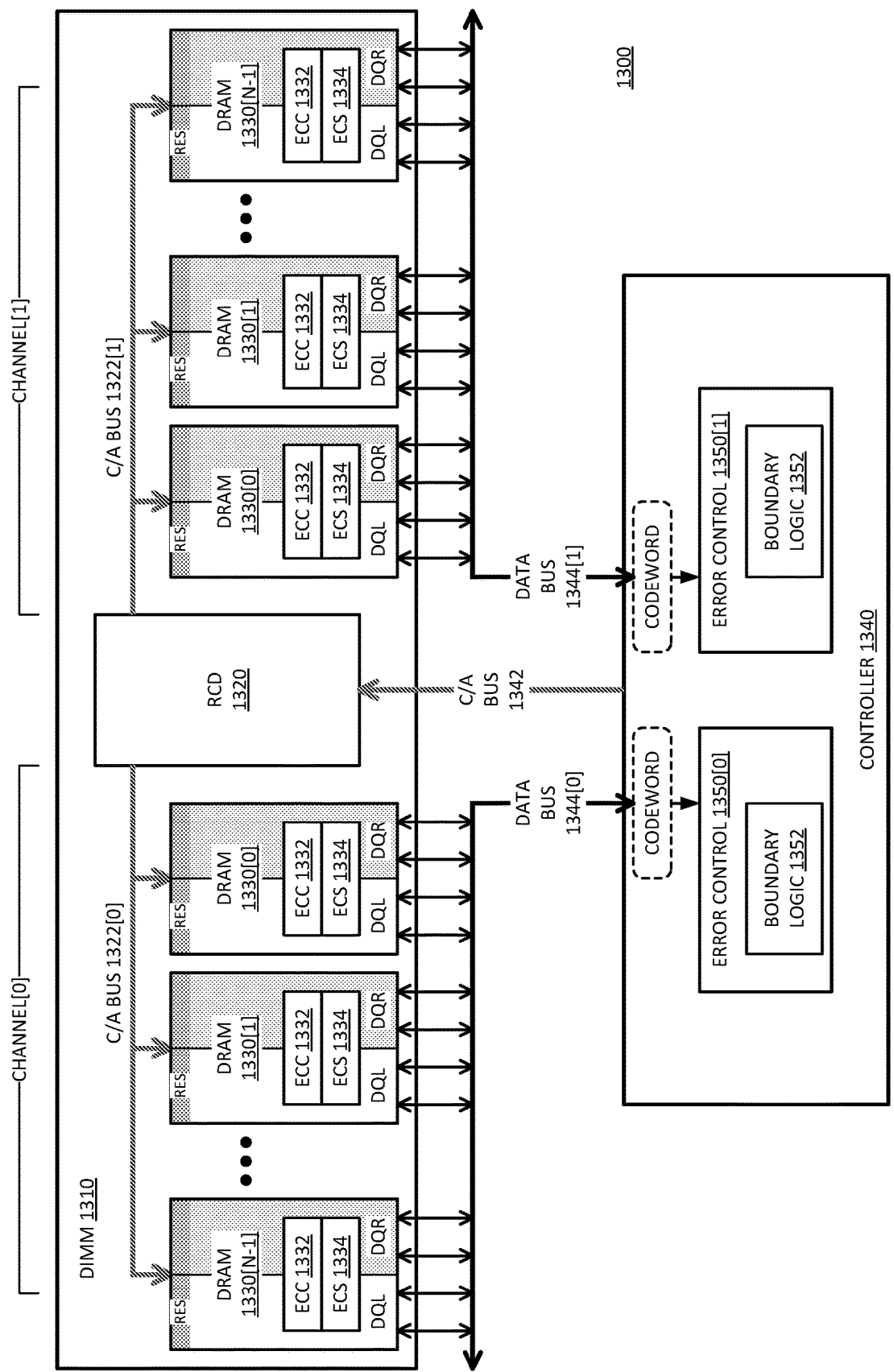
FIG. 13 is a block diagram of an example of a memory module with boundary fault sparing.

FIG. 13 is a block diagram of an example of a memory module with boundary fault sparing. System 1300 represents a system in accordance with an example of system 100 or an example of system 1100 or an example of system 1200.

System 1300 illustrates one example of a system with memory devices that share C/A bus 1342 and data buses (data bus 1344[0] for Channel[0] and data bus 1344[1] for Channel[1]). The memory devices are represented as DRAM (dynamic random access memory) devices 1330. Each channel has N DRAM devices, DRAM 1330[0:(N−1)], where N can be any integer. In one example, N includes one ECC DRAM devices and the other N−1 DRAM devices are data devices. In one example, N includes two ECC DRAM devices and the other N−2 DRAM devices are data devices. In one example, the two separate channels share C/A bus 1342 connection between controller 1340 to RCD 1320. In one example, the separate channels will have separate C/A buses. DRAM devices 1330 can be individually accessed with device specific commands, and can be accessed in parallel with parallel commands.

RCD 1320 represents a controller for DIMM (dual inline memory module) 1310. In one example, RCD 1320 receives information from controller 1340 and buffers the signals to the various DRAM devices 1330. By buffering the input signals from controller 1340, the controller only sees the load of RCD 1320, which can then control the timing and signaling to DRAM devices 1330.

In one example, RCD 1320 controls the signals to the DRAM devices of Channel[0] through C/A bus 1322[0], and controls the signals to DRAM devices of Channel[1] through C/A bus 1322[1]. In one example, RCD 1320 has independent command ports for separate channels. In one example, DIMM 1310 includes data buffers (not illustrated) to buffer the data bus signals between DRAM devices 1330 and controller 1340. Data bus 1344[0] provides a data bus for the DRAM devices of Channel[0] and data bus 1344[1] provides a data bus for the DRAM devices of Channel[1].

C/A bus 1322[0] and C/A bus 1322[1] (collectively, C/A buses 1322) are typically unilateral buses or unidirectional buses to carry command and address information from controller 1340 to DRAM devices 1330. Thus, C/A buses 1322 can be multi-drop buses. Data bus 1344[0] and data bus 1344[1], collectively data buses 1344, are traditionally bidirectional, point-to-point buses. For simplicity, system 1300 does not illustrate control signal lines from the DRAMs to controller 1340.

In one example, DRAMs 1330 include ECC 1332, which represents ECC logic for the DRAM devices. DRAMs 1330 are illustrated separated into two halves, with a shaded region and a non-shaded region. The shaded region corresponds to DQR, which represents a right-side data bus interface. The non-shaded region corresponds to DQL, which represents a left-side data bus interface. The designation as right or left is in relation to the representation on the page, and could be reversed in another context.

As illustrated, DRAMs 1330 are ×4 devices, with four signal lines coupled to data buses 1344. The DQR and DQL separate the devices into two portions of ×2. In one example, the device could be separated as four portions of ×1. For a ×8 device, there can be different separations based on the boundaries within the DRAM devices. The boundaries can correspond to drivers or access circuitry between portions of the memory array within the DRAM devices.

In one example, DRAMs 1330 include a reserved region, illustrated by darker shading and designated as "RES" for reserved. The reserved region can be a region for dynamic sparing in accordance with any example above. The reserved region can be a reserved region for the application of ECC based on tier 1 bits stored in an ECC DRAM and tier 2 bits stored in the reserved region, in accordance with any example described. More details on ECC based on tier 1 bits and tier 2 bits are provided below.

Controller 1340 receives the data from DRAMs 1330 collectively as input data. For purposes of error evaluation or ECC, the received codeword on data buses 1344 include the bits of the parallel DRAMs. In one example, controller 1340 includes separate error control 1350 for the different channels. As illustrated, error control 1350[0] provides error control operations for Channel[0] and error control 1350[1] provides error control operations for Channel[1].

In one example, error control 1350[0] and error control 1350[1] (collectively, error control 1350) include logic to perform one or more ECC functions. While not explicitly shown, error control 1350 includes ECC logic to perform error checking and correction on the codeword. In one example, error control 1350 can include logic to implement PFD, dynamic sparing, or some other ECC operation. The dynamic sparing can be bank sparing, boundary sparing, or other operation. The error control operations can be in accordance with any example provided. In one example, the ECC functions or ECC operations can be utilized together.

In one example, DRAMs 1330 can be managed based on the boundaries illustrated by the separate halves of the devices. In one example, error control 1350 includes boundary logic 1352, which represents logic for boundary sparing. Boundary logic 1352 can enable error control 1350 to identify faults that are based on boundaries. In one example, boundary logic 1352 enables controller 1340 allocates memory space within DRAMs 1330 to implement the boundary sparing. Controller 1340 can move or copy the data from the failed region to the spared boundary region and remap the use of the addresses. In one example, error control generates a new application of ECC based on the sparing of the data from a failed boundary region to a spared boundary region. In one example, error control 1350 enables controller 1340 to dynamically perform boundary sparing during runtime of system 1300.

In one example, DRAMs 1330 include error checking and scrub (ECS) 1334. ECS 1334 represents hardware and logic within the memory devices to check for errors in the memory array, correct the errors with on-die ECC (i.e., ECC 1332), and write the corrected data back to the memory array. The correction and writing the corrected data back "scrubs" the array of errors.

In one example, ECS 1334 tracks errors encountered in the checking and scrubbing process and reports the errors to controller 1340. Such an operation can be referred to as ECS transparency. The reporting of errors can be filtered by an offset to indicate new errors since deployment of the memory device into system 1300. The filtering can allow the memory device to report only on the error rate in the system rather than reporting on all errors including defects present from manufacturing. In one example, ECS 1334 provides error tracking information to error control 1350, which can use the information for the application of ECC at the system level.

Figure 14:
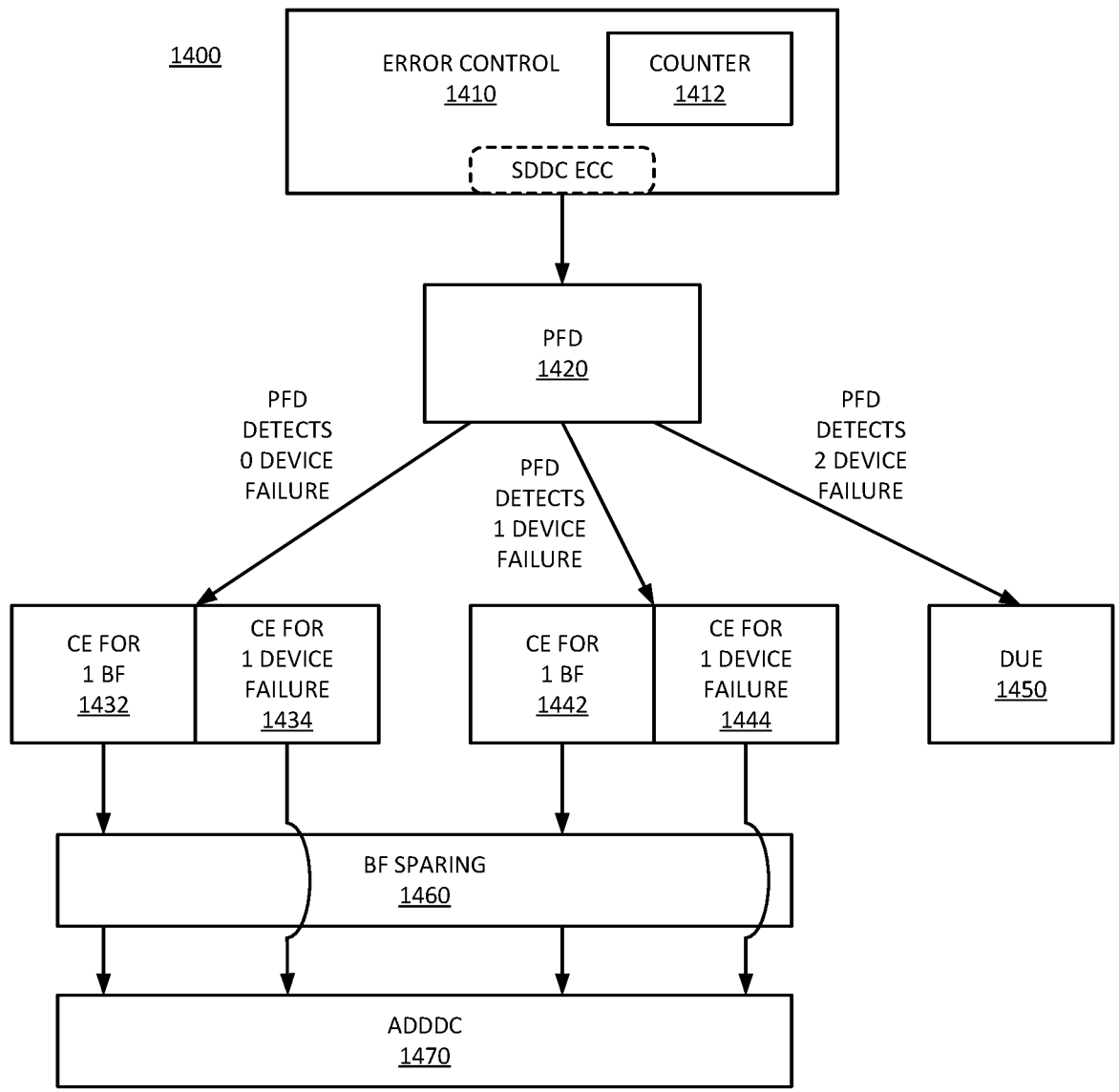
FIG. 14 is a block diagram of an example of memory error control based on boundary fault sparing.

FIG. 14 is a block diagram of an example of memory error control based on boundary fault sparing. System 1400 represents a system in accordance with an example of system 1200 or an example of system 1300.

System 1400 includes error control 1410, which can be error control logic in accordance with any example herein. In one example, error control 1410 manages the application of ECC in a system. Error control 1410 is part of a memory controller of a host system. In one example, error control 1410 runs system 1400 in SDDC mode to start. The SDDC ECC mode can be changed depending on the detection of errors by PFD 1420.

In one example, error control 1410 includes an error counter represented by counter 1412. Counter 1412 enables error control 1410 to log the number of errors detected in data. In one example, counter 1412 is associated with the execution of an ECS operation within the memory system. In one example, counter 1412 is associated with detection of errors with a PFD unit, and tracks the number of permanent faults in the system. In one example, counter 1412 can be part of PFD 1420, which represents the permanent fault detection unit.

In one example, if an error is corrected and a PFD unit does not identify any failed device, the system can continue to operate on the data that is corrected. In one example, if counter 1412 hits an assigned threshold and the permanent fault detection unit does not identify any failed devices, the error control 1410 can check error logging. Error logging refers to a log or a mapping that indicates where the errors exist within the data. If a logged error is a boundary fault, as indicated by being with a boundary region or a specific block of data bits, the memory controller can perform boundary fault sparing.

In system 1400, the operation can be seen as PFD 1420 determining whether there are errors. If the PFD detects 0 device failures, in one example, the system can apply boundary fault (BF) sparing 1460 fora correctable error for one boundary fault, 1432. If there are no failed device but there are multiple boundary faults, the logged error is beyond a single boundary fault, 1434, and the memory controller can perform ADDDC 1470 to correct the errors.

In one example, not all second boundary faults will trigger ADDDC 1470. ADDDC 1470 will need to be applied if the first and second boundary faults are in the same memory device. For example, if the first boundary fault is Device[4] right half block, the error can be corrected by ECC and the memory controller, through error control 1410, can trigger boundary fault sparing. After the boundary fault sparing, if Device[4] left half block also fails and the error is corrected, the memory controller, through error control 1410, can go to ADDDC 1470 by sparing Device[4]. If the second boundary fault is in another device, the system may need to enter a service state or a failed state.

In one example, if PFD 1420 detects one failed device and an error count threshold of counter 1412 has not been reached, the memory controller, through error control 1410, can decide to address correctable error for one boundary fault, 1442, with boundary fault sparing 1460. In one example, if PFD 1420 detects one failed device and an error count threshold of counter 1412 has not been reached, the memory controller, through error control 1410, can decide to address correctable error for one device failure, 1444, with ADDDC 1470.

If PFD 1420 detects more than one device failure, in one example, the memory controller, through error control 1410, reports DUE 1450. In one example, DUE 1450 can trigger an error recovery routine or a service state.

Figure 15:
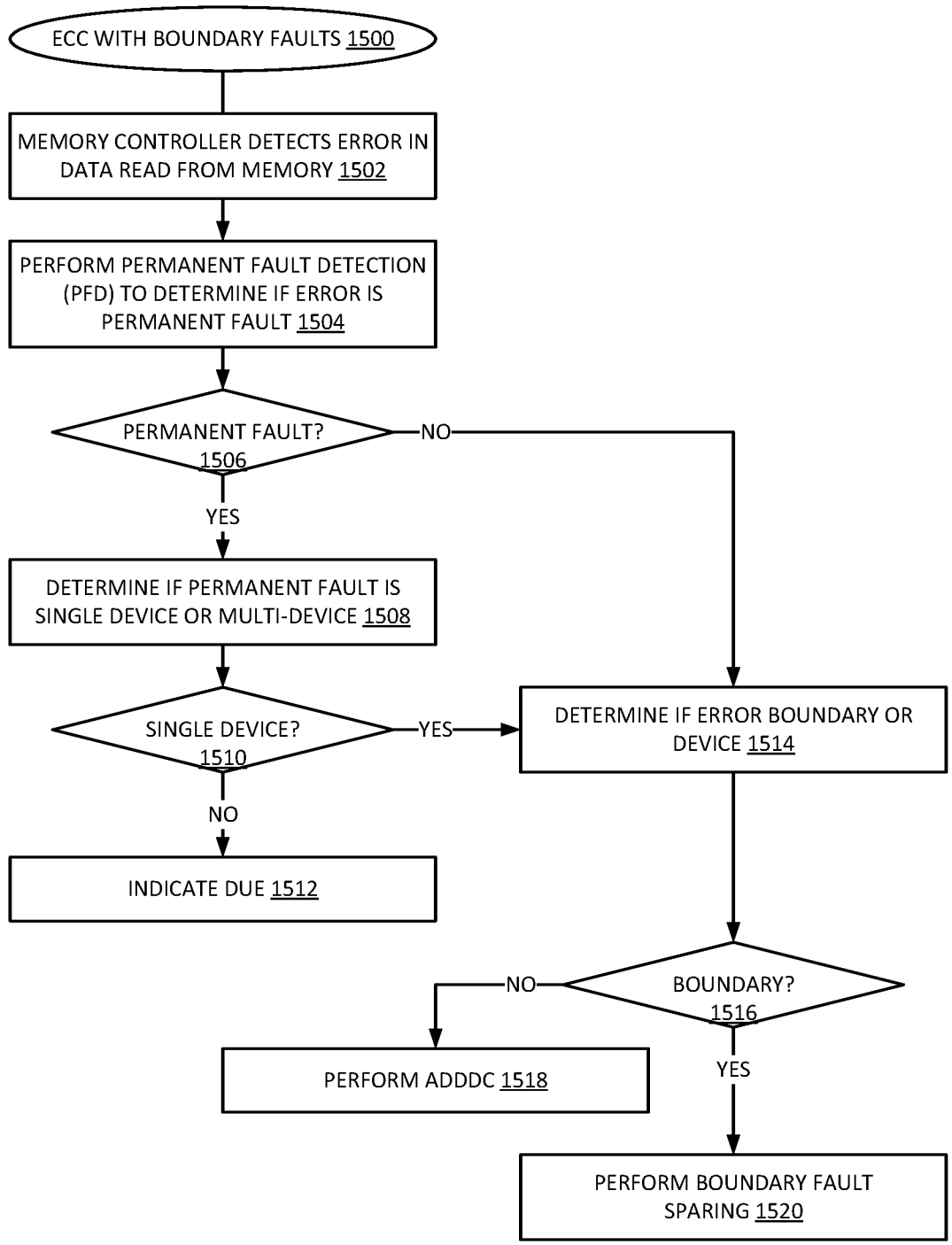
FIG. 15 is a flow diagram of an example of a process for boundary fault sparing.

FIG. 15 is a flow diagram of an example of a process for boundary fault sparing. Process 1500 represents a process for ECC with boundary fault sparing that can be executed by an example of system 1300 or by an example of system 1400.

The memory controller can detect an error in data read from memory, at 1502. In one example, the memory controller triggers the execution of permanent fault detection (PFD) to determine if the error is a permanent fault, at 1504.

In one example, if the error is a permanent fault, at 1506 YES branch, the memory controller determines if the fault is a single device fault or a multi-device fault, at 1508. If the fault is not a single device fault, at 1510 NO branch, the fault is multi-device and in one example, the memory controller indicates a DUE, at 1512.

In one example, if there is no permanent fault, at 1506 NO branch, or if the permanent fault is a single device fault, at 1510 YES branch, in one example, the memory controller determines if the error is a boundary fault or a device fault, at 1514. In DDR5 memory, memory faults are most likely to be limited to a single boundary region. The boundary region could be a 32b block or it could be a 16b block for DDR5. Boundary faults only impact up to 32b failures, which is a type of failure between single bit error (SBE) correctable by SDDC and multibit error (MBE) correctable by ADDDC. If the system directly goes to ADDDC when the system hits a boundary fault, the CPU performance of the system will be degraded.

In one example, the system has an option of boundary fault sparing as an intermediate state between SDDC and ADDDC. If execution of the CPU operations hits a boundary fault as detected by the memory controller error control, the memory controller can trigger boundary fault sparing to spare the first boundary fault. The memory controller can still correct a second boundary fault after boundary fault sparing for a first boundary fault, by application of ADDDC.

Thus, if the fault is not a boundary fault, at 1516 NO branch, in one example, the memory controller triggers the performance of ADDDC, at 1518. In one example, if the fault is a boundary fault, at 1516 YES branch, the memory controller performs boundary fault sparing, at 1520.

Figure 16:
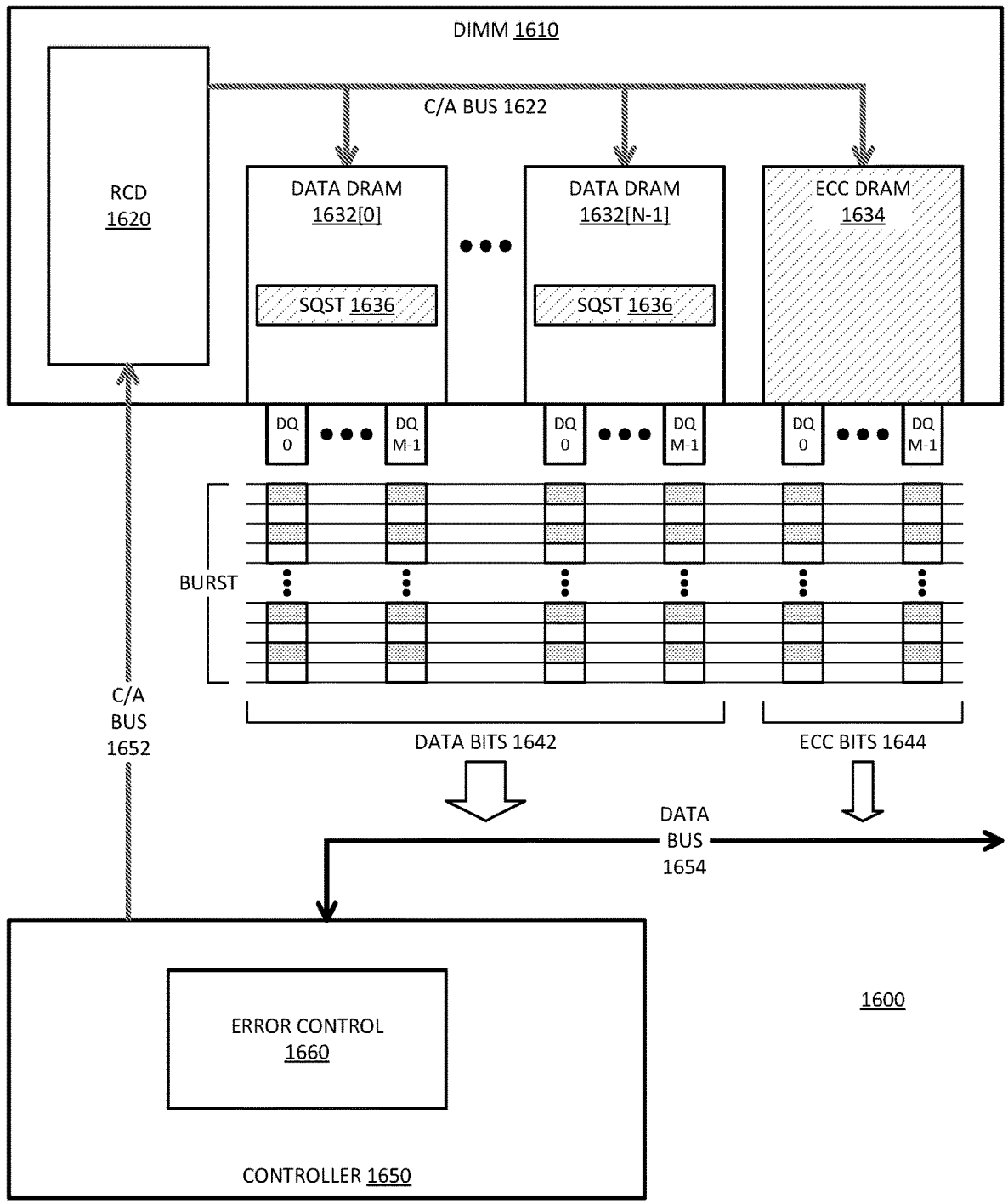
FIG. 16 is a block diagram of an example of a system architecture to implement memory region sequestering for improved RAS.

FIG. 16 is a block diagram of an example of a system architecture to implement memory region sequestering for improved RAS. System 1600 represents a system in accordance with an example of system 100 or an example of system 1100.

System 1600 illustrates one example of DIMM 1610 with RCD 1620 and memory devices. RCD 1620 represents a controller for DIMM 1610. In one example, RCD 1620 receives information from controller 1650 and buffers the signals to the memory devices over C/A bus 1622, which represents the command bus on DIMM 1610 as controlled by RCD 1620. RCD 1620 can control the signals of C/A bus 1652 to memory devices. C/A bus 1622 and C/A bus 1652 are typically unilateral buses or unidirectional buses to carry command and address information from controller 1650 to the memory devices.

The memory devices are represented as data DRAM devices 1632 and ECC DRAM 1634. System 1600 shows only one channel for simplicity, but it will be understood that DIMM 1610 can have multiple channels. DIMM 1610 includes N data DRAM devices, data DRAMs 1632[0:(N−1)], where N can be any integer. In one example, DIMM 1610 one ECC DRAM 1634. More specifically, DIMM 1610 does not include enough ECC DRAMs to provide the RAS coverage desired for an implementation of system 1600.

In one example, a region of data DRAMs 1632 is allocated or sequestered for application of a higher level of ECC protection for DIMM 1610. Sequestered region (SQST) 1636 represents the region that is sequestered within data DRAMs 1632 to provide the additional ECC coverage.

Data bus 1654 represents a bus to exchange data between the memory devices and controller 1650. Data bus 1654 is traditionally a bidirectional, point-to-point bus. For simplicity, system 1600 does not illustrate control signal lines from the memory devices to controller 1650.

Data DRAMs 1632 and ECC DRAM 1634 are illustrated as having a xM interface, with M data bus pins, DQ[0:(M−1)]. M can be any integer and is typically a binary integer such as 4, 8, or 16. Each DQ interface will transmit data bits over a burst length, such as BL16 for a 16 unit interval data exchange. In one example, the data output of the M pads or pins over the burst length will represent a number of bits, such as 32 bits or 64 bits. In one example, the number of bits matches an internal prefetch performed by the memory devices. In one example, the number of bits is half of the internal prefetch. It will be understood that when not all prefetched data is used, all the prefetched data can be placed in the sense amplifier, and then only selected data will be used for the memory access.

Controller 1650 receives the data bits 1642 from data DRAMs 1632 and ECC bits 1644 from ECC DRAM 1634 collectively as input data on data bus 1654. For purposes of error evaluation or ECC, the received codeword on data buses 1654 includes data bits 1642 of the data DRAMs while ECC bits 1644 from ECC DRAM provide for decoding the codeword.

In one example, error control 1660 includes logic to perform one or more ECC functions. While not explicitly shown, error control 1660 includes ECC logic to perform error checking and correction on the codeword. In one example, error control 1660 can dynamically sequester or allocate sequestered region 1636 to provide improved ECC for system 1600. In one example, the sequestered region is configured in a configuration of the memory devices. In one example, the memory devices are not aware of sequestered region 1636 as anything other than another segment or group of addresses within the memory array. Thus, error control 1660 through operation of reads and writes can use the sequestered memory segment for ECC without any specific designation in data DRAMs 1632.

In one example, system 1600 provides ECC through a 2-tiered ECC operation. In one example, the first tier provides detection, and the second tier provides correction capability. In one example, the second tier is accessed only when the first tier detects errors. More specifically, the data stored in ECC DRAM 1634 can be tier one or first tier ECC bits to provide error detection. Controller 1650 can store additional ECC data in sequestered region 1636 to help with error correction. In response to detection of an error, in one example, controller 1650 accesses sequestered region 1636 to retrieve the bits for ECC correction.

It will be understood that with a single ECC DRAM 1634, DIMM 1610 does not have sufficient ECC bits to perform single data device correction. For example, SDDC is not possible in all cases for 5×8 or 9×4 configurations. A 5×8 configuration refers to a memory module having 5 devices with x8 data interfaces. A 9×4 configuration refers to a memory module having 9 devices with x4 interfaces. Traditionally, each configuration would need an additional device for ECC bits to provide SDDC (i.e., 6×8 or 10×4). Adding another memory chip adds cost.

In one example, dynamically sequestering data can provide sufficient ECC bits for a system configuration that does not have enough data devices to provide the ECC bits for SDDC. Such a case can be where the DIMM is designed with fewer devices that needed to provide the full SDDC implementation. In one example, sequestering memory for ECC can be performed dynamically as an error handling strategy for a system experiencing device failure. For example, consider a system that is designed with sufficient ECC devices for SDDC. If that system then has a device failure, in one example, the system can offline the failed device, sequester a data region on the remaining devices, and implement two-tiered ECC to provide SDDC. The use of sequestered region 1636 has a performance impact that is lower compared to virtual lockstep mode. Thus, sequestered memory can support a 100% SDDC implementation for DDR5 5×8 modules, 9×4 modules, or modules experiencing failure to resemble a 5×8 module or a 9×4 module.

In one example, error control 1660 implements sequestered memory ECC. In one example, tier 1 ECC data or tier 1 data is stored in ECC DRAM 1634 in parallel with the data write to data DRAMs 1632. Thus, tier 1 data can be appended with the data as traditionally done with ECC data. Error control 1660 can also compute tier 2 ECC data or tier 2 data to store in another memory location (sequestered region 1636). In one example, the tier 1 bits are a sub-matrix of the full matrix represented by the total bits of tier 1 bits and tier 2 bits. Thus, the full matrix can be the tier 1 bits appended to the tier 2 bits, and the tier 1 bits are a sub-matrix of the full matrix.

In one example, error control 1660 does not access the memory in sequestered region 1636 for ECC detection, and only accesses the data in response to detection of an error that needs to be corrected. Thus, ECC detection can occur just from the ECC bits in ECC DRAM 1634, while ECC correction utilizes the bits in ECC DRAM 1634 and the ECC bits in sequestered region 1636.

In one example, error control 1660 needs to update sequestered region 1636 for every write, to update the ECC. Thus, a write operation can result in additional overhead to achieve the increased ECC with sequestered memory. The write of the tier 1 ECC bits has no overhead because it occurs with the data. To update the tier 2 ECC bits, controller 1650 reads the memory line with the tier 2 ECC bits (sequestered region 1636), updates the tier 2 ECC bits, and writes the cacheline back to data DRAM 1632. Thus, a write operation will result in one read and two writes. In one example, system 1600 includes a cache to cache the tier 2 ECC bits, which can reduce the frequency of tier 2 writes.

Figure 17:
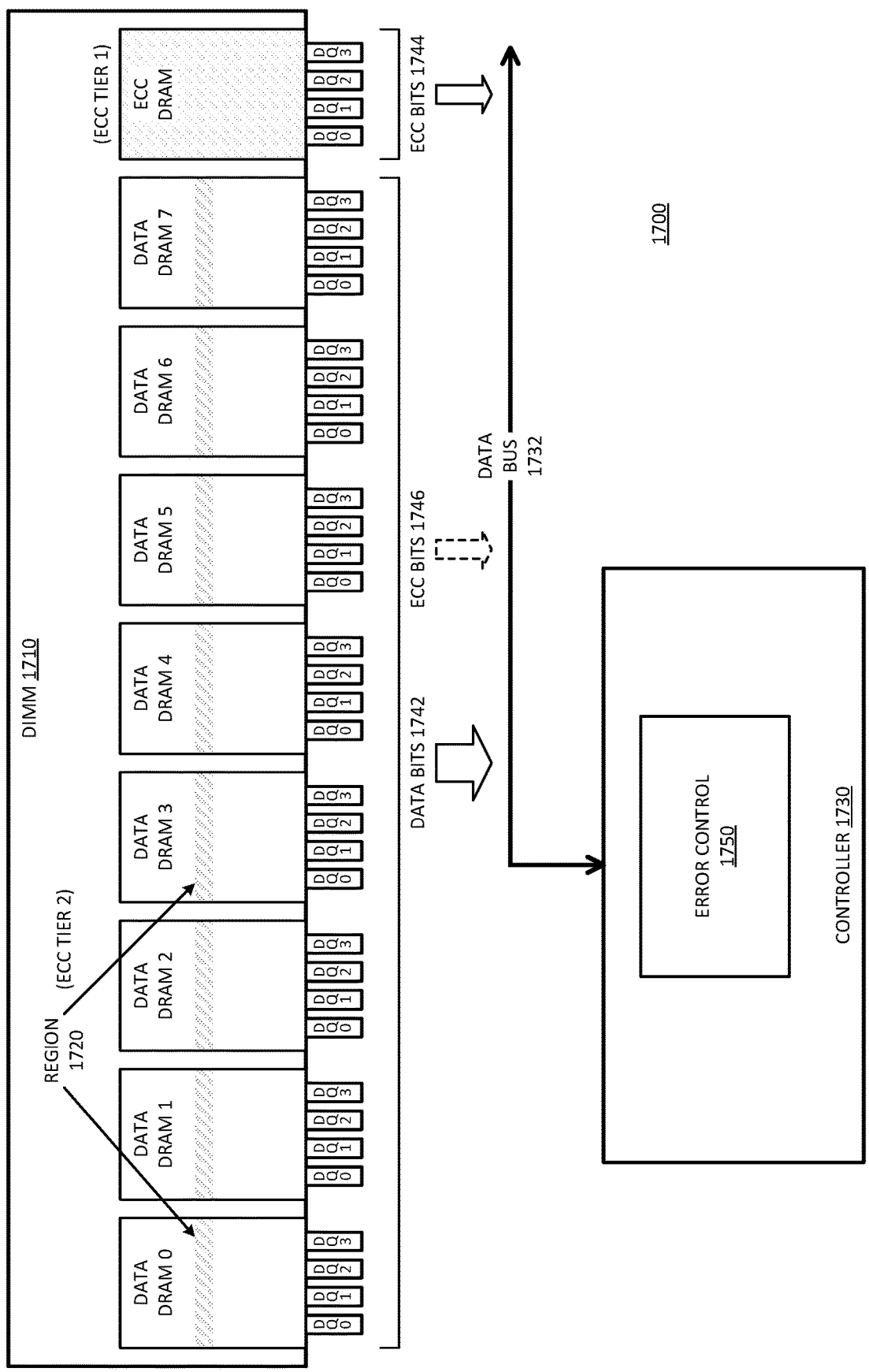
FIG. 17 is a block diagram of an example of a system architecture for sequestered memory with a 9×4 memory module.

FIG. 17 is a block diagram of an example of a system architecture for sequestered memory with a 9×4 memory module. System 1700 represents a system in accordance with an example of system 100 or an example of system 1600.

DIMM 1710 specifically illustrates a configuration of a 9×4 implementation, with 8 data DRAMs, DRAM[0:7] and one ECC DRAM. DRAM[0:7] and the ECC DRAM have ×4 interface, with DQ[0:3]. System 1700 shows only one channel for simplicity, but it will be understood that DIMM 1710 can have multiple channels. In one example, region 1720 of DRAM[0:7] is illustrated by the shaded area to represent the sequestered region or the region allocated for ECC data within the data DRAMs.

Sequestering region 1720 sacrifices some data area in the data DRAMs to achieve higher RAS. The increased overhead with the sequestered memory (e.g., extra writes) is a performance sacrifice for increased RAS.

Data bits 1742 represent the data bits from DRAM[0:7] to controller 1730 over data bus 1732. ECC bits 1744 represent the ECC bits from the ECC DRAM to controller 1730 over data bus 1732. In response to detection of an error, DRAM [0:7] will provide ECC bits 1746 over data bus 1732.

In one example, system 1700 provides ECC through a 2-tiered ECC operation. For DIMM 1710 with ×4 DRAMs, data bits 1742 include 512b and tier 1 ECC bits 1744 include 64b. In one example, sequestered memory ECC implements the 2-tiered ECC with the tier 1 ECC H-matrix as a sub-matrix of the combined tier 1+tier 2 H-matrix. Applying the tier 1 H-matrix as a sub-matrix of the H-matrix for the combined tier 1 and tier 2 bits ensures the layered detection and correction will provide the desired ECC protection.

In one example, computation of ECC encoding with data bits 1742 and tier 1 ECC bits 1744 generates codeword 1. In one example, computation of ECC with data bits 1742, tier 1 ECC bits 1744, and tier 2 ECC bits 1746 generates codeword 2. Codeword 1 can be a subset of codeword 2 by appending 1 zero element in codeword 1. In one example, the ECC is a shortened Reed-Solomon code to achieve the requirement.

In one example, the first tier provides detection, and the second tier provides correction capability. In one example, the second tier is accessed only when the first tier detects errors. For a single read command, controller 1730 can read data bits 1742 and ECC bits 1744 (the tier 1 bits) together. The 64 tier 1 bits (4 DQ times BL16) can provide 100% detection for a single ×4 device failure. Error control 1750 of controller 1730 can use data bits 1742 and ECC bits 1744 to go through the decoding function with the H-matrix to generate an ECC syndrome of the tier 1 bits.

In one example, if the ECC syndrome of tier 1 is zero, the ECC of error control 1750 declares data bits 1742 to be error free. If the syndrome is not zero, error control 1750 declares that an error is detected. In one example, region 1720 collectively stores an additional 64 ECC bits 1746. In response to detection of the error, controller 1730 can read the tier 2 bits to provide ECC bits 1744 and ECC bits 1746, for a total of 128 bits of ECC, which can provide 100% correction for a single device failure.

In one example, ECC logic of error control 1750 uses data bits 1742, tier 1 ECC bits 1744, and tier 2 ECC bits 1746 to perform the decoding function with the H-matrix to generate an ECC syndrome of tier 1 and tier 2. In one example, with tier 1 and tier 2, the ECC operation will directly go to correction. ECC first identifies the error location. If the ECC is unable to identify the error location, ECC can report a detectable but uncorrectable error (DUE). The DUE comes from a double device error. For a single device error, there are no cases for DUE.

Figure 18:
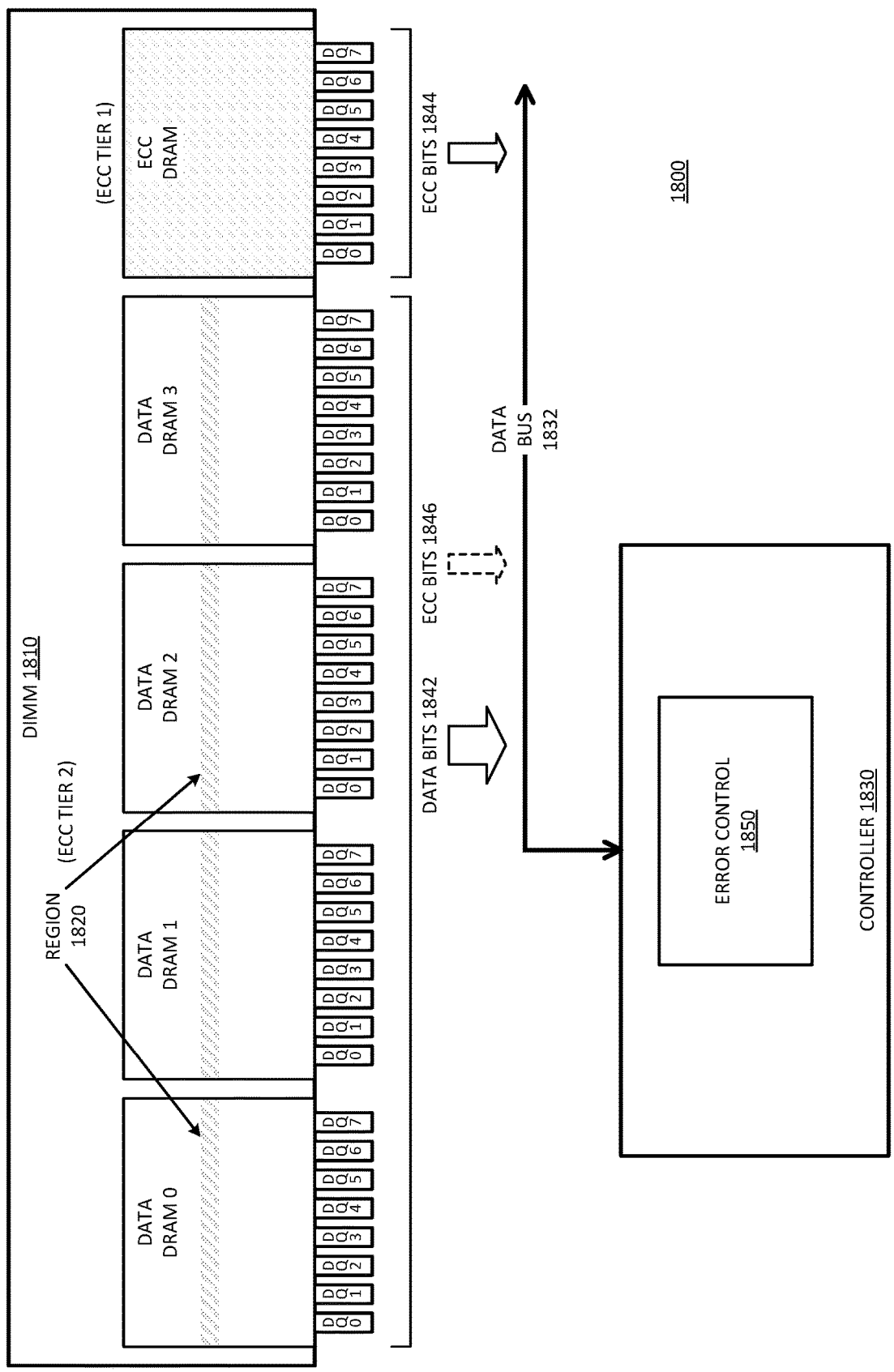
FIG. 18 is a block diagram of an example of a system architecture for sequestered memory with a 5×8 memory module.

FIG. 18 is a block diagram of an example of a system architecture for sequestered memory with a 5×8 memory module. System 1800 represents a system in accordance with an example of system 100 or an example of system 1600.

DIMM 1810 specifically illustrates a configuration of a 5×8 implementation, with 4 data DRAMs, DRAM[0:3] and one ECC DRAM. DRAM[0:3] and the ECC DRAM have ×8 interfaces, with DQ[0:7]. System 1800 shows only one channel for simplicity, but it will be understood that DIMM 1810 can have multiple channels. In one example, region 1820 of DRAM[0:3] is illustrated by the shaded area to represent the sequestered region or the region allocated for ECC data within the data DRAMs.

Sequestering region 1820 sacrifices some data area in the data DRAMs to achieve higher RAS. The increased overhead with the sequestered memory (e.g., extra writes) is a performance sacrifice for increased RAS.

Data bits 1842 represent the data bits from DRAM[0:3] to controller 1830 over data bus 1832. ECC bits 1844 represent the ECC bits from the ECC DRAM to controller 1830 over data bus 1832. In response to detection of an error, DRAM [0:3] will provide ECC bits 1846 over data bus 1832.

In one example, system 1800 provides ECC through a 2-tiered ECC operation. For DIMM 1810 with ×8 DRAMs, data bits 1842 include 512b and tier 1 ECC bits 1844 include 128b. In one example, sequestered memory ECC implements the 2-tiered ECC with the tier 1 ECC H-matrix as a sub-matrix of the combined tier 1+tier 2 H-matrix. Applying the tier 1 H-matrix as a sub-matrix of the H-matrix for the combined tier 1 and tier 2 bits ensures the layered detection and correction will provide the desired ECC protection.

In one example, computation of ECC encoding with data bits 1842 and tier 1 ECC bits 1844 generates codeword 1. In one example, computation of ECC with data bits 1842, tier 1 ECC bits 1844, and tier 2 ECC bits 1846 generates codeword 2. Codeword 1 can be a subset of codeword 2 by appending 1 zero element in codeword 1. In one example, the ECC is a shortened Reed-Solomon code to achieve the requirement.

In one example, the first tier provides detection, and the second tier provides correction capability. In one example, the second tier is accessed only when the first tier detects errors. For a single read command, controller 1830 can read data bits 1842 and ECC bits 1844 (the tier 1 bits) together. The 128 tier 1 bits (8 DQ times BL16) can provide 100% detection for a single ×8 device failure. Error control 1850 of controller 1830 can use data bits 1842 and ECC bits 1844 to go through the decoding function with the H-matrix to generate an ECC syndrome of the tier 1 bits.

In one example, if the ECC syndrome of tier 1 is zero, the ECC of error control 1850 declares data bits 1842 to be error free. If the syndrome is not zero, error control 1850 declares that an error is detected. In one example, region 1820 collectively stores an additional 128 ECC bits 1846. In response to detection of the error, controller 1830 can read the tier 2 bits to provide ECC bits 1844 and ECC bits 1846, for a total of 256 bits of ECC, which can provide 100% correction for a single device failure.

In one example, ECC logic of error control 1850 uses data bits 1842, tier 1 ECC bits 1844, and tier 2 ECC bits 1846 to perform the decoding function with the H-matrix to generate an ECC syndrome of tier 1 and tier 2. In one example, with tier 1 and tier 2, the ECC operation will directly go to correction. ECC first identifies the error location. If the ECC is unable to identify the error location, ECC can report a detectable but uncorrectable error (DUE). The DUE comes from a double device error. For a single device error, there are no cases for DUE.

Figure 19:
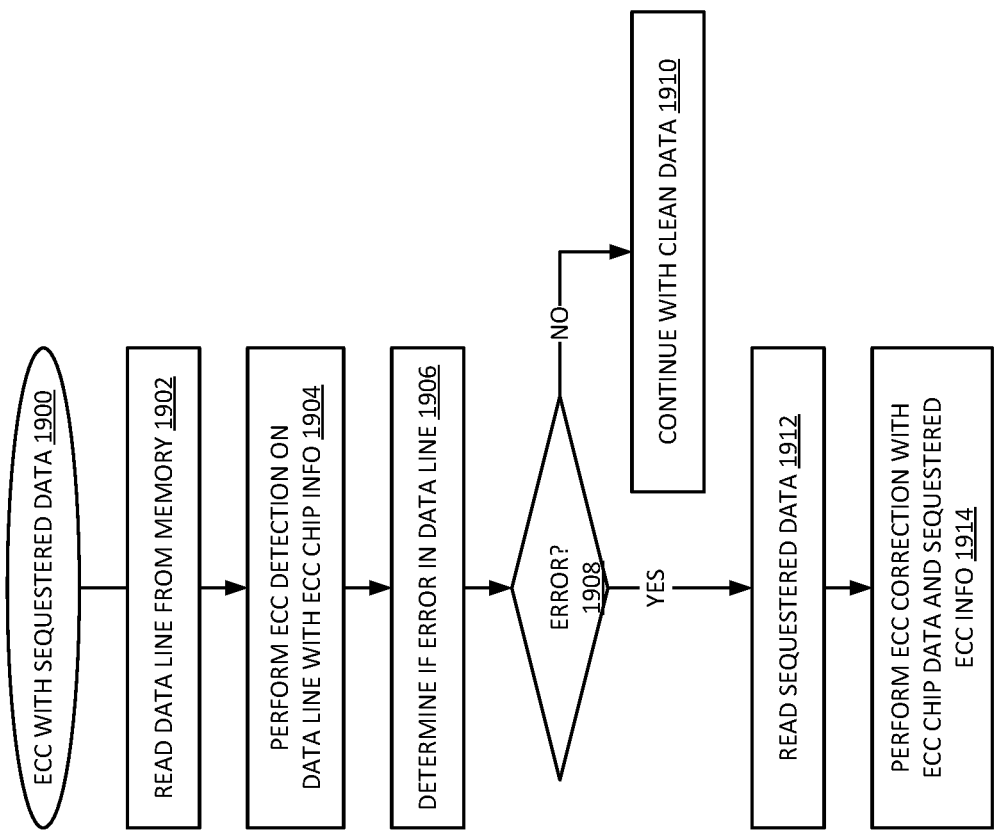
FIG. 19 is a flow diagram of an example of a process for implementing ECC with sequestered memory.

FIG. 19 is a flow diagram of an example of a process for implementing ECC with sequestered memory. Process 1900 represents a process for ECC with sequestered data that can be executed by an example of system 1700 or an example of system 1800.

The memory controller can read a data line from memory, at 1902. In one example, the memory controller performs ECC detection on the data line with ECC information from a dedicated ECC chip or ECC memory device, at 1904. The memory controller can determine if there is an error in the data line based on the ECC detection, at 1906.

If there is no error in the data, at 1908 NO branch, in one example, the system continues with its operations based on clear data from the data line, at 1910. If there is an error in the data, at 1909 YES branch, in one example, the memory controller reads the sequestered data from the data devices, at 1912. In one example, the memory controller performs error detection and correction with the ECC data from the ECC chip and the sequestered data, at 1914.

Figure 20:
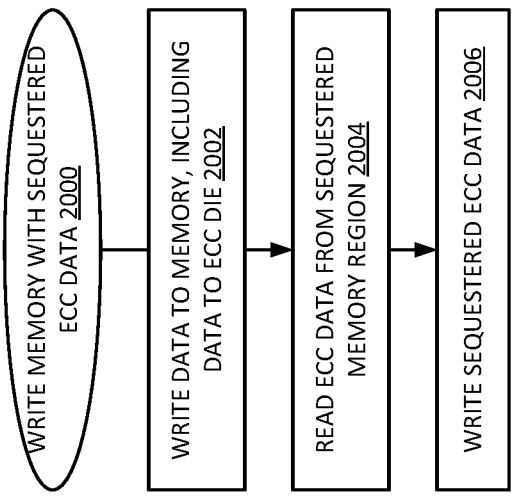
FIG. 20 is a flow diagram of an example of a process for writes in a system with sequestered memory.

FIG. 20 is a flow diagram of an example of a process for writes in a system with sequestered memory. Process 2000 represents a process for writing memory in a system with sequestered ECC data that can be executed by an example of system 1700 or an example of system 1800.

The memory controller writes data to the memory, including data for the data devices and ECC data to the ECC die or ECC device, at 2002. In one example, the memory controller then reads ECC data from the sequestered memory region, at 2004. The memory controller updates the ECC information and then writes the sequestered ECC data back to the sequestered region of the data devices, at 2006.

Figure 21:
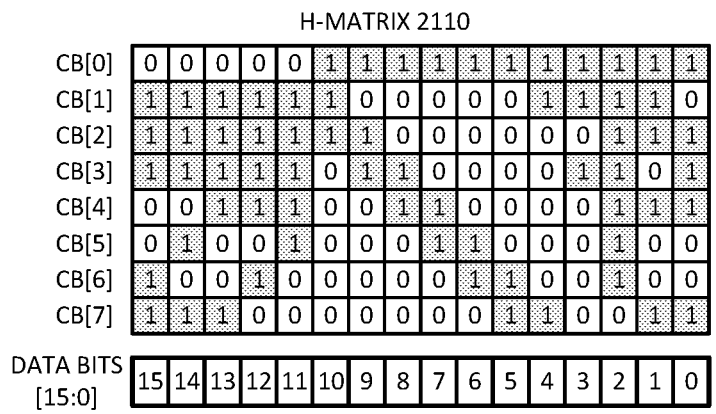
FIG. 21 is a block diagram of an example of check bit generation logic and syndrome bit generation logic to apply a matrix to perform checking and correction.
Figure 21:
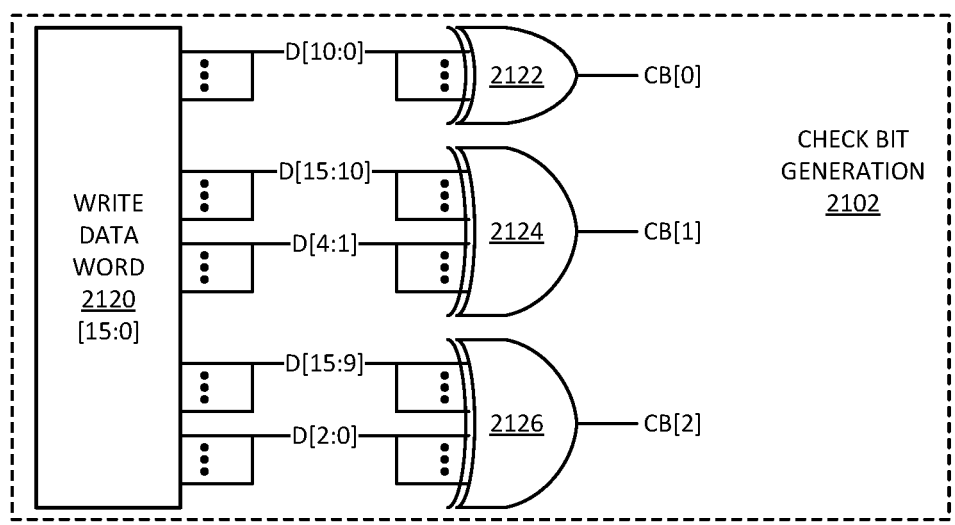
Figure 21:
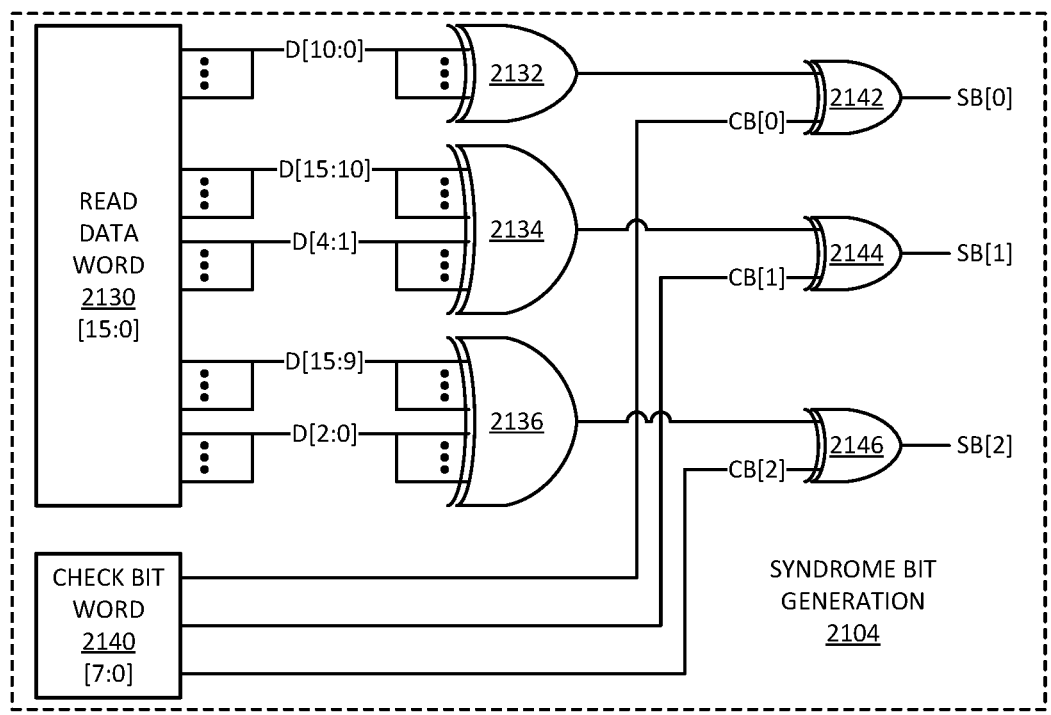

FIG. 21 is a block diagram of an example of check bit generation logic and syndrome bit generation logic to apply a matrix to perform checking and correction. H matrix 2110 represents an example of 16 bits of a code matrix for use with on-device ECC. It will be understood that a typical operational code word in modern computing systems includes more than 16 bits. However, the 16-bit H-matrix illustrates principles of ECC operation for either on-die ECC to be used in on-memory error checking and correction in accordance with any example herein or for system level ECC by the memory controller or error control in accordance with any example herein.

Matrix 2110 can be part of an SEC Hamming code, such as a hamming code for a 128-bit code word. Matrix 2110 illustrates only 16 codes, one code bit for each data bit [15:0]. In one example, every code of matrix 2110 corresponds to one data bit. In the example illustrated, each code includes 8 check bits CB[0:7]. When a syndrome is computed from the data word and check bits stored in the memory, the ECC engine can determine if the syndrome corresponds to one of the codes in matrix 2110. If the ECC engine determines a syndrome matches with one of the codes, the ECC engine toggles the corresponding data bit to correct an error. Examples of check bit generation and syndrome bit generation are illustrated.

Check bit generation logic 2102 represents logic to perform ECC operations to generate check bits. Syndrome bit generation logic 2104 represents logic to perform ECC operations to generate syndrome bits to compare against the check bit. For purposes of illustration in the drawing, only logic related to check bits CB[0:2] are illustrated, and correspondingly, only syndrome bits SB[0:2] are illustrated.

As illustrated, the syndrome can be completely encoded in the ECC logic for the check bit generation and syndrome bit generation. In one example, check bit generation 2102 includes XOR gates to receive write data word 2120 and perform XOR operations for the one-bits of the code. For example, generation of CB[0] with respect to the 16 code word bits illustrated, bits D[10:0] are all ones, whereas bits D[15:11] are zeros. Thus, in one example, computation of CB[0] includes the XOR operation with XOR 2122 of bits D[10:0] of the code word. Similarly, generation of the syndrome bit SB[0] includes logic to receive read data word 2130 and perform XOR operation with XOR 2132 of bits D[10:0] of the read data code word. The output of XOR 2132 is then XORed with XOR 2142 with CB[0] to generate SB[0].

It will be understood that as a technical matter, a true XOR operation can only exist for two inputs, where an output is one if and only if only one of the inputs is one. However, it is common convention to represent a cascade of XOR operations as a multi-input XOR (meaning a number of inputs greater than 2), such as XOR 2122 for CB[0] and XOR 2132 for SB[0]. The XOR operation has a commutative property, and the XORing of multiple pairs of inputs, and then the series XORing of the outputs of those operations can be interchanged in any order with the same result. Thus, the XOR operations have the practical effect of modulo 2 addition, which is also equivalent to odd parity detection. Odd parity detection provides a '1' as the output when there is an odd number of ones among the inputs, and an output zero when there is an even number of ones among the inputs.

In another example, generation of CB[1] with respect to the 16 code word bits illustrated, bits D[15:10] and D[4:1] are ones, and bits D[9:5] and D[0] are zeros. XOR 2124 computes CB[1] from the one bits. Similarly, for the generation of CB[2], bits D[15:9] and D[2:0] are ones, and bits D[8:3] are zeros. XOR 2126 computes CB[2] from the one bits.

Syndrome bit generation 2104 represents logic to receive read data word 2130 and check bit word 2140, and generate the syndrome bits by comparison of the CB computation with the stored check bits. Similarly, syndrome bit generation of SB[1] with respect to the 16 code word bits illustrated, XOR 2134 computes an XOR of D[15:10] and D[4:1], and then XOR 2144 computes SB[1] by XOR of CB[1] with the output of XOR 2134. Similarly, syndrome bit generation of SB[2] with respect to the 16 code word bits illustrated, XOR 2136 computes an XOR of D[15:9] and D[2:0], and then XOR 2146 computes SB[2] by XOR of CB[2] with the output of XOR 2136.

Based on the determination of the check bits and syndrome bits, the system can identify errors and potentially flip bits, e.g., for a bit or column of CB[7:0] found to match with the syndrome bits. The ECS system applies such techniques to perform scrubbing on memory addresses. In one example, a system applied the error detection of the ECC to detect memory errors and provide error information to the memory controller to allow the memory controller to detect error patterns and adjust the error scrub operations in accordance with any example herein.

Figure 22:
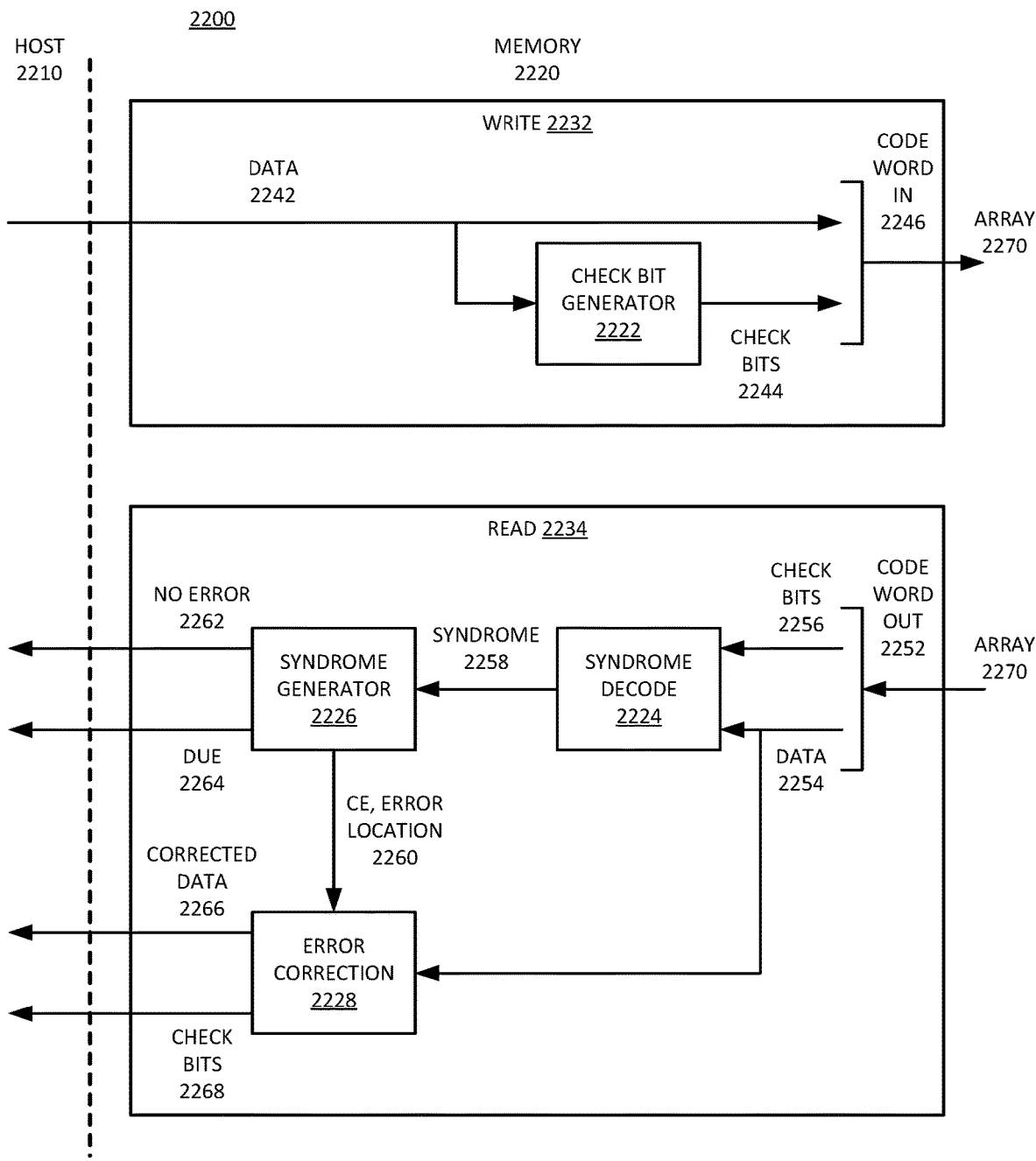
FIG. 22 is a block diagram of an example of on-die error checking and correction.

FIG. 22 is a block diagram of an example of on-die error checking and correction. System 2200 provides an example of on-die ECC circuitry for a system in accordance with any example of on-die ECC herein. Host 2210 includes a memory controller or equivalent or alternative logic or circuit or component that manages access to memory 2220. Host 2210 performs external ECC on data read from memory 2220. Memory 2220 implements on-die ECC to check and correct data prior to sending the data to host 2210.

System 2200 illustrates write path 2232 in memory 2220, which represents a path for data written from host 2210 to memory 2220. Host 2210 provides data 2242 to memory 2220 for writing to memory array(s) 2270. In one example, memory 2220 generates check bits 2244 with check bit generator 2222 to store with the data in memory. Check bits 2244 can be referred to as ECC bits, and enable memory 2220 to correct an error that might occur in the writing to and reading from memory array(s) 2270. Data 2242 and check bits 2244 can be included as code word in 2246, which is written to the memory resources.

Read path 2234 represents a path for data read from memory 2220 to host 2210. In one example, at least certain hardware components of write path 2232 and read path 2234 are the same hardware. In one example, memory 2220 fetches code word out 2252 in response to a Read command from host 2210. The code word can include data 2254 and check bits 2256. Data 2254 and check bits 2256 can correspond, respectively, to data 2242 and check bits 2244 written in write path 2232. Thus, a read can access data and ECC bits. It will be understood that error correction in read path 2234 can include the application of an XOR (exclusive OR) tree to a corresponding H matrix to detect errors and selectively correct errors (in the case of a single bit error). As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one example, memory 2220 includes syndrome decode 2224, which enables the memory to apply check bits 2256 to data 2254 to detect errors in the read data. Syndrome decode 2224 can generate syndrome 2258 for use in generating appropriate error information for the read data. Data 2254 can also be forwarded to error correction 2228 for correction of a detected error.

In one example, syndrome decode 2224 passes syndrome 2258 to syndrome generator 2226 to generate an error vector. In one example, check bit generator 2222 and syndrome generator 2226 are fully specified by a corresponding H matrix for the memory device. In one example, if there are no errors in the read data (e.g., zero syndrome 2258), syndrome generator 2226 generates a no error signal 2262. In one example, if there are multiple errors in the read data (e.g., non-zero syndrome 2258 that does not match any of the columns in a corresponding H matrix), syndrome generator 2226 generates a DUE (detected uncorrected error) signal 2264, which indicates a detected, uncorrected error. DUE signal 2264 can indicate a multibit error that memory 2220 was not able to correct by internal ECC.

In one example, if there is a single bit error (e.g., non-zero syndrome 2258 that matches one of the columns of a corresponding H matrix), syndrome generator 2226 can generate a CE (corrected error) signal with error location 2260, which is a corrected error indication to error correction logic 2228. Error correction 2228 can apply the corrected error to the specified location in data 2254 to generate corrected data 2266 for output to host 2210. In one example, error correction 2228 also generates check bits 2268, which includes the check bits for the read data.

Check bits 2268 can be considered an error vector that indicates a state of errors in the read data transmitted to host 2210. It will be understood that zero syndrome (no error 2262) condition and a corrected SBE resulting in corrected data 2266 will have the same check bits 2268, indicating no error to host 2210. Thus, check bits 2268 will not provide information about SBE in memory 2220, but only multibit errors. In one example, system 2200 writes corrected data back to the memory array.

In one example, system 2200 includes an internal ECC write path 2232 and internal ECC read path 2234 for each portion of an array. In one example, memory device 2220 can include one path for half of its I/O pins and a second path for the other half of its I/O pins. Thus, memory 2220 can perform ECC isolation with hardware resources to separate the application of ECC to separate sub-portions of the overall data to be provided by the memory device.

Figure 23:
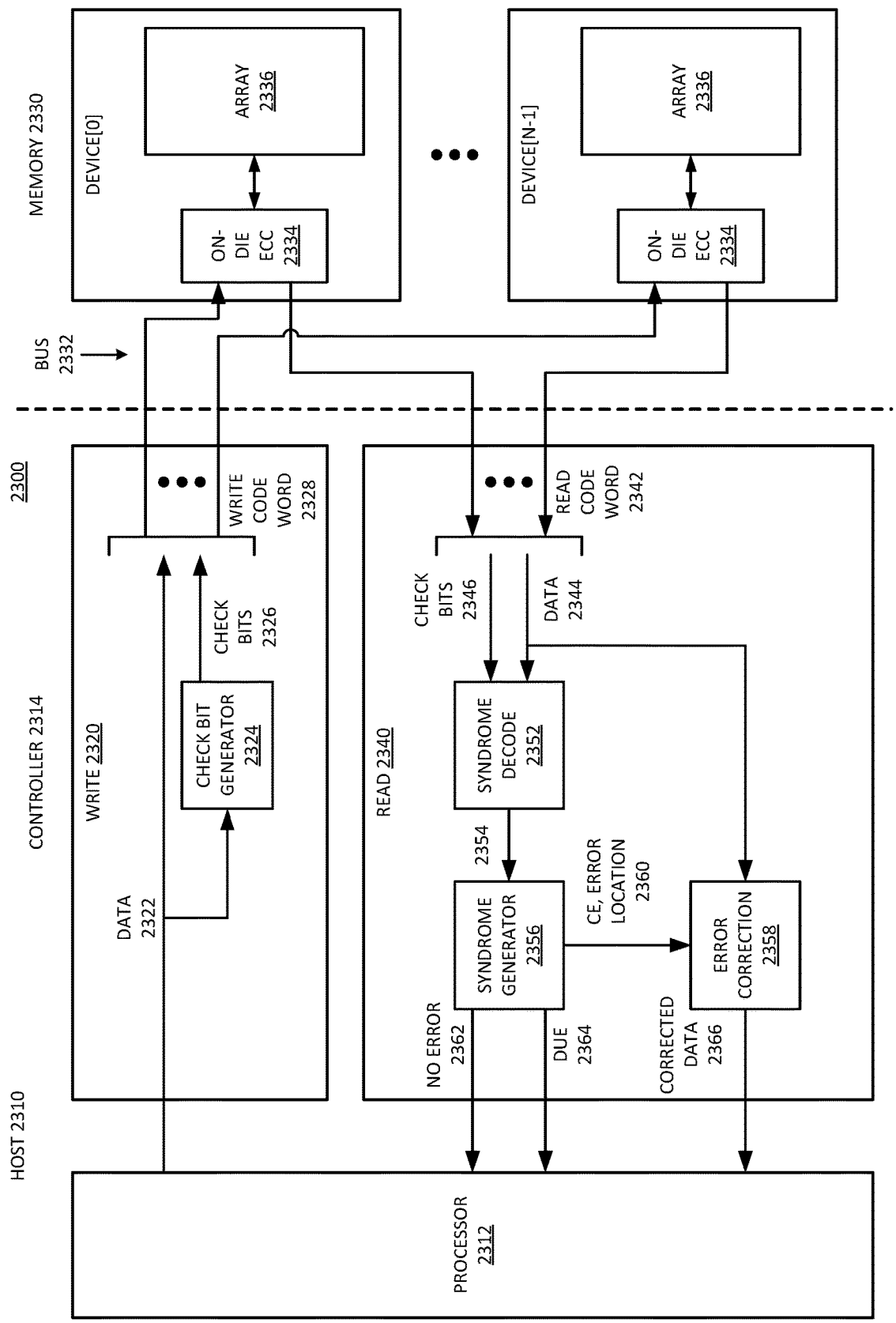
FIG. 23 is a block diagram of an example of system level error checking and correction.

FIG. 23 is a block diagram of an example of system level error checking and correction. System 2300 provides an example of system level ECC circuitry for a system in accordance with any example of host side or memory controller ECC herein. Host 2310 includes controller 2314 or equivalent or alternative logic or circuit or component that manages access to memory 2330. Controller 2314 performs external ECC on data read from memory 2330. In one example, memory 2330 implements on-die ECC 2334 to check and correct data from array 2336 prior to sending the data over bus 2332 to host 2310.

Host 2310 includes processor 2312 to execute operations that will generate requests for data stored in array 2336 of memory 2330. In response to a request to write data, controller 2314 can generate a write command through write path 2320. For a read request, controller 2314 receives read data through read path 2340.

Write path 2320 represents a path for data written from processor 2312 to memory 2330. Processor 2312 provides data 2322 for writing to memory 2330. In one example, controller 2314 generates check bits 2326 with check bit generator 2324 to store with the data in memory. Check bits 2326 can be referred to as ECC bits, and enable error correction for an error that might occur in the writing to and reading from the memory array(s). Data 2322 and check bits 2326 can be included as code word in 2328, which is written to memory 2330, over data bus 2332 into array 2336.

Read path 2340 represents a path for data read from memory 2330 to host 2310. In one example, at least certain hardware components of write path 2320 and read path 2340 are the same hardware. In one example, memory 2330 fetches the data in response to a Read command from host 2310. Read code word 2342 represents the data and check bits that were stored in array 2336. Data 2344 and check bits 2346 represent the data and check bits of read code word 2342. Read code word 2342 represents a codeword made up of data from Device[0:(N−1)]. In one example, these correspond, respectively, to data 2322 and check bits 2326 written in write path 2320 to the same address of the read command.

Read path 2340 includes syndrome decode 2352 to apply H matrix computations on data 2344 and check bits 2346 to detect errors in the read data. Syndrome decode 2352 can generate syndrome 2354 for use in generating appropriate error information for the read data. Data 2344 can also be forwarded to error correction 2328 for correction of a detected error.

In one example, syndrome decode 2352 passes syndrome 2354 to syndrome generator 2356 to generate an error vector. In one example, check bit generator 2324 and syndrome generator 2356 are fully specified by a corresponding H matrix. In one example, if there are no errors in the read data (e.g., zero syndrome 2354), syndrome generator 2356 generates a no error signal 2362. In one example, if there are multiple errors in the read data (e.g., non-zero syndrome 2354 that does not match any of the columns in a corresponding H matrix), syndrome generator 2356 generates a DUE (detected uncorrected error) signal 2364. DUE signal 2364 can indicate a multibit error that was not able to be corrected by the application of ECC.

In one example, if there is a single bit error (e.g., non-zero syndrome 2354 that matches one of the columns of a corresponding H matrix), syndrome generator 2356 can generate a CE (corrected error) signal with error location 2360, which is a corrected error indication to error correction logic 2358. Error correction 2358 can apply the corrected error to the specified location in data 2344 to generate corrected data 2366 for output to provide to processor 2312.

Figure 24:
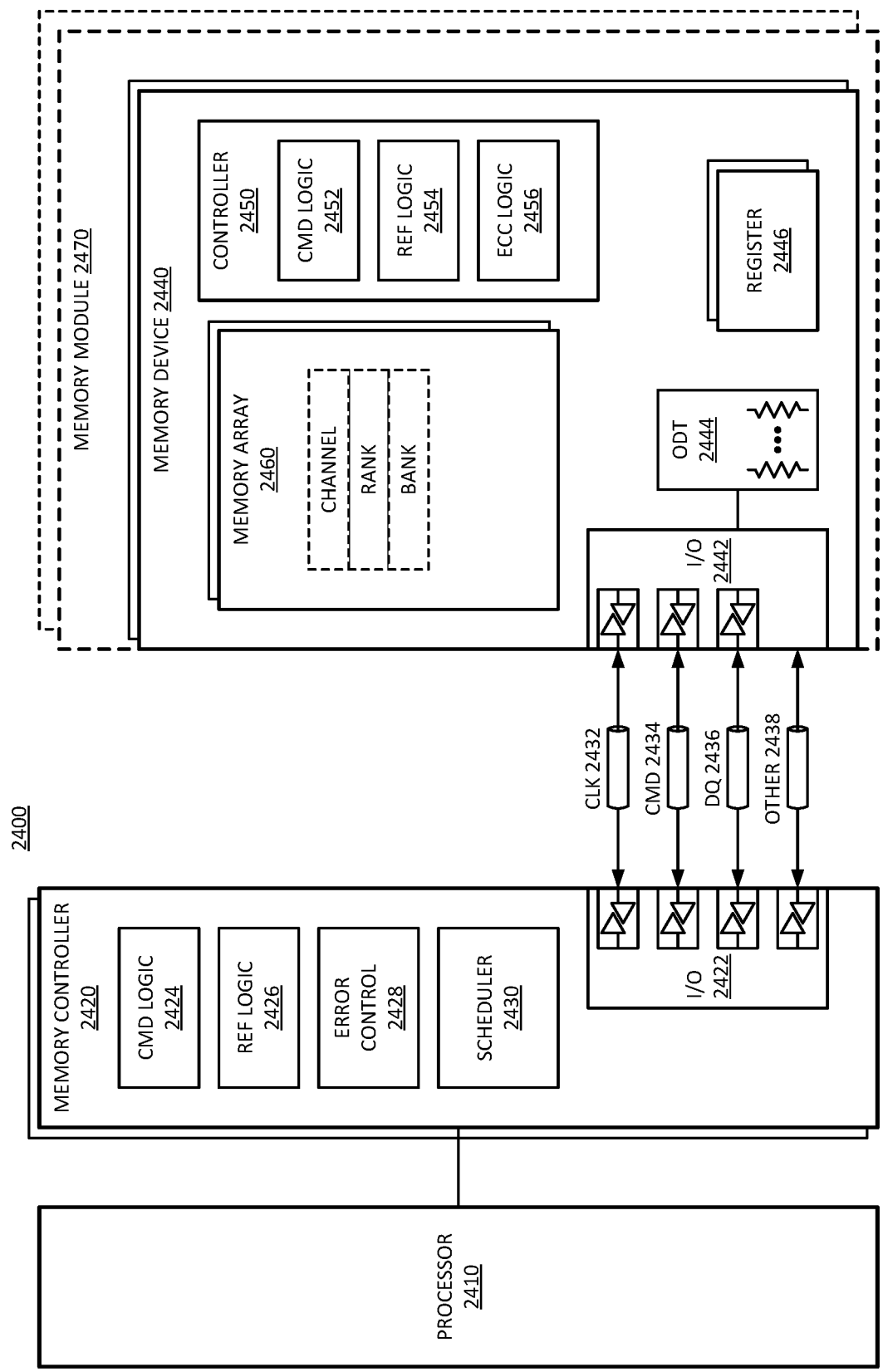
FIG. 24 is a block diagram of an example of a memory subsystem in which adaptive checking and correction can be implemented.

FIG. 24 is a block diagram of an example of a memory subsystem in which adaptive checking and correction can be implemented. System 2400 includes a processor and elements of a memory subsystem in a computing device.

In one example, controller 2450 of memory device 2440 includes ECC logic 2456. ECC logic 2456 represents on-die ECC for memory device 2440, to enable error checking and correction in the memory. In one example, memory controller 2420 includes error control 2428, which represents logic within memory controller 2420 to enable determinations about errors in data from memory in accordance with any example herein. In one example, error control 2428 can perform ECC in accordance with any description herein. In one example, error control 2428 performs adaptive sparing, whether for banks, for portions of a data device, or ECC based on multiple tiers of ECC data. In one example, error control 2428 includes a PFD engine to provide permanent fault detection, and error control 2428 can perform ECC based on the permanent faults.

Processor 2410 represents a processing unit of a computing platform that may execute an operating system (OS) and applications, which can collectively be referred to as the host or the user of the memory. The OS and applications execute operations that result in memory accesses. Processor 2410 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 2400 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR flash technologies. A memory device can also include a future generation nonvolatile device, such as a three dimensional crosspoint (3DXP) memory device. 3DXP can operate as a byte addressable nonvolatile memory device or as a block addressable nonvolatile memory device. A memory device can include a nonvolatile, byte addressable media or block addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random-access memory (FeTRAM), magnetoresistive random-access memory (MRAM) memory that incorporates memristor technology, or spin transfer torque (STT)-MRAM, or a combination of any of the above, or other memory.

Memory controller 2420 represents one or more memory controller circuits or devices for system 2400. Memory controller 2420 represents control logic that generates memory access commands in response to the execution of operations by processor 2410. Memory controller 2420 accesses one or more memory devices 2440. Memory devices 2440 can be DRAM devices in accordance with any referred to above. In one example, memory devices 2440 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 2420 manages a separate memory channel, although system 2400 can be configured to have multiple channels managed by a single controller, or to have multiple controllers on a single channel. In one example, memory controller 2420 is part of host processor 2410, such as logic implemented on the same die or implemented in the same package space as the processor.

Memory controller 2420 includes I/O interface logic 2422 to couple to a memory bus, such as a memory channel as referred to above. I/O interface logic 2422 (as well as I/O interface logic 2442 of memory device 2440) can include pins, pads, connectors, signal lines, traces, or wires, or other hardware to connect the devices, or a combination of these. I/O interface logic 2422 can include a hardware interface. As illustrated, I/O interface logic 2422 includes at least drivers/transceivers for signal lines. Commonly, wires within an integrated circuit interface couple with a pad, pin, or connector to interface signal lines or traces or other wires between devices. I/O interface logic 2422 can include drivers, receivers, transceivers, or termination, or other circuitry or combinations of circuitry to exchange signals on the signal lines between the devices. The exchange of signals includes at least one of transmit or receive. While shown as coupling I/O 2422 from memory controller 2420 to I/O 2442 of memory device 2440, it will be understood that in an implementation of system 2400 where groups of memory devices 2440 are accessed in parallel, multiple memory devices can include I/O interfaces to the same interface of memory controller 2420. In an implementation of system 2400 including one or more memory modules 2470, I/O 2442 can include interface hardware of the memory module in addition to interface hardware on the memory device itself. Other memory controllers 2420 will include separate interfaces to other memory devices 2440.

The bus between memory controller 2420 and memory devices 2440 can be implemented as multiple signal lines coupling memory controller 2420 to memory devices 2440. The bus may typically include at least clock (CLK) 2432, command/address (CMD) 2434, and write data (DQ) and read data (DQ) 2436, and zero or more other signal lines 2438. In one example, a bus or connection between memory controller 2420 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 2400 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 2420 and memory devices 2440. An example of a serial bus technology is 8B106 encoding and transmission of high-speed data with embedded clock over a single differential pair of signals in each direction. In one example, CMD 2434 represents signal lines shared in parallel with multiple memory devices. In one example, multiple memory devices share encoding command signal lines of CMD 2434, and each has a separate chip select (CS_n) signal line to select individual memory devices.

It will be understood that in the example of system 2400, the bus between memory controller 2420 and memory devices 2440 includes a subsidiary command bus CMD 2434 and a subsidiary bus to carry the write and read data, DQ 2436. In one example, the data bus can include bidirectional lines for read data and for write/command data. In another example, the subsidiary bus DQ 2436 can include unidirectional write signal lines for write and data from the host to memory, and can include unidirectional lines for read data from the memory to the host. In accordance with the chosen memory technology and system design, other signals 2438 may accompany a bus or sub bus, such as strobe lines DQS. Based on design of system 2400, or implementation if a design supports multiple implementations, the data bus can have more or less bandwidth per memory device 2440. For example, the data bus can support memory devices that have either a ×4 interface, a ×8 interface, a ×16 interface, or other interface. The convention "xW," where W is an integer that refers to an interface size or width of the interface of memory device 2440, which represents a number of signal lines to exchange data with memory controller 2420. The interface size of the memory devices is a controlling factor on how many memory devices can be used concurrently per channel in system 2400 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 2440 and memory controller 2420 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 2440 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 2440 represent memory resources for system 2400. In one example, each memory device 2440 is a separate memory die. In one example, each memory device 2440 can interface with multiple (e.g., 2) channels per device or die. Each memory device 2440 includes I/O interface logic 2442, which has a bandwidth determined by the implementation of the device (e.g., ×16 or ×8 or some other interface bandwidth). I/O interface logic 2442 enables the memory devices to interface with memory controller 2420. I/O interface logic 2442 can include a hardware interface, and can be in accordance with I/O 2422 of memory controller, but at the memory device end. In one example, multiple memory devices 2440 are connected in parallel to the same command and data buses. In another example, multiple memory devices 2440 are connected in parallel to the same command bus, and are connected to different data buses. For example, system 2400 can be configured with multiple memory devices 2440 coupled in parallel, with each memory device responding to a command, and accessing memory resources 2460 internal to each. For a Write operation, an individual memory device 2440 can write a portion of the overall data word, and for a Read operation, an individual memory device 2440 can fetch a portion of the overall data word. The remaining bits of the word will be provided or received by other memory devices in parallel.

In one example, memory devices 2440 are disposed directly on a motherboard or host system platform (e.g., a PCB (printed circuit board) on which processor 2410 is disposed) of a computing device. In one example, memory devices 2440 can be organized into memory modules 2470. In one example, memory modules 2470 represent dual inline memory modules (DIMMs). In one example, memory modules 2470 represent other organization of multiple memory devices to share at least a portion of access or control circuitry, which can be a separate circuit, a separate device, or a separate board from the host system platform. Memory modules 2470 can include multiple memory devices 2440, and the memory modules can include support for multiple separate channels to the included memory devices disposed on them. In another example, memory devices 2440 may be incorporated into the same package as memory controller 2420, such as by techniques such as multi-chip-module (MCM), package-on-package, through-silicon via (TSV), or other techniques or combinations. Similarly, in one example, multiple memory devices 2440 may be incorporated into memory modules 2470, which themselves may be incorporated into the same package as memory controller 2420. It will be appreciated that for these and other implementations, memory controller 2420 may be part of host processor 2410.

Memory devices 2440 each include one or more memory arrays 2460. Memory array 2460 represents addressable memory locations or storage locations for data. Typically, memory array 2460 is managed as rows of data, accessed via wordline (rows) and bitline (individual bits within a row) control. Memory array 2460 can be organized as separate channels, ranks, and banks of memory. Channels may refer to independent control paths to storage locations within memory devices 2440. Ranks may refer to common locations across multiple memory devices (e.g., same row addresses within different devices) in parallel. Banks may refer to sub-arrays of memory locations within a memory device 2440. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 2440 include one or more registers 2444. Register 2444 represents one or more storage devices or storage locations that provide configuration or settings for the operation of the memory device. In one example, register 2444 can provide a storage location for memory device 2440 to store data for access by memory controller 2420 as part of a control or management operation. In one example, register 2444 includes one or more Mode Registers. In one example, register 2444 includes one or more multipurpose registers. The configuration of locations within register 2444 can configure memory device 2440 to operate in different "modes," where command information can trigger different operations within memory device 2440 based on the mode. Additionally or in the alternative, different modes can also trigger different operation from address information or other signal lines depending on the mode. Settings of register 2444 can indicate configuration for I/O settings (e.g., timing, termination or ODT (on-die termination) 2446, driver configuration, or other I/O settings).

In one example, memory device 2440 includes ODT 2446 as part of the interface hardware associated with I/O 2442. ODT 2446 can be configured as mentioned above, and provide settings for impedance to be applied to the interface to specified signal lines. In one example, ODT 2446 is applied to DQ signal lines. In one example, ODT 2446 is applied to command signal lines. In one example, ODT 2446 is applied to address signal lines. In one example, ODT 2446 can be applied to any combination of the preceding. The ODT settings can be changed based on whether a memory device is a selected target of an access operation or a non-target device. ODT 2446 settings can affect the timing and reflections of signaling on the terminated lines. Careful control over ODT 2446 can enable higher-speed operation with improved matching of applied impedance and loading. ODT 2446 can be applied to specific signal lines of I/O interface 2442, 2422 (for example, ODT for DQ lines or ODT for CA lines), and is not necessarily applied to all signal lines.

Memory device 2440 includes controller 2450, which represents control logic within the memory device to control internal operations within the memory device. For example, controller 2450 decodes commands sent by memory controller 2420 and generates internal operations to execute or satisfy the commands. Controller 2450 can be referred to as an internal controller, and is separate from memory controller 2420 of the host. Controller 2450 can determine what mode is selected based on register 2444, and configure the internal execution of operations for access to memory resources 2460 or other operations based on the selected mode. Controller 2450 generates control signals to control the routing of bits within memory device 2440 to provide a proper interface for the selected mode and direct a command to the proper memory locations or addresses. Controller 2450 includes command logic 2452, which can decode command encoding received on command and address signal lines. Thus, command logic 2452 can be or include a command decoder. With command logic 2452, memory device can identify commands and generate internal operations to execute requested commands.

Referring again to memory controller 2420, memory controller 2420 includes command (CMD) logic 2424, which represents logic or circuitry to generate commands to send to memory devices 2440. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 2440, memory controller 2420 can issue commands via I/O 2422 to cause memory device 2440 to execute the commands. In one example, controller 2450 of memory device 2440 receives and decodes command and address information received via I/O 2442 from memory controller 2420. Based on the received command and address information, controller 2450 can control the timing of operations of the logic and circuitry within memory device 2440 to execute the commands. Controller 2450 is responsible for compliance with standards or specifications within memory device 2440, such as timing and signaling requirements. Memory controller 2420 can implement compliance with standards or specifications by access scheduling and control.

Memory controller 2420 includes scheduler 2430, which represents logic or circuitry to generate and order transactions to send to memory device 2440. From one perspective, the primary function of memory controller 2420 could be said to schedule memory access and other transactions to memory device 2440. Such scheduling can include generating the transactions themselves to implement the requests for data by processor 2410 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 2420 typically includes logic such as scheduler 2430 to allow selection and ordering of transactions to improve performance of system 2400. Thus, memory controller 2420 can select which of the outstanding transactions should be sent to memory device 2440 in which order, which is typically achieved with logic much more complex that a simple first-in first-out algorithm. Memory controller 2420 manages the transmission of the transactions to memory device 2440, and manages the timing associated with the transaction. In one example, transactions have deterministic timing, which can be managed by memory controller 2420 and used in determining how to schedule the transactions with scheduler 2430.

In one example, memory controller 2420 includes refresh (REF) logic 2426. Refresh logic 2426 can be used for memory resources that are volatile and need to be refreshed to retain a deterministic state. In one example, refresh logic 2426 indicates a location for refresh, and a type of refresh to perform. Refresh logic 2426 can trigger self-refresh within memory device 2440, or execute external refreshes which can be referred to as auto refresh commands) by sending refresh commands, or a combination. In one example, controller 2450 within memory device 2440 includes refresh logic 2454 to apply refresh within memory device 2440. In one example, refresh logic 2454 generates internal operations to perform refresh in accordance with an external refresh received from memory controller 2420. Refresh logic 2454 can determine if a refresh is directed to memory device 2440, and what memory resources 2460 to refresh in response to the command.

Figure 25:
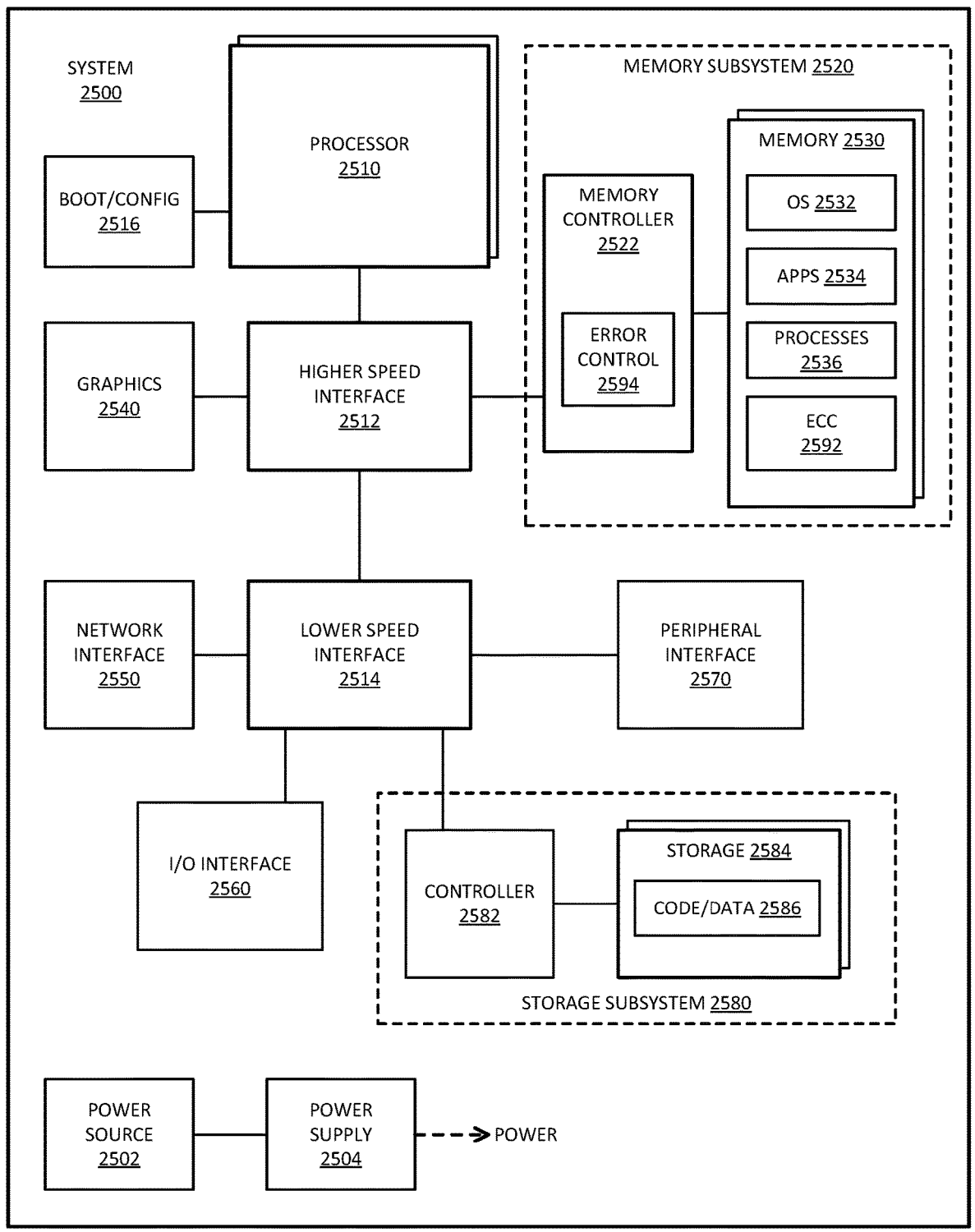
FIG. 25 is a block diagram of an example of a computing system in which adaptive checking and correction can be implemented.

FIG. 25 is a block diagram of an example of a computing system in which adaptive checking and correction can be implemented. System 2500 represents a computing device in accordance with any example herein, and can be a laptop computer, a desktop computer, a tablet computer, a server, a gaming or entertainment control system, embedded computing device, or other electronic device.

In one example, memory device 2530 includes ECC 2592. ECC 2592 represents on-die ECC for memory 2530, to enable error checking and correction in the memory. In one example, memory controller 2522 includes error control 2594, which represents logic within memory controller 2522 to enable determinations about errors in data from memory in accordance with any example herein. In one example, error control 2594 can perform ECC in accordance with any description herein. In one example, error control 2594 performs adaptive sparing, whether for banks, for portions of a data device, or ECC based on multiple tiers of ECC data. In one example, error control 2594 includes a PFD engine to provide permanent fault detection, and error control 2594 can perform ECC based on the permanent faults.

System 2500 includes processor 2510 can include any type of microprocessor, central processing unit (CPU), graphics processing unit (GPU), processing core, or other processing hardware, or a combination, to provide processing or execution of instructions for system 2500. Processor 2510 can be a host processor device. Processor 2510 controls the overall operation of system 2500, and can be or include, one or more programmable general-purpose or special-purpose microprocessors, digital signal processors (DSPs), programmable controllers, application specific integrated circuits (ASICs), programmable logic devices (PLDs), or a combination of such devices.

System 2500 includes boot/config 2516, which represents storage to store boot code (e.g., basic input/output system (BIOS)), configuration settings, security hardware (e.g., trusted platform module (TPM)), or other system level hardware that operates outside of a host OS. Boot/config 2516 can include a nonvolatile storage device, such as read-only memory (ROM), flash memory, or other memory devices.

In one example, system 2500 includes interface 2512 coupled to processor 2510, which can represent a higher speed interface or a high throughput interface for system components that need higher bandwidth connections, such as memory subsystem 2520 or graphics interface components 2540. Interface 2512 represents an interface circuit, which can be a standalone component or integrated onto a processor die. Interface 2512 can be integrated as a circuit onto the processor die or integrated as a component on a system on a chip. Where present, graphics interface 2540 interfaces to graphics components for providing a visual display to a user of system 2500. Graphics interface 2540 can be a standalone component or integrated onto the processor die or system on a chip. In one example, graphics interface 2540 can drive a high definition (HD) display or ultra high definition (UHD) display that provides an output to a user. In one example, the display can include a touchscreen display. In one example, graphics interface 2540 generates a display based on data stored in memory 2530 or based on operations executed by processor 2510 or both.

Memory subsystem 2520 represents the main memory of system 2500, and provides storage for code to be executed by processor 2510, or data values to be used in executing a routine. Memory subsystem 2520 can include one or more varieties of random-access memory (RAM) such as DRAM, 3DXP (three-dimensional crosspoint), or other memory devices, or a combination of such devices. Memory 2530 stores and hosts, among other things, operating system (OS) 2532 to provide a software platform for execution of instructions in system 2500. Additionally, applications 2534 can execute on the software platform of OS 2532 from memory 2530. Applications 2534 represent programs that have their own operational logic to perform execution of one or more functions. Processes 2536 represent agents or routines that provide auxiliary functions to OS 2532 or one or more applications 2534 or a combination. OS 2532, applications 2534, and processes 2536 provide software logic to provide functions for system 2500. In one example, memory subsystem 2520 includes memory controller 2522, which is a memory controller to generate and issue commands to memory 2530. It will be understood that memory controller 2522 could be a physical part of processor 2510 or a physical part of interface 2512. For example, memory controller 2522 can be an integrated memory controller, integrated onto a circuit with processor 2510, such as integrated onto the processor die or a system on a chip.

While not specifically illustrated, it will be understood that system 2500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 2500 includes interface 2514, which can be coupled to interface 2512. Interface 2514 can be a lower speed interface than interface 2512. In one example, interface 2514 represents an interface circuit, which can include standalone components and integrated circuitry. In one example, multiple user interface components or peripheral components, or both, couple to interface 2514. Network interface 2550 provides system 2500 the ability to communicate with remote devices (e.g., servers or other computing devices) over one or more networks. Network interface 2550 can include an Ethernet adapter, wireless interconnection components, cellular network interconnection components, USB (universal serial bus), or other wired or wireless standards-based or proprietary interfaces. Network interface 2550 can exchange data with a remote device, which can include sending data stored in memory or receiving data to be stored in memory.

In one example, system 2500 includes one or more input/output (I/O) interface(s) 2560. I/O interface 2560 can include one or more interface components through which a user interacts with system 2500 (e.g., audio, alphanumeric, tactile/touch, or other interfacing). Peripheral interface 2570 can include any hardware interface not specifically mentioned above. Peripherals refer generally to devices that connect dependently to system 2500. A dependent connection is one where system 2500 provides the software platform or hardware platform or both on which operation executes, and with which a user interacts.

In one example, system 2500 includes storage subsystem 2580 to store data in a nonvolatile manner. In one example, in certain system implementations, at least certain components of storage 2580 can overlap with components of memory subsystem 2520. Storage subsystem 2580 includes storage device(s) 2584, which can be or include any conventional medium for storing large amounts of data in a nonvolatile manner, such as one or more magnetic, solid state, 3DXP, or optical based disks, or a combination. Storage 2584 holds code or instructions and data 2586 in a persistent state (i.e., the value is retained despite interruption of power to system 2500). Storage 2584 can be generically considered to be a "memory," although memory 2530 is typically the executing or operating memory to provide instructions to processor 2510. Whereas storage 2584 is nonvolatile, memory 2530 can include volatile memory (i.e., the value or state of the data is indeterminate if power is interrupted to system 2500). In one example, storage subsystem 2580 includes controller 2582 to interface with storage 2584. In one example controller 2582 is a physical part of interface 2514 or processor 2510, or can include circuits or logic in both processor 2510 and interface 2514.

Power source 2502 provides power to the components of system 2500. More specifically, power source 2502 typically interfaces to one or multiple power supplies 2504 in system 2500 to provide power to the components of system 2500. In one example, power supply 2504 includes an AC to DC (alternating current to direct current) adapter to plug into a wall outlet. Such AC power can be renewable energy (e.g., solar power) power source 2502. In one example, power source 2502 includes a DC power source, such as an external AC to DC converter. In one example, power source 2502 or power supply 2504 includes wireless charging hardware to charge via proximity to a charging field. In one example, power source 2502 can include an internal battery or fuel cell source.

Figure 26:
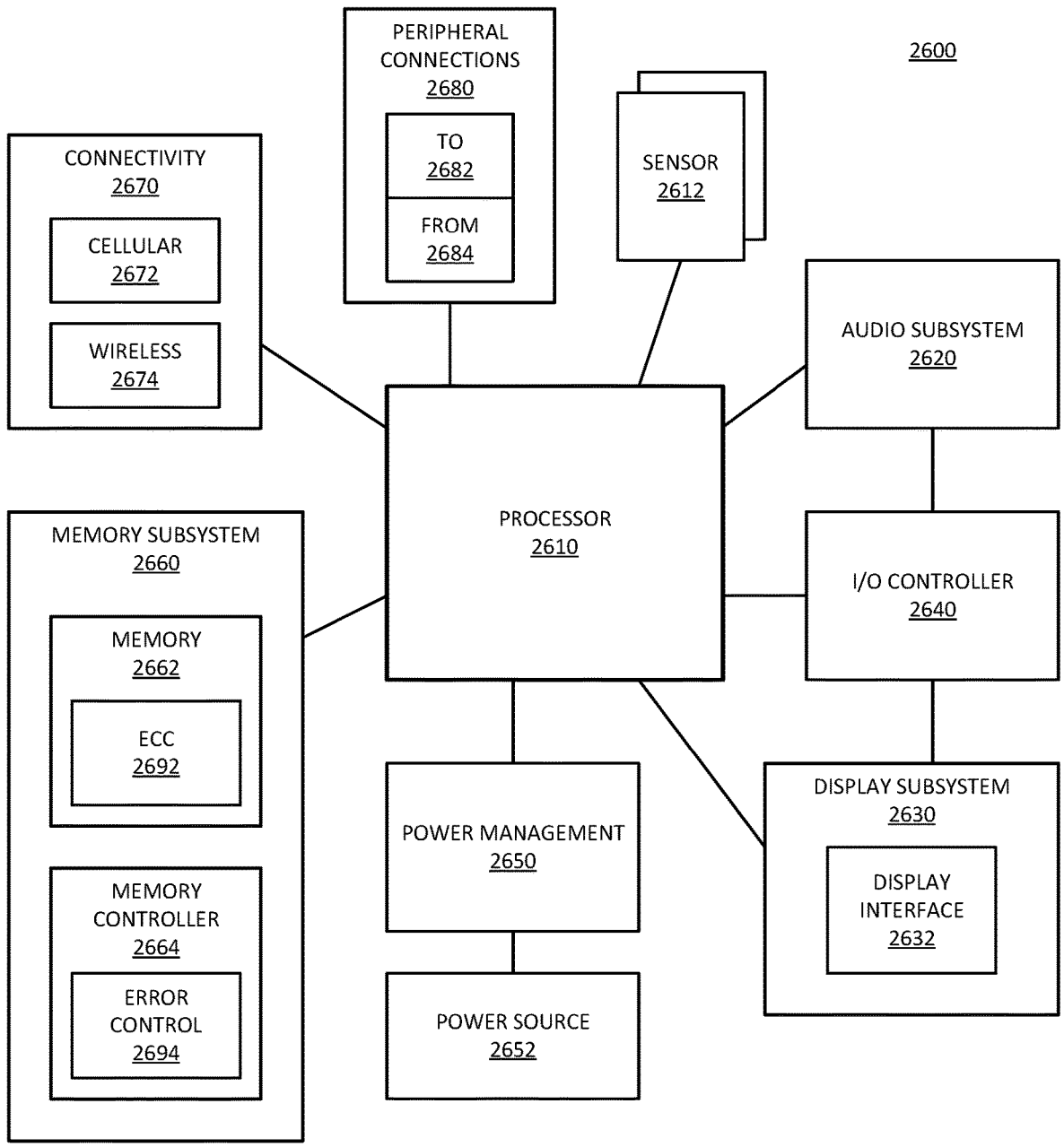
FIG. 26 is a block diagram of an example of a mobile device in which adaptive checking and correction can be implemented.

FIG. 26 is a block diagram of an example of a mobile device in which adaptive checking and correction can be implemented. System 2600 represents a mobile computing device, such as a computing tablet, a mobile phone or smartphone, wearable computing device, or other mobile device, or an embedded computing device. It will be understood that certain of the components are shown generally, and not all components of such a device are shown in system 2600.

In one example, memory 2662 includes ECC 2692. ECC 2692 represents on-die ECC for memory 2662, to enable error checking and correction in the memory. In one example, memory controller 2664 includes error control 2694, which represents logic within memory controller 2664 to enable determinations about errors in data from memory in accordance with any example herein. In one example, error control 2694 can perform ECC in accordance with any description herein. In one example, error control 2694 performs adaptive sparing, whether for banks, for portions of a data device, or ECC based on multiple tiers of ECC data. In one example, error control 2694 includes a PFD engine to provide permanent fault detection, and error control 2694 can perform ECC based on the permanent faults.

System 2600 includes processor 2610, which performs the primary processing operations of system 2600. Processor 2610 can be a host processor device. Processor 2610 can include one or more physical devices, such as microprocessors, application processors, microcontrollers, programmable logic devices, or other processing means. The processing operations performed by processor 2610 include the execution of an operating platform or operating system on which applications and device functions are executed. The processing operations include operations related to I/O (input/output) with a human user or with other devices, operations related to power management, operations related to connecting system 2600 to another device, or a combination. The processing operations can also include operations related to audio I/O, display I/O, or other interfacing, or a combination. Processor 2610 can execute data stored in memory. Processor 2610 can write or edit data stored in memory.

In one example, system 2600 includes one or more sensors 2612. Sensors 2612 represent embedded sensors or interfaces to external sensors, or a combination. Sensors 2612 enable system 2600 to monitor or detect one or more conditions of an environment or a device in which system 2600 is implemented. Sensors 2612 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 2612 can also include sensors for biometric systems such as fingerprint recognition systems, face detection or recognition systems, or other systems that detect or recognize user features. Sensors 2612 should be understood broadly, and not limiting on the many different types of sensors that could be implemented with system 2600. In one example, one or more sensors 2612 couples to processor 2610 via a frontend circuit integrated with processor 2610. In one example, one or more sensors 2612 couples to processor 2610 via another component of system 2600.

In one example, system 2600 includes audio subsystem 2620, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 2600, or connected to system 2600. In one example, a user interacts with system 2600 by providing audio commands that are received and processed by processor 2610.

Display subsystem 2630 represents hardware (e.g., display devices) and software components (e.g., drivers) that provide a visual display for presentation to a user. In one example, the display includes tactile components or touchscreen elements for a user to interact with the computing device. Display subsystem 2630 includes display interface 2632, which includes the particular screen or hardware device used to provide a display to a user. In one example, display interface 2632 includes logic separate from processor 2610 (such as a graphics processor) to perform at least some processing related to the display. In one example, display subsystem 2630 includes a touchscreen device that provides both output and input to a user. In one example, display subsystem 2630 includes a high definition (HD) or ultra-high definition (UHD) display that provides an output to a user. In one example, display subsystem includes or drives a touchscreen display. In one example, display subsystem 2630 generates display information based on data stored in memory or based on operations executed by processor 2610 or both.

I/O controller 2640 represents hardware devices and software components related to interaction with a user. I/O controller 2640 can operate to manage hardware that is part of audio subsystem 2620, or display subsystem 2630, or both. Additionally, I/O controller 2640 illustrates a connection point for additional devices that connect to system 2600 through which a user might interact with the system. For example, devices that can be attached to system 2600 might include microphone devices, speaker or stereo systems, video systems or other display device, keyboard or keypad devices, buttons/switches, or other I/O devices for use with specific applications such as card readers or other devices.

As mentioned above, I/O controller 2640 can interact with audio subsystem 2620 or display subsystem 2630 or both. For example, input through a microphone or other audio device can provide input or commands for one or more applications or functions of system 2600. Additionally, audio output can be provided instead of or in addition to display output. In another example, if display subsystem includes a touchscreen, the display device also acts as an input device, which can be at least partially managed by I/O controller 2640. There can also be additional buttons or switches on system 2600 to provide I/O functions managed by I/O controller 2640.

In one example, I/O controller 2640 manages devices such as accelerometers, cameras, light sensors or other environmental sensors, gyroscopes, global positioning system (GPS), or other hardware that can be included in system 2600, or sensors 2612. The input can be part of direct user interaction, as well as providing environmental input to the system to influence its operations (such as filtering for noise, adjusting displays for brightness detection, applying a flash for a camera, or other features).

In one example, system 2600 includes power management 2650 that manages battery power usage, charging of the battery, and features related to power saving operation. Power management 2650 manages power from power source 2652, which provides power to the components of system 2600. In one example, power source 2652 includes an AC to DC (alternating current to direct current) adapter to plug into a wall outlet. Such AC power can be renewable energy (e.g., solar power, motion based power). In one example, power source 2652 includes only DC power, which can be provided by a DC power source, such as an external AC to DC converter. In one example, power source 2652 includes wireless charging hardware to charge via proximity to a charging field. In one example, power source 2652 can include an internal battery or fuel cell source.

Memory subsystem 2660 includes memory device(s) 2662 for storing information in system 2600. Memory subsystem 2660 can include nonvolatile (state does not change if power to the memory device is interrupted) or volatile (state is indeterminate if power to the memory device is interrupted) memory devices, or a combination. Memory 2660 can store application data, user data, music, photos, documents, or other data, as well as system data (whether long-term or temporary) related to the execution of the applications and functions of system 2600. In one example, memory subsystem 2660 includes memory controller 2664 (which could also be considered part of the control of system 2600, and could potentially be considered part of processor 2610). Memory controller 2664 includes a scheduler to generate and issue commands to control access to memory device 2662.

Connectivity 2670 includes hardware devices (e.g., wireless or wired connectors and communication hardware, or a combination of wired and wireless hardware) and software components (e.g., drivers, protocol stacks) to enable system 2600 to communicate with external devices. The external device could be separate devices, such as other computing devices, wireless access points or base stations, as well as peripherals such as headsets, printers, or other devices. In one example, system 2600 exchanges data with an external device for storage in memory or for display on a display device. The exchanged data can include data to be stored in memory, or data already stored in memory, to read, write, or edit data.

Connectivity 2670 can include multiple different types of connectivity. To generalize, system 2600 is illustrated with cellular connectivity 2672 and wireless connectivity 2674. Cellular connectivity 2672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 2674 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 2680 include hardware interfaces and connectors, as well as software components (e.g., drivers, protocol stacks) to make peripheral connections. It will be understood that system 2600 could both be a peripheral device ("to" 2682) to other computing devices, as well as have peripheral devices ("from" 2684) connected to it. System 2600 commonly has a "docking" connector to connect to other computing devices for purposes such as managing (e.g., downloading, uploading, changing, synchronizing) content on system 2600. Additionally, a docking connector can allow system 2600 to connect to certain peripherals that allow system 2600 to control content output, for example, to audiovisual or other systems.

In addition to a proprietary docking connector or other proprietary connection hardware, system 2600 can make peripheral connections 2680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 27:
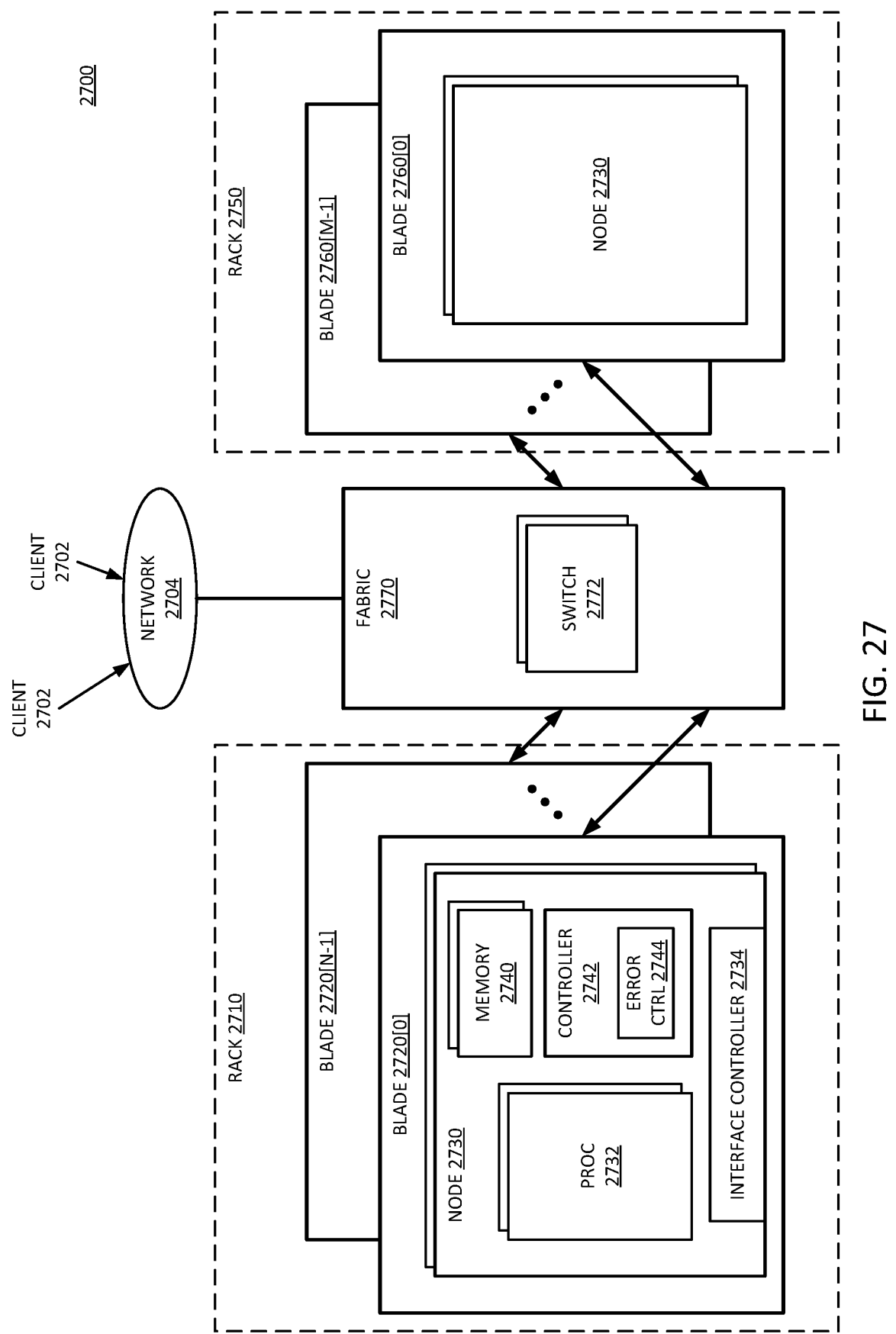
FIG. 27 is a block diagram of an example of a multi-node network in which adaptive checking and correction can be implemented.

FIG. 27 is a block diagram of an example of a multi-node network in which adaptive checking and correction can be implemented. System 2700 represents a network of nodes that can apply adaptive ECC. In one example, system 2700 represents a data center. In one example, system 2700 represents a server farm. In one example, system 2700 represents a data cloud or a processing cloud.

Node 2730 includes memory 2740. Node 2730 includes controller 2742, which represents a memory controller to manage access to memory 2740. In one example, controller 2742 includes error control (CTRL) 2744, which represents error control logic or error control circuitry in accordance with any example herein. In one example, error control 2744 can perform ECC in accordance with any description herein. In one example, error control 2744 performs adaptive sparing, whether for banks, for portions of a data device, or ECC based on multiple tiers of ECC data. In one example, error control 2744 includes a PFD engine to provide permanent fault detection, and error control 2744 can perform ECC based on the permanent faults.

One or more clients 2702 make requests over network 2704 to system 2700. Network 2704 represents one or more local networks, or wide area networks, or a combination. Clients 2702 can be human or machine clients, which generate requests for the execution of operations by system 2700. System 2700 executes applications or data computation tasks requested by clients 2702.

In one example, system 2700 includes one or more racks, which represent structural and interconnect resources to house and interconnect multiple computation nodes. In one example, rack 2710 includes multiple nodes 2730. In one example, rack 2710 hosts multiple blade components 2720. Hosting refers to providing power, structural or mechanical support, and interconnection. Blades 2720 can refer to computing resources on printed circuit boards (PCBs), where a PCB houses the hardware components for one or more nodes 2730. In one example, blades 2720 do not include a chassis or housing or other "box" other than that provided by rack 2710. In one example, blades 2720 include housing with exposed connector to connect into rack 2710. In one example, system 2700 does not include rack 2710, and each blade 2720 includes a chassis or housing that can stack or otherwise reside in close proximity to other blades and allow interconnection of nodes 2730.

System 2700 includes fabric 2770, which represents one or more interconnectors for nodes 2730. In one example, fabric 2770 includes multiple switches 2772 or routers or other hardware to route signals among nodes 2730. Additionally, fabric 2770 can couple system 2700 to network 2704 for access by clients 2702. In addition to routing equipment, fabric 2770 can be considered to include the cables or ports or other hardware equipment to couple nodes 2730 together. In one example, fabric 2770 has one or more associated protocols to manage the routing of signals through system 2700. In one example, the protocol or protocols is at least partly dependent on the hardware equipment used in system 2700.

As illustrated, rack 2710 includes N blades 2720. In one example, in addition to rack 2710, system 2700 includes rack 2750. As illustrated, rack 2750 includes M blades 2760. M is not necessarily the same as N; thus, it will be understood that various different hardware equipment components could be used, and coupled together into system 2700 over fabric 2770. Blades 2760 can be the same or similar to blades 2720. Nodes 2730 can be any type of node and are not necessarily all the same type of node. System 2700 is not limited to being homogenous, nor is it limited to not being homogenous.

For simplicity, only the node in blade 2720[0] is illustrated in detail. However, other nodes in system 2700 can be the same or similar. At least some nodes 2730 are computation nodes, with processor (proc) 2732 and memory 2740. A computation node refers to a node with processing resources (e.g., one or more processors) that executes an operating system and can receive and process one or more tasks. In one example, at least some nodes 2730 are server nodes with a server as processing resources represented by processor 2732 and memory 2740. A storage server refers to a node with more storage resources than a computation node, and rather than having processors for the execution of tasks, a storage server includes processing resources to manage access to the storage nodes within the storage server.

In one example, node 2730 includes interface controller 2734, which represents logic to control access by node 2730 to fabric 2770. The logic can include hardware resources to interconnect to the physical interconnection hardware. The logic can include software or firmware logic to manage the interconnection. In one example, interface controller 2734 is or includes a host fabric interface, which can be a fabric interface in accordance with any example described herein.

Processor 2732 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 2740 can be or include memory devices and a memory controller.

In general with respect to the descriptions herein, in one example a memory device includes: a memory array with N banks; error checking and correction (ECC) logic to detect a bank failure of one of the N banks ("failed bank"); and control logic to copy contents of the failed bank to a designated region of the other (N−1) banks and indicate reduction of available memory space to the (N−1) banks to a host.

In one example of the memory device, the control logic is to copy contents of the failed bank to R highest addresses of the N banks for bank sparing. In accordance with any preceding example of the memory device, in one example, N is 32, and wherein the control logic is to copy contents of the failed bank to the 5 upper bits of row addresses. In accordance with any preceding example of the memory device, in one example, the control logic is to indicate the reduction of the available memory space to a host operating system (OS). In accordance with any preceding example of the memory device, in one example, the control logic is to indicate the reduction of the available memory space to a basic input/output system (BIOS) is to indicate the region to the host OS. In accordance with any preceding example of the memory device, in one example, the host OS is to prevent storing system critical data in the region. In accordance with any preceding example of the memory device, in one example, the host OS is to offline the failed bank. In accordance with any preceding example of the memory device, in one example, the control logic is to copy the contents of the failed bank in response to commands from a memory controller, wherein the memory controller is to map requests to the failed bank to the region. In accordance with any preceding example of the memory device, in one example, the ECC logic is or includes ECC circuitry. In accordance with any preceding example of the memory device, in one example, the control logic is or includes a controller device.

In general with respect to the descriptions herein, in one example a memory controller includes: error checking and correction (ECC) logic to detect a bank failure of one of the N banks ("failed bank") of a memory device; input/output (I/O) logic to send a command to the memory device to copy contents of the failed bank to a designated region of the other (N−1) banks of the memory device; and control logic to indicate reduction of available memory space to the (N−1) banks.

In one example of the memory controller, the I/O logic is to send a command to copy contents of the failed bank to R highest addresses of the N banks for bank sparing. In accordance with any preceding example of the memory controller, in one example, N is 32, and wherein the memory device is to copy contents of the failed bank to the 5 upper bits of row addresses. In accordance with any preceding example of the memory controller, in one example, the control logic is to indicate the reduction of the available memory space to a host operating system (OS). In accordance with any preceding example of the memory controller, in one example, the control logic is to indicate the reduction of the available memory space to a basic input/output system (BIOS) is to indicate the region to the host OS. In accordance with any preceding example of the memory controller, in one example, the host OS is to prevent storing system critical data in the region. In accordance with any preceding example of the memory controller, in one example, the host OS is to offline the failed bank. In accordance with any preceding example of the memory controller, in one example, the control logic is to map requests to the failed bank to the region. In accordance with any preceding example of the memory controller, in one example, the ECC logic is or includes ECC circuitry. In accordance with any preceding example of the memory controller, in one example, the I/O logic is or includes a I/O circuitry.

In general with respect to the descriptions herein, in one example a method of managing errors for a memory includes: detecting a bank failure of one of the N banks ("failed bank") of a memory device; copying contents of the failed bank to a designated region of the other (N−1) banks of the memory device; and indicating reduction of available memory space to the (N−1) banks.

In one example of the method, copying the content comprises copying the contents of the failed bank to R highest addresses of the N banks for bank sparing. In accordance with any preceding example of the method, in one example, N is 32, and wherein copying the content comprises copying the contents of the failed bank to the 5 upper bits of row addresses. In accordance with any preceding example of the method, in one example, indicating the reduction of the available memory space comprises indicating the reduction of the available memory space to a host operating system (OS). In accordance with any preceding example of the method, in one example, indicating the reduction of the available memory space comprises preventing the host OS from storing system critical data in the region. In accordance with any preceding example of the method, in one example the method includes: offlining the failed bank. In accordance with any preceding example of the method, in one example, indicating the reduction of the available memory space comprises indicating the reduction of the available memory to a basic input/output system (BIOS) is to indicate the region to a host operating system (OS). In accordance with any preceding example of the method, in one example the method includes: mapping requests to the failed bank to the region.

In general with respect to the descriptions herein, in one example a method of managing errors for a memory includes: detecting a bank failure of one of the N banks ("failed bank") of a memory device; sending a command to the memory device to copy contents of the failed bank to a designated region of the other (N−1) banks of the memory device; and indicating reduction of available memory space to the (N−1) banks.

In one example of the method, sending the command comprises causing the memory device to copy contents of the failed bank to R highest addresses of the N banks for bank sparing. In accordance with any preceding example of the method, in one example, N is 32, and wherein sending the command comprises causing the memory device to copy contents of the failed bank to the 5 upper bits of row addresses. In accordance with any preceding example of the method, in one example, indicating the reduction of the available memory space comprises indicating the reduction of the available memory space to a host operating system (OS). In accordance with any preceding example of the method, in one example, indicating the reduction of the available memory space comprises preventing the host OS from storing system critical data in the region. In accordance with any preceding example of the method, in one example the method includes: offlining the failed bank. In accordance with any preceding example of the method, in one example, indicating the reduction of the available memory space comprises indicating the reduction of the available memory to a basic input/output system (BIOS) is to indicate the region to a host operating system (OS). In accordance with any preceding example of the method, in one example the method includes: mapping requests to the failed bank to the region.

In general with respect to the descriptions herein, in one example a system includes: a memory controller; and a memory device coupled to the memory controller, the memory device including a memory array with N banks; error checking and correction (ECC) logic to detect a bank failure of one of the N banks ("failed bank"); and control logic to copy contents of the failed bank to a designated region of the other (N−1) banks and indicate reduction of available memory space to the (N−1) banks to a host.

In one example of the system, the control logic is to copy contents of the failed bank to R highest addresses of the N banks for bank sparing. In accordance with any preceding example of the system, in one example, N is 32, and wherein the control logic is to copy contents of the failed bank to the 5 upper bits of row addresses. In accordance with any preceding example of the system, in one example, the control logic is to indicate the reduction of the available memory space to a host operating system (OS). In accordance with any preceding example of the system, in one example, the control logic is to indicate the reduction of the available memory space to a basic input/output system (BIOS) is to indicate the region to the host OS. In accordance with any preceding example of the system, in one example, the host OS is to prevent storing system critical data in the region. In accordance with any preceding example of the system, in one example, the host OS is to offline the failed bank. In accordance with any preceding example of the system, in one example, the control logic is to copy the contents of the failed bank in response to commands from a memory controller, wherein the memory controller is to map requests to the failed bank to the region. In accordance with any preceding example of the system, in one example, the system includes one or more of: a host processor coupled to the memory controller; a display communicatively coupled to a host processor; a network interface communicatively coupled to a host processor; or a battery to power the system. In accordance with any preceding example of the system, in one example, the ECC logic is or includes ECC circuitry. In accordance with any preceding example of the system, in one example, the control logic is or includes a controller device.

In general with respect to the descriptions herein, in one example a memory device includes: error checking and correction (ECC) logic to detect an uncorrectable error in a cacheline of the memory device; and write logic to write a poison bit pattern into the cacheline to mark the cacheline as a failed cacheline.

In one example of the memory device, to write the poison bit pattern comprises perform an XOR of contents of the cacheline with a poison mask. In accordance with any preceding example of the memory device, in one example, the poison bit pattern comprises a mask for 512 data bits. In accordance with any preceding example of the memory device, in one example, the cacheline is subdivided into multiple sub-cachelines, wherein to write the poison bit pattern comprises write a poison bit pattern to each subdivision. In accordance with any preceding example of the memory device, in one example, the poison pattern comprises a mask for 4 groups of 128 data bits. In accordance with any preceding example of the memory device, in one example, an associated memory controller is to read the cacheline, perform XOR of the cacheline with the poison mask to generate an XOR result, and determine if the XOR result is a legal codeword. In accordance with any preceding example of the memory device, in one example, if the XOR result is a legal codeword, the memory controller is to ignore the cacheline. In accordance with any preceding example of the memory device, in one example, if the XOR result is not a legal codeword, the memory controller is to trigger error handling for the cacheline. In accordance with any preceding example of the memory device, in one example, the XOR of the contents of the cacheline with the poison mask is to result in a detectable, uncorrectable error (DUE). In accordance with any preceding example of the memory device, in one example, to write the poison bit pattern into the cacheline comprises write a predefined poison bit pattern into the cacheline. In accordance with any preceding example of the memory device, in one example, the memory device comprises a double data rate version 5 (DDR5) synchronous dynamic random access memory (SDRAM) device. In accordance with any preceding example of the memory device, in one example, the ECC logic is or includes ECC circuitry. In accordance with any preceding example of the memory device, in one example, the write logic is or includes write circuitry.

In general with respect to the descriptions herein, in one example a memory controller includes: an input/output (I/O) interface to couple to a memory device; and error checking and correction (ECC) logic to detect an uncorrectable error in a cacheline of the memory device; wherein the I/O interface is to send a command to write a poison bit pattern into the cacheline to mark the cacheline as a failed cacheline.

In one example of the memory controller, to write the poison bit pattern comprises perform an XOR of contents of the cacheline with a poison mask. In accordance with any preceding example of the memory controller, in one example, the poison bit pattern comprises a mask for 512 data bits. In accordance with any preceding example of the memory controller, in one example, the cacheline is subdivided into multiple sub-cachelines, wherein to write the poison bit pattern comprises write a poison bit pattern to each subdivision. In accordance with any preceding example of the memory controller, in one example, the poison pattern comprises a mask for 4 groups of 128 data bits. In accordance with any preceding example of the memory controller, in one example, the I/O interface is to read the cacheline, and the ECC logic is to perform XOR of the cacheline with the poison mask to generate an XOR result, and determine if the XOR result is a legal codeword. In accordance with any preceding example of the memory controller, in one example, if the XOR result is a legal codeword, the memory controller is to ignore the cacheline. In accordance with any preceding example of the memory controller, in one example, if the XOR result is not a legal codeword, the memory controller is to trigger error handling for the cacheline. In accordance with any preceding example of the memory controller, in one example, the XOR of the contents of the cacheline with the poison mask is to result in a detectable, uncorrectable error (DUE). In accordance with any preceding example of the memory controller, in one example, to write the poison bit pattern into the cacheline comprises write a predefined poison bit pattern into the cacheline. In accordance with any preceding example of the memory controller, in one example, the memory device comprises a double data rate version 5 (DDR5) synchronous dynamic random access memory (SDRAM) device. In accordance with any preceding example of the memory controller, in one example, the ECC logic is or includes ECC circuitry. In accordance with any preceding example of the memory controller, in one example, the I/O interface is or includes I/O circuitry.

In general with respect to the descriptions herein, in one example a method includes: detecting an uncorrectable error in a cacheline of the memory device; and writing a poison bit pattern into the cacheline to mark the cacheline as a failed cacheline.

In one example of the method, writing the poison bit pattern comprises performing an XOR of contents of the cacheline with a poison mask. In accordance with any preceding example of the method, in one example, the poison bit pattern comprises a mask for 512 data bits. In accordance with any preceding example of the method, in one example, the cacheline is subdivided into multiple sub-cachelines, wherein writing the poison bit pattern comprises writing a poison bit pattern to each subdivision. In accordance with any preceding example of the method, in one example, the poison pattern comprises a mask for 4 groups of 128 data bits. In accordance with any preceding example of the method, in one example, the method includes: reading the cacheline; performing XOR of the cacheline with the poison mask to generate an XOR result; and determining if the XOR result is a legal codeword. In accordance with any preceding example of the method, in one example, if the XOR result is a legal codeword, ignoring the cacheline. In accordance with any preceding example of the method, in one example, if the XOR result is not a legal codeword, triggering error handling for the cacheline. In accordance with any preceding example of the method, in one example, performing the XOR of the contents of the cacheline with the poison mask results in a detectable, uncorrectable error (DUE). In accordance with any preceding example of the method, in one example, writing the poison bit pattern into the cacheline comprises writing a predefined poison bit pattern into the cacheline. In accordance with any preceding example of the method, in one example, the memory device comprises a double data rate version 5 (DDR5) synchronous dynamic random access memory (SDRAM) device.

In general with respect to the descriptions herein, in one example a system includes: a memory controller; and a memory device coupled to the memory controller, the memory device including error checking and correction (ECC) logic to detect an uncorrectable error in a cacheline of the memory device; and write logic to write a poison bit pattern into the cacheline to mark the cacheline as a failed cacheline.

In one example of the system, to write the poison bit pattern comprises perform an XOR of contents of the cacheline with a poison mask. In accordance with any preceding example of the system, in one example, the poison bit pattern comprises a mask for 512 data bits. In accordance with any preceding example of the system, in one example, the cacheline is subdivided into multiple sub-cachelines, wherein to write the poison bit pattern comprises write a poison bit pattern to each subdivision. In accordance with any preceding example of the system, in one example, the poison pattern comprises a mask for 4 groups of 128 data bits. In accordance with any preceding example of the system, in one example, the memory controller is to read the cacheline, perform XOR of the cacheline with the poison mask to generate an XOR result, and determine if the XOR result is a legal codeword. In accordance with any preceding example of the system, in one example, if the XOR result is a legal codeword, the memory controller is to ignore the cacheline. In accordance with any preceding example of the system, in one example, if the XOR result is not a legal codeword, the memory controller is to trigger error handling for the cacheline. In accordance with any preceding example of the system, in one example, the XOR of the contents of the cacheline with the poison mask is to result in a detectable, uncorrectable error (DUE). In accordance with any preceding example of the system, in one example, to write the poison bit pattern into the cacheline comprises write a predefined poison bit pattern into the cacheline. In accordance with any preceding example of the system, in one example, the memory device comprises a double data rate version 5 (DDR5) synchronous dynamic random access memory (SDRAM) device. In accordance with any preceding example of the system, in one example, the system includes one or more of: a host processor coupled to the memory controller; a display communicatively coupled to a host processor; a network interface communicatively coupled to a host processor; or a battery to power the system. In accordance with any preceding example of the system, in one example, the ECC logic is or includes ECC circuitry. In accordance with any preceding example of the system, in one example, the write logic is or includes write circuitry.

In general with respect to the descriptions herein, in one example a memory controller includes: a hardware input/output (I/O) interface to couple to multiple memory devices connected in parallel on a memory channel, wherein each memory device is to provide a portion of a codeword to the memory controller; error checking and correction (ECC) logic to detect an error in the codeword; and fault detection logic to determine that the error is a result of a permanent fault in at least one of the multiple memory devices; wherein the ECC logic is to adjust application of ECC on the codeword based on a determination that the error is a result of a permanent fault.

In one example of the memory controller, the fault detection logic is to determine the error is the result of a permanent fault, including to write all zeros to the codeword to determine if there are bits that do not flip from one, and write all ones to the codeword to determine if there are bits that do not flip from zero. In accordance with any preceding example of the memory controller, in one example, the fault detection logic is to repeat the writing of all zeros and all ones multiple times in succession to detect the permanent fault. In accordance with any preceding example of the memory controller, in one example, the ECC logic is to identify as permanent faults bits that do not flip from one or flip from zero. In accordance with any preceding example of the memory controller, in one example, the ECC logic is to restrict the application of ECC on the codeword to memory devices that have errors. In accordance with any preceding example of the memory controller, in one example, after restriction of the application of ECC on the codeword to the memory devices that have errors, if the ECC logic continues to detect the error in the codeword, the memory controller is to mark a memory device with a permanent fault as a failed device. In accordance with any preceding example of the memory controller, in one example, the ECC logic is to perform ECC on the codeword to generate an ECC result, and determine based on the determination that the error is the result of a permanent fault, whether the ECC result is correct. In accordance with any preceding example of the memory controller, in one example, the ECC logic is or includes ECC circuitry. In accordance with any preceding example of the memory controller, in one example, the I/O interface is or includes I/O circuitry. In accordance with any preceding example of the memory controller, in one example, the fault detection logic is to includes a fault detection circuit.

In general with respect to the descriptions herein, in one example a method includes: receiving a portion of a codeword from each of multiple memory devices connected in parallel on a memory channel; detecting an error in the codeword with error checking and correction (ECC); determining that the error is a result of a permanent fault in at least one of the multiple memory devices; and adjusting application of ECC on the codeword based on a determination that the error is a result of a permanent fault.

In one example of the method, determining that the error is the result of a permanent fault comprises writing all zeros to the codeword to determine if there are bits that do not flip from one, and writing all ones to the codeword to determine if there are bits that do not flip from zero. In accordance with any preceding example of the method, in one example, determining that the error is the result of a permanent fault comprises repeating the writing of all zeros and all ones multiple times in succession to detect the permanent fault. In accordance with any preceding example of the method, in one example, determining that bits do not flip from one or bits that do not flip from zero comprises detecting the bits with ECC. In accordance with any preceding example of the method, in one example, adjusting the application of ECC comprises restricting the application of ECC on the codeword to memory devices that have errors. In accordance with any preceding example of the method, in one example, after restriction of the application of ECC on the codeword to the memory devices that have errors, if the ECC logic continues to detect the error in the codeword, further comprising marking a memory device with a permanent fault as a failed device. In accordance with any preceding example of the method, in one example, detecting the error comprises performing ECC on the codeword to generate an ECC result, and determining based on the determination that the error is the result of a permanent fault, whether the ECC result is correct.

In general with respect to the descriptions herein, in one example a system includes: multiple memory devices connected in parallel on a memory channel; and a memory controller coupled to the multiple memory device on the memory channel, wherein each memory device is to provide a portion of a codeword to the memory controller, the memory controller including error checking and correction (ECC) logic to detect an error in the codeword; and fault detection logic to determine that the error is a result of a permanent fault in at least one of the multiple memory devices; wherein the ECC logic is to adjust application of ECC on the codeword based on a determination that the error is a result of a permanent fault.

In one example of the system, the fault detection logic is to determine the error is the result of a permanent fault, including to write all zeros to the codeword to determine if there are bits that do not flip from one, and write all ones to the codeword to determine if there are bits that do not flip from zero. In accordance with any preceding example of the system, in one example, the fault detection logic is to repeat the writing of all zeros and all ones multiple times in succession to detect the permanent fault. In accordance with any preceding example of the system, in one example, the ECC logic is to identify as permanent faults bits that do not flip from one or flip from zero. In accordance with any preceding example of the system, in one example, the ECC logic is to restrict the application of ECC on the codeword to memory devices that have errors. In accordance with any preceding example of the system, in one example, after restriction of the application of ECC on the codeword to the memory devices that have errors, if the ECC logic continues to detect the error in the codeword, the memory controller is to mark a memory device with a permanent fault as a failed device. In accordance with any preceding example of the system, in one example, the ECC logic is to perform ECC on the codeword to generate an ECC result, and determine based on the determination that the error is the result of a permanent fault, whether the ECC result is correct. In accordance with any preceding example of the system, in one example, the system includes one or more of: a host processor coupled to the memory controller; a display communicatively coupled to a host processor; a network interface communicatively coupled to a host processor; or a battery to power the system. In accordance with any preceding example of the system, in one example, the ECC logic is or includes ECC circuitry. In accordance with any preceding example of the system, in one example, the I/O interface is or includes I/O circuitry. In accordance with any preceding example of the system, in one example, the fault detection logic is to includes a fault detection circuit.

In general with respect to the descriptions herein, in one example a memory controller includes: a hardware input/output (I/O) interface to couple to multiple memory devices connected in parallel on a memory channel, wherein each memory device is to provide a portion of a codeword to the memory controller; error checking and correction (ECC) logic to detect an error in the codeword; and logic to determine that the error is limited to a specific portion of one of the memory devices and perform fault sparing on the specific portion of the memory device and leave another portion of the memory device active; wherein the ECC logic is to adjust ECC operation based on sparing out the specific portion of the memory device.

In one example of the memory controller, the portion of the codeword comprises half of the memory device. In accordance with any preceding example of the memory controller, in one example, the half comprises a right half of the memory device. In accordance with any preceding example of the memory controller, in one example, the half comprises a left half of the memory device. In accordance with any preceding example of the memory controller, in one example, the memory device has a ×4 interface to exchange 64 bits, and wherein the logic is to perform fault sparing on 2 signal lines of the ×4 interface. In accordance with any preceding example of the memory controller, in one example, the portion of the codeword comprises a quarter of the memory device. In accordance with any preceding example of the memory controller, in one example, the memory device has a ×8 interface to exchange 64 bits, and wherein the logic is to perform fault sparing on 2 signal lines of the ×8 interface. In accordance with any preceding example of the memory controller, in one example, the ECC logic is to perform SDDC (single device data correction) error correction on the codeword after the fault sparing on the specific portion. In accordance with any preceding example of the memory controller, in one example, for detection of an uncorrectable error with SDDC, the ECC logic is to perform error correction with ADDDC (adaptive double device data correction). In accordance with any preceding example of the memory controller, in one example, the ECC logic is to detect another error in the codeword to indicate a failure of an entire memory device, and in response to failure of the entire memory device, the ECC logic is to perform error correction with ADDDC (adaptive double device data correction). In accordance with any preceding example of the memory controller, in one example, the ECC logic is or includes ECC circuitry. In accordance with any preceding example of the memory controller, in one example, the logic to determine that the error is limited to a specific portion is or includes a controller device. In accordance with any preceding example of the memory controller, in one example, the I/O interface is or includes I/O circuitry.

In general with respect to the descriptions herein, in one example a method includes: receiving a portion of a codeword from each of multiple memory devices connected in parallel on a memory channel; detecting an error in the codeword with error checking and correction (ECC); determining that the error is limited to a specific portion of one of the memory devices; performing fault sparing on the specific portion of the memory device and leaving another portion of the memory device active; and adjusting ECC operation based on sparing out the specific portion of the memory device.

In one example of the method, the portion of the codeword comprises half of the memory device. In accordance with any preceding example of the method, in one example, the half comprises a right half of the memory device. In accordance with any preceding example of the method, in one example, the half comprises a left half of the memory device. In accordance with any preceding example of the method, in one example, the memory device has a ×4 interface to exchange 64 bits, and wherein performing fault sparing comprises performing fault sparing on 2 signal lines of the ×4 interface. In accordance with any preceding example of the method, in one example, the portion of the codeword comprises a quarter of the memory device. In accordance with any preceding example of the method, in one example, the memory device has a ×8 interface to exchange 64 bits, and wherein performing fault sparing comprises performing fault sparing on 2 signal lines of the ×8 interface. In accordance with any preceding example of the method, in one example, the method includes: performing SDDC (single device data correction) error correction on the codeword after the fault sparing on the specific portion. In accordance with any preceding example of the method, in one example, the method includes: for detection of an uncorrectable error with SDDC, performing error correction with ADDDC (adaptive double device data correction). In accordance with any preceding example of the method, in one example, the method includes: detecting another error in the codeword to indicate a failure of an entire memory device; and in response to failure of the entire memory device, performing error correction with ADDDC (adaptive double device data correction).

In general with respect to the descriptions herein, in one example a system includes: multiple memory devices connected in parallel on a memory channel; a memory controller coupled to the multiple memory devices on the memory channel, wherein each memory device is to provide a portion of a codeword to the memory controller, the memory controller including a hardware input/output (I/O) interface to couple to multiple memory devices connected in parallel on a memory channel, wherein each memory device is to provide a portion of a codeword to the memory controller; error checking and correction (ECC) logic to detect an error in the codeword; and logic to determine that the error is limited to a specific portion of one of the memory devices and perform fault sparing on the specific portion of the memory device and leave another portion of the memory device active; wherein the ECC logic is to adjust ECC operation based on sparing out the specific portion of the memory device.

In one example of the system, the portion of the codeword comprises half of the memory device. In accordance with any preceding example of the system, in one example, the half comprises a right half of the memory device. In accordance with any preceding example of the system, in one example, the half comprises a left half of the memory device. In accordance with any preceding example of the system, in one example, the memory device has a ×4 interface to exchange 64 bits, and wherein the logic is to perform fault sparing on 2 signal lines of the ×4 interface. In accordance with any preceding example of the system, in one example, the portion of the codeword comprises a quarter of the memory device. In accordance with any preceding example of the system, in one example, the memory device has a ×8 interface to exchange 64 bits, and wherein the logic is to perform fault sparing on 2 signal lines of the ×8 interface. In accordance with any preceding example of the system, in one example, the ECC logic is to perform SDDC (single device data correction) error correction on the codeword after the fault sparing on the specific portion. In accordance with any preceding example of the system, in one example, for detection of an uncorrectable error with SDDC, the ECC logic is to perform error correction with ADDDC (adaptive double device data correction). In accordance with any preceding example of the system, in one example, the ECC logic is to detect another error in the codeword to indicate a failure of an entire memory device, and in response to failure of the entire memory device, the ECC logic is to perform error correction with ADDDC (adaptive double device data correction). In accordance with any preceding example of the system, in one example, the system includes one or more of: a host processor coupled to the memory controller; a display communicatively coupled to a host processor; a network interface communicatively coupled to a host processor; or a battery to power the system. In accordance with any preceding example of the system, in one example, the ECC logic is or includes ECC circuitry. In accordance with any preceding example of the system, in one example, the logic to determine that the error is limited to a specific portion is or includes a controller device. In accordance with any preceding example of the system, in one example, the I/O interface is or includes I/O circuitry.

In general with respect to the descriptions herein, in one example a memory controller includes: an input/output (I/O) interface to couple to multiple memory devices connected in parallel on a memory channel, wherein the multiple memory devices including N data devices to store user data and an ECC (error checking and correction) device to store ECC bits (tier 1 bits), wherein each memory device is to provide a portion of a codeword to the memory controller, wherein ECC bits of the ECC device enable detection of single device failure but not correction of the single device failure; control logic to store additional ECC bits in the data devices (tier 2 bits); and error checking and correction (ECC) logic to perform error detection on the codeword based only on the tier 1 bits, and in response to detection of an error, to read the tier 2 bits to perform error correction.

In one example of the memory controller, N equals 5, wherein the multiple memory devices include 4 data devices with a ×8 interface and 1 ECC device with a ×8 interface. In accordance with any preceding example of the memory controller, in one example, N equals 9, wherein the multiple memory devices include 8 data devices with a ×4 interface and 1 ECC device with a ×4 interface. In accordance with any preceding example of the memory controller, in one example, the tier 1 bits are sub-matrix of the full matrix, wherein the full matrix includes tier 1 bits plus tier 2 bits. In accordance with any preceding example of the memory controller, in one example, a write to the memory devices includes a write of data, a read and update of the tier 2 bits, and a write of the tier 2 bits. In accordance with any preceding example of the memory controller, in one example, the memory controller includes: a cache to cache writes for the tier 2 bits. In accordance with any preceding example of the memory controller, in one example, the ECC logic is or includes ECC circuitry. In accordance with any preceding example of the memory controller, in one example, the control logic is or includes a controller device. In accordance with any preceding example of the memory controller, in one example, the I/O interface is or includes I/O circuitry.

In general with respect to the descriptions herein, in one example a method includes: receiving a portion of a codeword from each of multiple memory devices connected in parallel on a memory channel, wherein the multiple memory devices include N data devices to store user data and an ECC (error checking and correction) device to store ECC bits (tier 1 bits), wherein ECC bits of the ECC device enable detection of single device failure but not correction of the single device failure; storing additional ECC bits in the data devices (tier 2 bits); and performing error detection on the codeword based only on the tier 1 bits; and in response to detection of an error, reading the tier 2 bits to perform error correction.

In one example of the method, N equals 5, wherein the multiple memory devices include 4 data devices with a ×8 interface and 1 ECC device with a ×8 interface. In accordance with any preceding example of the method, in one example, N equals 9, wherein the multiple memory devices include 8 data devices with a ×4 interface and 1 ECC device with a ×4 interface. In accordance with any preceding example of the method, in one example, the tier 1 bits are sub-matrix of the full matrix, wherein the full matrix includes tier 1 bits plus tier 2 bits. In accordance with any preceding example of the method, in one example, writing to the memory devices includes writing data, reading and updating the tier 2 bits, and writing the tier 2 bits. In accordance with any preceding example of the method, in one example, the method includes: caching writes for the tier 2 bits.

In general with respect to the descriptions herein, in one example a system includes: multiple memory devices connected in parallel on a memory channel, including N data devices to store user data and an ECC (error checking and correction) device to store ECC bits (tier 1 bits); and a memory controller coupled to the multiple memory devices on the memory channel, wherein each memory device is to provide a portion of a codeword to the memory controller, wherein each memory device is to provide a portion of a codeword to the memory controller, wherein ECC bits of the ECC device enable detection of single device failure but not correction of the single device failure, the memory controller including control logic to store additional ECC bits in the data devices (tier 2 bits); and error checking and correction (ECC) logic to perform error detection on the codeword based only on the tier 1 bits, and in response to detection of an error, to read the tier 2 bits to perform error correction.

In one example of the system, N equals 5, wherein the multiple memory devices include 4 data devices with a ×8 interface and 1 ECC device with a ×8 interface. In accordance with any preceding example of the system, in one example, the multiple memory devices include 8 data devices with a ×4 interface and 1 ECC device with a ×4 interface. In accordance with any preceding example of the system, in one example, the tier 1 bits are sub-matrix of the full matrix, wherein the full matrix includes tier 1 bits plus tier 2 bits. In accordance with any preceding example of the system, in one example, a write to the memory devices includes a write of data, a read and update of the tier 2 bits, and a write of the tier 2 bits. In accordance with any preceding example of the system, in one example, the system includes: a cache to cache writes for the tier 2 bits. In accordance with any preceding example of the system, in one example, the system includes one or more of: a host processor coupled to the memory controller; a display communicatively coupled to a host processor; a network interface communicatively coupled to a host processor; or a battery to power the system. In accordance with any preceding example of the system, in one example, the ECC logic is or includes ECC circuitry. In accordance with any preceding example of the system, in one example, the control logic is or includes a controller device. In accordance with any preceding example of the system, in one example, the I/O interface is or includes I/O circuitry.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
   a memory array with N banks, addressable by a memory controller for active access;
   error checking and correction (ECC) logic to detect a bank failure of one of the N banks ("failed bank"); and
   control logic to copy contents of the failed bank to distribute to the other (N-1) banks in a designated region of each of the other (N-1) banks and indicate reduction of memory space available for active access from N banks to the other (N-1) banks to the memory controller.

2. The memory device of claim 1, wherein the control logic is to copy contents of the failed bank to R highest addresses of the N banks for bank sparing.

3. The memory device of claim 2, wherein N is 32, and wherein the control logic is to copy contents of the failed bank to the 5 upper bits of row addresses.

4. The memory device of claim 1, wherein the control logic is to indicate the reduction of the available memory space to a host operating system (OS).

5. The memory device of claim 4, wherein the control logic is to indicate the reduction of the available memory space to a basic input/output system (BIOS) is to indicate the region to the host OS.

6. The memory device of claim 5, wherein the host OS is to prevent storing system critical data in the region.

7. The memory device of claim 4, wherein the host OS is to offline the failed bank.

8. The memory device of claim 1, wherein the control logic is to copy the contents of the failed bank in response to commands from a memory controller, wherein the memory controller is to map requests to the failed bank to the region.

9. A memory controller comprising:
   error checking and correction (ECC) logic to detect a bank failure ("failed bank") of one of N banks of a memory device addressable by a memory controller for active access;
   input/output (I/O) logic to send a command to the memory device to copy contents of the failed bank to distribute to the other (N-1) banks in a designated region of each of the other (N-1) banks of the memory device; and
   control logic to indicate reduction of memory space available for active access from N banks to the other (N-1) banks to a host operating system.

10. The memory controller of claim 9, wherein the I/O logic is to send a command to copy contents of the failed bank to R highest addresses of the N banks for bank sparing.

11. The memory controller of claim 9, wherein the control logic is to indicate the reduction of the available memory space to a host operating system (OS).

12. The memory controller of claim 11, wherein the control logic is to indicate the reduction of the available memory space to a basic input/output system (BIOS) is to indicate the region to the host OS.

13. The memory controller of claim 9, wherein the control logic is to map requests to the failed bank to the region.

14. A method of managing errors for a memory, comprising:
    detecting a bank failure ("failed bank") of one of N banks of a memory device addressable by a memory controller for active access;
    copying contents of the failed bank to distribute to the other (N-1) banks in a designated region of each of the other (N-1) banks of the memory device; and
    indicating reduction of memory space available for active access from N banks to the other (N-1) banks a host.

15. The method of claim 14, wherein copying the content comprises copying the contents of the failed bank to R highest addresses of the N banks for bank sparing.

16. The method of claim 14, wherein indicating the reduction of the available memory space comprises indicating the reduction of the available memory space to a host operating system (OS).

17. The method of claim 16, wherein indicating the reduction of the available memory space comprises preventing the host OS from storing system critical data in the region.

18. The method of claim 16, further comprising:
    offlining the failed bank.

19. The method of claim 14, wherein indicating the reduction of the available memory space comprises indicating the reduction of the available memory to a basic input/output system (BIOS) is to indicate the region to a host operating system (OS).

20. The method of claim 14, further comprising:
    mapping requests to the failed bank to the region.

* * * * *